United States Patent
Kanamori et al.

(10) Patent No.: US 10,068,917 B2
(45) Date of Patent: Sep. 4, 2018

(54) VERTICAL MEMORY DEVICES AND METHODS OF MANUFACTURING THE SAME

(71) Applicant: SAMSUNG ELECTRONICS CO., LTD., Suwon-si, Gyeonggi-do (KR)

(72) Inventors: Kohji Kanamori, Seoul (KR); Shin-Hwan Kang, Seoul (KR); Young-Woo Park, Seoul (KR); Jung-Hoon Park, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 2 days.

(21) Appl. No.: 15/414,890

(22) Filed: Jan. 25, 2017

(65) Prior Publication Data

US 2017/0221921 A1    Aug. 3, 2017

(30) Foreign Application Priority Data

Jan. 28, 2016  (KR) ........................ 10-2016-0010401

(51) Int. Cl.
*H01L 27/11582* (2017.01)
*H01L 29/423* (2006.01)
*H01L 29/788* (2006.01)
*H01L 49/02* (2006.01)

(52) U.S. Cl.
CPC ........ *H01L 27/11582* (2013.01); *H01L 28/00* (2013.01); *H01L 29/42344* (2013.01)

(58) Field of Classification Search
CPC ......... H01L 27/11582; H01L 29/42344; H01L 29/7926
See application file for complete search history.

(56) References Cited

U.S. PATENT DOCUMENTS

| 8,404,548 B2 | 3/2013 | Park et al. |
| 8,658,499 B2 | 2/2014 | Makala et al. |
| 8,750,044 B2 | 6/2014 | Choi |
| 8,829,595 B2 | 9/2014 | Lee |

(Continued)

FOREIGN PATENT DOCUMENTS

| KR | 10-2010-0117905 A | 11/2010 |
| KR | 10-2012-0110452 A | 10/2012 |

(Continued)

*Primary Examiner* — Christine Enad
(74) *Attorney, Agent, or Firm* — Lee & Morse, P.C.

(57) ABSTRACT

A vertical memory device includes insulating interlayer patterns, of gate electrodes, a channel, and a charge storage pattern structure. The insulating interlayer patterns are spaced in a first direction. The gate electrodes between are neighboring insulating interlayer patterns, respectively. The channel extends through the insulating interlayer patterns and the gate electrodes in the first direction. The charge storage pattern structure includes a tunnel insulation pattern, a charge trapping pattern structure, and a blocking pattern sequentially stacked between the channel and each of the gate electrodes in a second direction. The charge trapping pattern structure includes charge trapping patterns spaced in the first direction. The charge trapping patterns are adjacent to sidewalls of first gate electrodes, respectively. A first charge trapping pattern extends in the first direction along a sidewall of a first insulating interlayer pattern.

18 Claims, 42 Drawing Sheets

(56) References Cited

U.S. PATENT DOCUMENTS

| | | |
|---|---|---|
| 8,963,231 B2 | 2/2015 | Lee et al. |
| 9,023,719 B2 | 5/2015 | Pachamuthu et al. |
| 9,099,347 B2 | 8/2015 | Yun et al. |
| 2012/0068255 A1* | 3/2012 | Lee .................. H01L 27/11582 257/324 |
| 2012/0098051 A1* | 4/2012 | Son .................. H01L 27/11582 257/324 |
| 2013/0270643 A1* | 10/2013 | Lee .................... H01L 27/1052 257/365 |
| 2014/0273373 A1 | 9/2014 | Makala et al. |
| 2015/0041879 A1* | 2/2015 | Jayanti .............. H01L 21/28282 257/324 |
| 2015/0072491 A1 | 3/2015 | Kim et al. |
| 2015/0076585 A1 | 3/2015 | Pachamuthu et al. |
| 2015/0221665 A1* | 8/2015 | Yasuda ............. H01L 27/11565 257/324 |
| 2016/0148945 A1* | 5/2016 | Sharangpani ..... H01L 27/11556 257/321 |
| 2016/0181264 A1* | 6/2016 | Miyamoto ........ H01L 27/11524 257/314 |

FOREIGN PATENT DOCUMENTS

| | | |
|---|---|---|
| KR | 10-2012-0124838 A | 11/2012 |
| KR | 10-2013-0072663 A | 7/2013 |
| KR | 10-1495803 B1 | 2/2015 |

* cited by examiner

FIG. 5
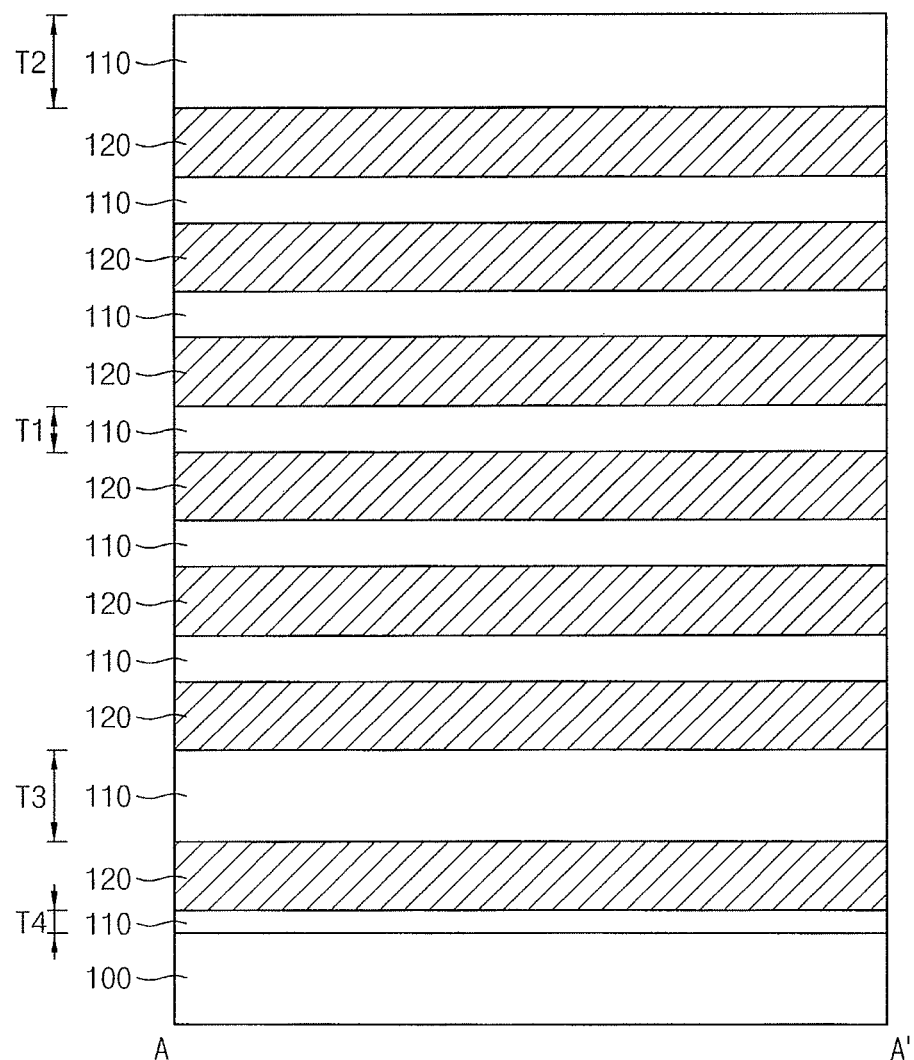
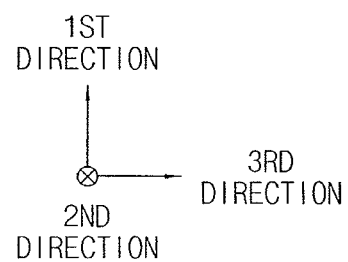

FIG. 6
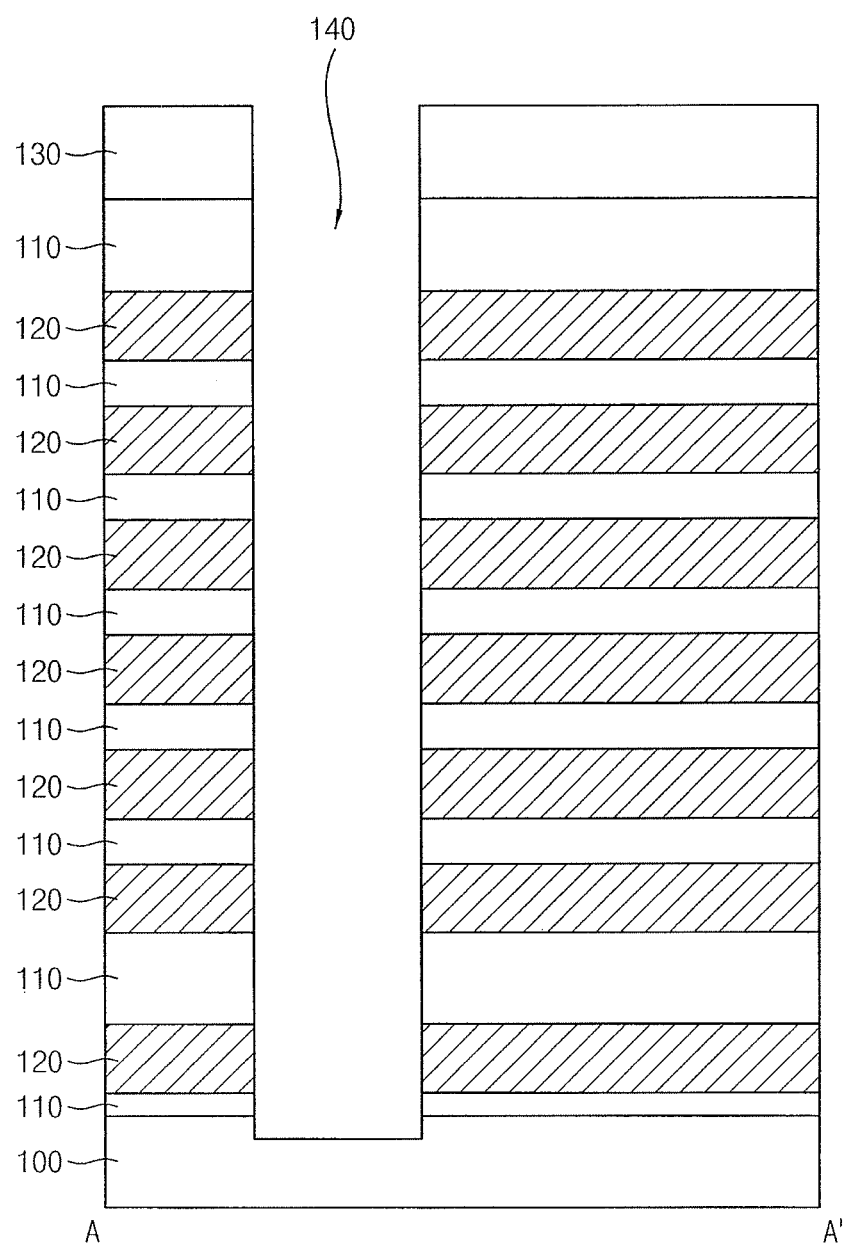
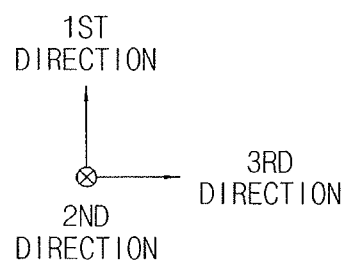

FIG. 35
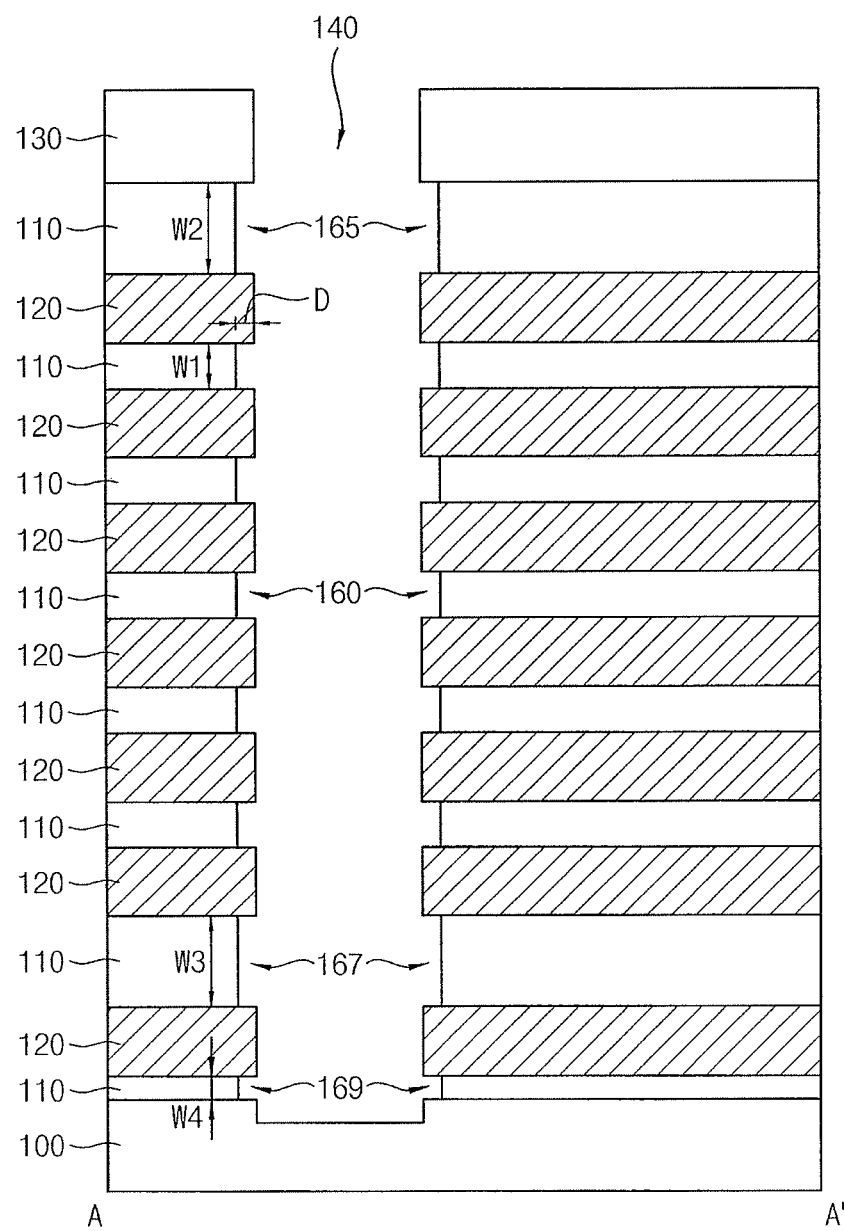
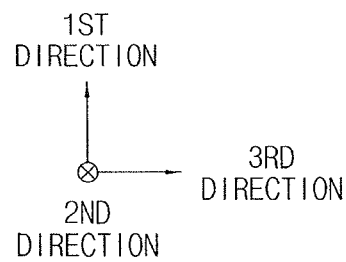

VERTICAL MEMORY DEVICES AND METHODS OF MANUFACTURING THE SAME

CROSS-REFERENCE TO RELATED APPLICATION

Korean Patent Application No. 10-2016-0010401, filed on Jan. 28, 2016, and entitled, "Vertical Memory Devices and Methods of Manufacturing the Same," is incorporated by reference herein in its entirety.

BACKGROUND

1. Field

One or more embodiments described herein relate to vertical memory devices and methods of manufacturing vertical memory devices.

2. Description of the Related Art

Producing highly integrated semiconductor devices continues to be a goal of designers. One way to increase integration is to increase the number of layers stacked in a vertical memory device, while at the same time reduce the thicknesses of those layers. However, reducing layer thickness may deteriorate the characteristics of the memory device, for example, due to coupling that may occur between neighboring, vertically arranged memory cells.

SUMMARY

In accordance with one or more embodiments, a vertical memory device includes a plurality of insulating interlayer patterns on a substrate, the plurality of insulating interlayer patterns spaced apart from each other in a first direction substantially perpendicular to a top surface of the substrate; a plurality of gate electrodes between neighboring ones of the insulating interlayer patterns, respectively; a channel extending through the insulating interlayer patterns and the gate electrodes in the first direction on the substrate; and a charge storage pattern structure including a tunnel insulation pattern, a charge trapping pattern structure, and a blocking pattern sequentially stacked between the channel and each of the gate electrodes in a second direction substantially parallel to the top surface of the substrate, wherein the charge trapping pattern structure includes a plurality of charge trapping patterns spaced apart from each other in the first direction, wherein the charge trapping patterns are adjacent to sidewalls of first gate electrodes, respectively, in the plurality of gate electrodes, and wherein a first charge trapping pattern of the plurality of charge trapping patterns extends in the first direction along a sidewall of a first insulating interlayer pattern of the plurality of insulating interlayer patterns.

In accordance with one or more other embodiments, a vertical memory device includes a plurality of gate electrodes on a substrate, the plurality of gate electrodes spaced apart from each other in a first direction substantially perpendicular to a top surface of the substrate; a plurality of insulating interlayer patterns between neighboring ones of the gate electrodes, respectively; a channel extending through the gate electrodes and the insulating interlayer patterns in the first direction on the substrate; a charge storage pattern structure including a tunnel insulation pattern, a charge trapping pattern, and a blocking pattern sequentially stacked between the channel and each of the gate electrodes in a second direction substantially parallel to the top surface of the substrate; and an insulation pattern structure between the channel and a sidewall of each of the insulating interlayer patterns, the insulation pattern structure including a first insulation pattern, a second insulation pattern, and a third insulation pattern sequentially stacked in the second direction and disposed only on portions of a top and a bottom of each of the gate electrodes adjacent to the channel.

In accordance with one or more other embodiments, a vertical memory device includes a channel on a substrate, the channel extending in a first direction substantially perpendicular to a top surface of the substrate; a plurality of gate electrodes spaced apart from each other in the first direction on the substrate, each of the plurality of gate electrodes covering an outer sidewall of the channel; and an insulation pattern structure between the outer sidewall of the channel and the gate electrodes and between the gate electrodes in the first direction, the insulation pattern structure including a charge trapping pattern structure, wherein the charge trapping pattern structure includes: a plurality of first charge trapping patterns spaced apart from each other in the first direction, a distance between each of the first charge trapping patterns and a center of the channel in a second direction being substantially constant in the first direction; and a second charge trapping pattern, a distance between the second charge trapping pattern and the center of the channel in the second direction varies in the first direction.

In accordance with one or more other embodiments, a method of manufacturing a vertical memory device includes alternately forming insulating interlayers and sacrificial layers on a substrate; forming a channel hole through the insulating interlayers and the sacrificial layers to expose a top surface of the substrate; partially removing portions of the insulating interlayers exposed by the channel hole to form first and second recesses in communication with the channel hole, the first recess having a first width in a first direction substantially perpendicular to the top surface of the substrate and the second recess having a second width in the first direction greater than the first width; sequentially forming a blocking layer and a charge trapping layer on a sidewall of the channel hole and inner walls of the first and second recesses, third and fourth recesses formed on the charge trapping layer correspondingly to the first and second recesses, respectively, the first width equal to or less than twice a sum of a thickness of the blocking layer and a thickness of the charge trapping layer; removing a portion of the charge trapping layer adjacent to the third recess to form a plurality of charge trapping patterns spaced apart from each other in the first direction, the third recess enlarged to expose a portion of the blocking layer; forming a filling pattern to fill the enlarged third recess; and sequentially forming a tunnel insulation layer and a channel on the charge trapping patterns and the filling pattern.

In accordance with one or more other embodiments, a method of manufacturing a vertical memory device includes alternately forming insulating interlayers and sacrificial layers on a substrate; forming a channel hole through the insulating interlayers and the sacrificial layers to expose a top surface of the substrate; partially removing portions of the insulating interlayers exposed by the channel hole to form first recesses in communication with the channel hole; sequentially forming a blocking layer and a charge trapping layer on a sidewall of the channel hole and inner walls of the first recesses, second recesses formed on the charge trapping layer correspondingly to the first recesses, respectively; forming doped silicon patterns to fill remaining portions of the second recesses, respectively; forming a silicon layer on the charge trapping layer and the doped silicon patterns;

performing a heat treatment process such that a portion of the silicon layer adjacent to each of the doped silicon patterns is doped with impurities; removing the doped portion of the silicon layer and the doped silicon patterns to form openings each exposing a portion of the charge trapping layer; removing the exposed portion of the charge trapping layer to form a plurality of charge trapping patterns spaced apart from each other in a first direction substantially perpendicular to the top surface of the substrate; removing the remaining silicon layer to expose the charge trapping patterns; forming filling patterns in the openings, respectively; and forming a channel on the exposed charge trapping patterns and the filling patterns.

In accordance with one or more other embodiments, a vertical memory device includes a channel; an alternating pattern of gate electrodes and insulating layers; a charge storage pattern between the channel and sides of the gate electrodes and insulating layers, wherein the gate electrodes have a first width and a first thickness and the insulating layers have a second width less than the first width and a second thickness less than the first thickness and wherein the charge storage pattern extends into recesses adjacent to the sides of respective ones of the insulating layers.

BRIEF DESCRIPTION OF THE DRAWINGS

Features will become apparent to those of skill in the art by describing in detail exemplary embodiments with reference to the attached drawings in which:

FIGS. 5 to 29 illustrate various stages of an embodiment of a method for manufacturing the vertical memory device in one or more of FIGS. 1-4;

FIGS. 35 to 36 illustrate various stages of an embodiment of a method for manufacturing the vertical memory device in FIG. 34;

DETAILED DESCRIPTION

Figure 1:
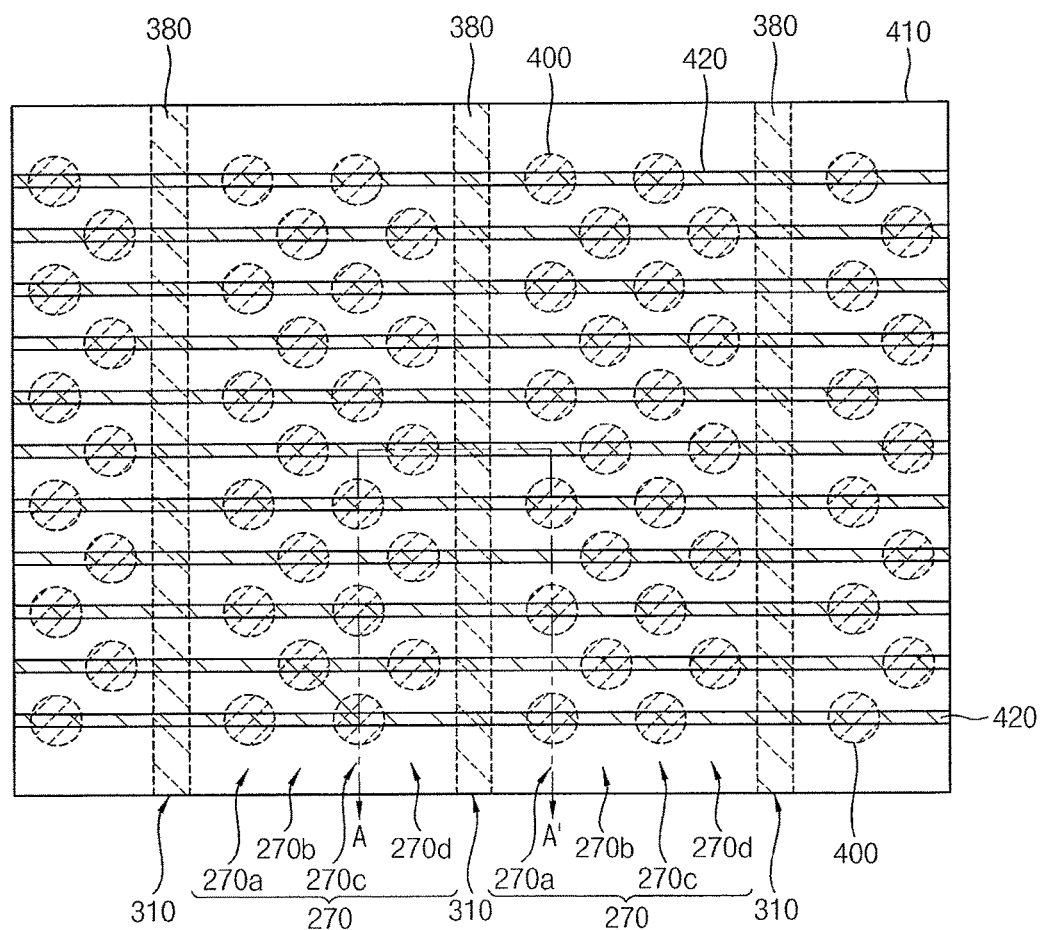
FIGS. 1 and 2 illustrate an embodiment of a vertical memory device.
Figure 2:
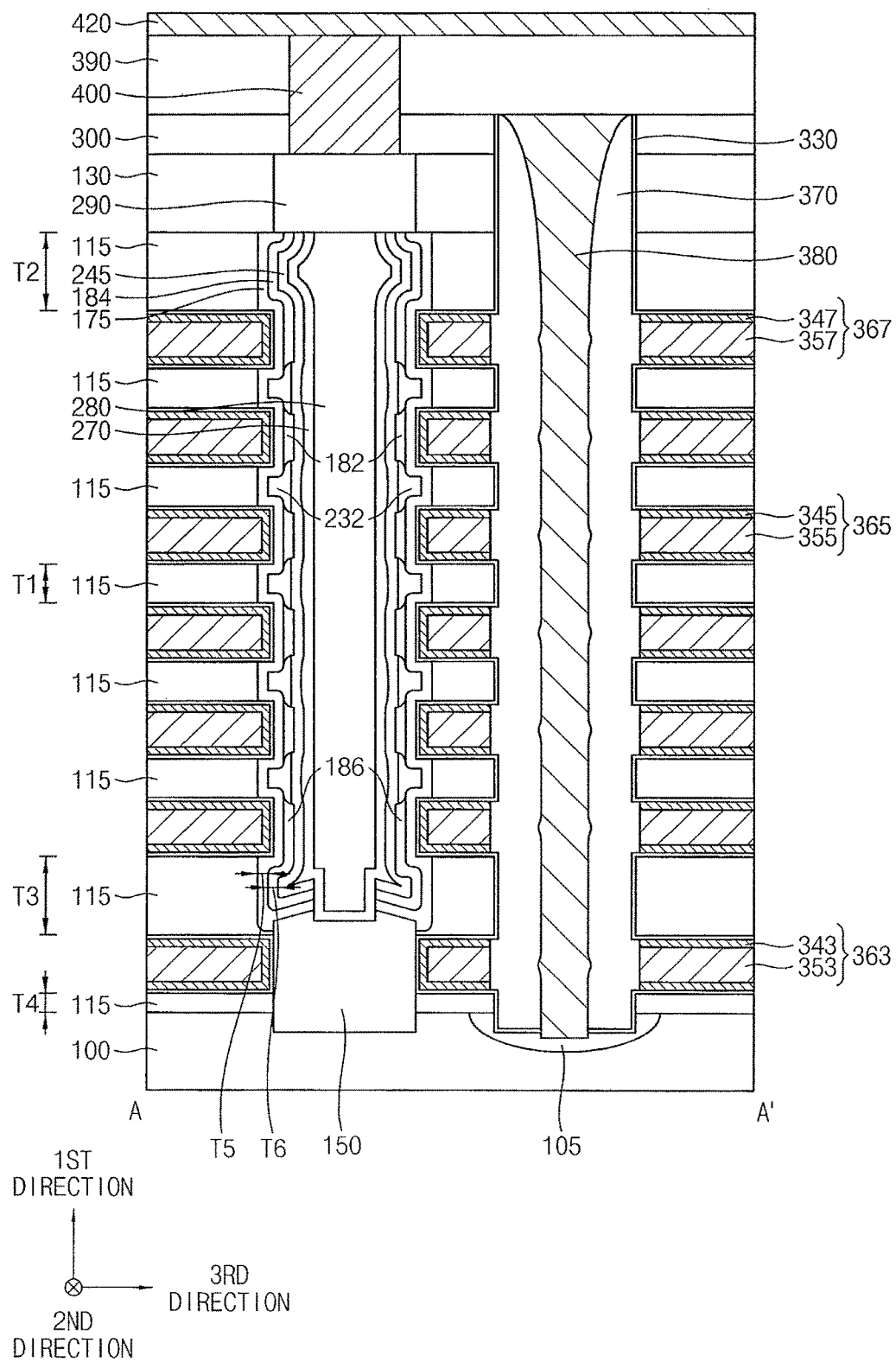

FIG. 1 illustrates an embodiment of a vertical memory device, and FIG. 2 illustrates a view taken along section line A-A' in FIG. 1. For purposes of illustration, a direction substantially perpendicular to a top surface of a substrate is defined as a first direction, and two directions substantially parallel to the top surface of the substrate and crossing each other are defined as second and third directions, respectively. In example embodiments, the second and third directions may be substantially perpendicular to each other. Throughout the present disclosure, the first, second and third directions are as defined above and as shown in the drawings.

Referring to FIGS. 1 and 2, the vertical memory device may include a plurality of insulating interlayer patterns 115, a plurality of gate electrodes 363, 365 and 367, a channel 270, a charge storage pattern structure, and first filling patterns 232 on a substrate 100. The vertical memory device may further include a first semiconductor pattern 150, a second filling pattern 280, a capping pattern 290, a second blocking layer 330, a second spacer 370, a common source line (CSL) 380, first and second masks 130 and 300, first and second upper insulating interlayers 390 and 410, a contact plug 400, and a bit line 420.

The insulating interlayer patterns 115 may be at a plurality of levels, respectively, in the first direction and spaced apart from each other. The insulating interlayer patterns 115 may have different thicknesses in the first direction according to the respective levels thereof. For example, a lowermost one of the insulating interlayer patterns 115 from a top surface of the substrate 100 may have a fourth thickness T4, a second one of the insulating interlayer patterns 115 from the top surface of the substrate 100 may have a third thickness T3, an uppermost one of the insulating interlayer patterns 115 from the top surface of the substrate 100 may have a second thickness T2, and other intermediate ones of the insulating interlayer patterns 115 from the top surface of the substrate 100 may have a first thickness T1. In example embodiments, the fourth thickness T4 may be less than the first to third thicknesses T1, T2 and T3, the first thickness T1 may be less than the second and third thicknesses T2 and T3, and the second and third thicknesses T2 and T3 may be equal to or different from each other.

In another embodiment, the lowermost one of the insulating interlayer patterns 115 from the top surface of the substrate 100 may have the fourth thickness T4, a third one of the insulating interlayer patterns 115 from the top surface of the substrate 100 may have the third thickness T3, the uppermost one of the insulating interlayer patterns 115 from the top surface of the substrate 100 may have the second thickness T2, and the second one and other intermediate ones of the insulating interlayer patterns 115 from the top surface of the substrate 100 may have the first thickness T1.

The insulating interlayer patterns 115 may include an oxide, e.g., silicon oxide.

The gate electrodes 363, 365, and 367 may be at a plurality of levels, respectively, along the first direction on the substrate 100 and spaced apart from each other. The insulating interlayer pattern 115 may be between neighboring ones of the gate electrodes 363, 365, and 367 stacked along the first direction. The insulating interlayer patterns 115 and the gate electrodes 363, 365, and 367 may be alternately stacked in the first direction. Each of the gate electrodes 363, 365 and 367 may extend in the second direction. A plurality of gate electrodes 363, a plurality of gate electrodes 365, and a plurality of gate electrodes 367 may be formed in the third direction at the respective levels thereof. The gate electrodes 363, the gate electrodes 365, and the gate electrodes 367 may be separated by the CSL 380 and the second spacer 370 in a second opening 310.

The gate electrodes 363, 365, and 367 may include a first gate electrode 363, a second gate electrode 365, and a third gate electrode 367 sequentially stacked in the first direction. The first gate electrode 363 may serve as a ground selection line (GSL), the second gate electrode 365 may serve as a word line, and the third gate electrode 367 may serve as a string selection line (SSL). Each of the first, second, and third gate electrodes 363, 365, and 367 may be at one level or at a plurality of levels. One or more than one dummy word lines may be formed between the first and second gate electrodes 363 and 365 and/or between the second and third gate electrodes 365 and 367.

In example embodiments, the first gate electrode 363 may be formed under the one of the insulating interlayer patterns 115 having the third thickness T3. The second and third gate electrodes 365 and 367 may be on the one of the insulating interlayer patterns 115 having the third thickness T3. In an example embodiment, the first gate electrode 363 may be at a lowermost level from the top surface of the substrate 100, the third gate electrode 367 may be at an uppermost level and a closest level to the uppermost level thereunder from the top surface of the substrate 100, and the second gate electrode 365 may be at even numbers of levels between the first and third gate electrodes 363 and 367. In one embodiment, the first gate electrode 363 may be at the lowermost level and a closest level to the lowermost level thereover.

The first gate electrode 363 may be close to the first semiconductor pattern 150 in a horizontal direction. Each of the second and third gate electrodes 365 and 367 may be close to the channel 270 on the first semiconductor pattern 150 in the horizontal direction.

The first gate electrode 363 may include a first gate conductive pattern 353, and a first gate barrier pattern 343 covering a top, a bottom, and a sidewall of the first gate conductive pattern 353. The second gate electrode 365 may include a second gate conductive pattern 355, and a second gate barrier pattern 345 covering a top, a bottom, and a sidewall of the second gate conductive pattern 355. The third gate electrode 367 may include a third gate conductive pattern 357, and a third gate barrier pattern 347 covering a top, a bottom, and a sidewall of the third gate conductive pattern 357. Each of the first to third gate barrier patterns 343, 345, and 347 may cover a sidewall of each of the first to third gate conductive patterns 353, 355, and 357 close to the channel 270.

Each of the first to third gate conductive patterns 353, 355, and 357 may include a metal having a low electrical resistance, e.g., tungsten, titanium, tantalum, platinum, etc. Each of the first to third gate barrier patterns 343, 345, and 347 may include a metal nitride, e.g., titanium nitride, tantalum nitride, etc. In one embodiment, each of the first to third gate barrier patterns 343, 345, and 347 may have a first pattern including a metal and a second pattern including a metal nitride.

A top, a bottom, and a sidewall of each of the first to third gate electrodes 363, 365, and 367 may be covered by the second blocking layer 330. The second blocking layer 330 may further cover sidewalls of the insulating interlayer patterns 115, sidewalls of the first and second masks 130 and 300, and a portion of a top surface of the substrate 100, and may extend in the first direction with an uneven surface.

The second blocking layer 330 may include a metal oxide, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

The channel 270 may extend in the first direction on the first semiconductor pattern 150 on the substrate 100, and may extend through the insulating interlayer patterns 115 and the second and third gate electrodes 365 and 367.

The first semiconductor pattern 150 may be formed by a selective epitaxial growth (SEG) process using the top surface of the substrate 100 as a seed, and thus may include a material substantially the same as that of the substrate 100.

The first semiconductor pattern 150 may include, e.g., single crystalline silicon or single crystalline germanium, and may be doped with impurities.

The first semiconductor pattern 150 may have a shape of a cylinder, an elliptic cylinder, or a pillar. In example embodiments, the first semiconductor pattern 150 may be formed such that an upper surface of the first semiconductor pattern 150 may be between a top and a bottom of the one of the insulating interlayer patterns 115 having the third thickness T3. Thus, in an example embodiment, the first semiconductor pattern 150 may be formed such that the upper surface of the first semiconductor pattern 150 may be between a top and a bottom of the second one of the insulating interlayer patterns 115 from the top surface of the substrate 100. In one embodiment, the first semiconductor pattern 150 may be formed such that the upper surface of the first semiconductor pattern 150 may be between a top and a bottom of a third one of insulating interlayer patterns 115 from the top surface of substrate 100.

The channel 270 may extend through ones of the insulating interlayer patterns 115 on the first gate electrode 363, and the second and third gate electrodes 365 and 367. The channel 270 may include polysilicon doped with impurities or undoped polysilicon, or single crystalline silicon. In example embodiments, the channel 270 may have a cup-like shape. An inner space of the channel 270 having the cup-like shape may be filled with the second filling pattern 280 having a pillar shape. In one embodiment, the channel 270 may have a shape of a cylinder, an elliptic cylinder, a rectangular column, or a pillar, and in this case, the second filling pattern 280 may not be formed. The second filling pattern 280 may include an oxide, e.g., silicon oxide.

A plurality of channels 270 may be formed in the second and third directions to form a channel array. In example embodiments, the channel array may include a first channel column 270a having a plurality of first channels in the second direction, and a second channel column 270b having a plurality of second channels in the second direction and spaced apart from the first channel column in the third direction. The first and second channels may form an acute angle with the second direction and/or the third direction. Thus, the first and second channels may be in a zigzag layout with respect to the second direction. When the first and second channels are in a zigzag layout, a greater number of channels 270 may be formed per area.

The first and second channel columns 270a and 270b may be alternately and repeatedly disposed in the third direction. In example embodiments, the first and second channel columns 270 may be in the third direction twice to form a channel block, and a plurality of channel blocks may be in the third direction to be spaced apart from each other. Four channel columns in the third direction in each channel block may be referred to as first, second, third, and fourth channel columns 270a, 270b, 270c, and 270d, respectively, in this order. For example, FIG. 1 shows two channel blocks spaced apart from each other in the third direction and portions of other two channel blocks. Each channel block includes the first, second, third, and fourth channel columns 270a, 270b, 270c, and 270d in the third direction.

The charge storage pattern structure may have a cup-like shape having an open central bottom. The charge storage pattern structure may extend in the first direction and may surround an outer sidewall of the channel 270. The charge storage pattern structure may include a tunnel insulation pattern 245, a charge trapping pattern structure, and a first blocking pattern 175 sequentially stacked between the outer sidewall of the channel 270 and each of the second and third gate electrodes 365 and 367.

The tunnel insulation pattern 245 may directly contact the outer sidewall of the channel 270 and may extend in the first direction. The tunnel insulation pattern 245 may have a cup-like shape having an open central bottom portion. In example embodiments, the tunnel insulation pattern 245 may have a thickness in the horizontal direction that may be constant along the first direction. The tunnel insulation pattern 245 may include an oxide, e.g., silicon oxide.

The charge trapping pattern structure may directly contact an outer sidewall of the tunnel insulation pattern 245, and may include first, second, and third charge trapping patterns 182, 184, and 186 spaced apart from each other in the first direction. The first to third charge trapping patterns 182, 184, and 186 may include substantially the same material, e.g., a nitride such as silicon nitride.

A plurality of first charge trapping patterns 182 may be spaced apart from each other in the first direction. Each of the first charge trapping patterns 182 may be close (e.g., adjacent) to the sidewall of the second gate electrode 365 or the sidewall of the third gate electrode 367 in the horizontal direction. In example embodiments, the distance between the first charge trapping pattern 182 and a center of the channel 270 in the horizontal direction may be constant along the first direction.

The second charge trapping pattern 184 may be close (e.g., adjacent) to the sidewall of the third gate electrode 367 at the uppermost level in the horizontal direction, and may further extend in the first direction to be close (e.g., adjacent) to a sidewall of the uppermost one of the insulating interlayer patterns 115. In example embodiments, the distance between the second charge trapping pattern 184 and a center of the channel 270 in the horizontal direction may vary in the first direction. The distance between a portion of the second charge trapping pattern 184 close (e.g., adjacent) to the sidewall of the third gate electrode 367 at the uppermost level and the center of the channel 270 in the horizontal direction may be less than a distance between a portion of the second charge trapping pattern 184 close (e.g., adjacent) to the sidewall of the uppermost one of the insulating interlayer patterns 115 and the center of the channel 270 in the horizontal direction.

The third charge trapping pattern 186 may be close (e.g., adjacent) to the sidewall of the second gate electrode 365, in the horizontal direction, at the second level from the top surface of the substrate 100, and may further extend in the first direction to be close (e.g., adjacent) to a sidewall of the second one of the insulating interlayer patterns 115 from the top surface of the substrate 100. In example embodiments, the distance between the third charge trapping pattern 186 and a center of the channel 270 in the horizontal direction may vary in the first direction. The distance between a portion of the third charge trapping pattern 186 close (e.g., adjacent) to the sidewall of the second gate electrode 367 at the second level and the center of the channel 270 in the horizontal direction may be less than the distance between a portion of the third charge trapping pattern 186 close (e.g., adjacent) to the sidewall of the second one of the insulating interlayer patterns 115 and the center of the channel 270 in the horizontal direction.

In example embodiments, each of the first to third charge trapping patterns 182, 184, and 186 may have a sixth thickness T6 in the horizontal direction, which may be constant in the first direction.

The first filling patterns 232 may be between neighboring ones of the first to third charge trapping patterns 182, 184, and 186 in the first direction. The first filling patterns 232 may include an oxide, e.g., silicon oxide.

Each of the first filling patterns 232 may be close (e.g., adjacent) to, in the horizontal direction, a sidewall of each of the insulating interlayer patterns 115 having the first thickness T1. In example embodiments, each of the first filling patterns 232 may include a lower portion, a central portion, and an upper portion sequentially stacked in the first direction. The central portion may have a thickness in the horizontal direction greater than those of the lower and upper portions. The lower and upper portions of each of the first filling patterns 232 may contact top surfaces and bottom surfaces of the first to third charge trapping patterns 182, 184, and 186. The central portion of each of the first filling patterns 232 may be covered by the first blocking pattern 175.

In example embodiments, a distance between each of the first filling patterns 232 and a center of the channel 270 in the horizontal direction may be greater than that between each of the first to third charge trapping patterns 182, 184, and 186 and the center of the channel 270 in the horizontal direction.

The first blocking pattern 175 may directly contact outer sidewalls of the first to third charge trapping patterns 182, 184, and 186 and outer sidewalls of the first filling patterns 232, and may extend in the first direction. The first blocking pattern 175 may have a cup-like shape having an open central bottom portion. In example embodiments, the first blocking pattern 175 may have a fifth thickness T5 in the horizontal direction, which may be constant in the first direction. The first blocking pattern 175 may include an oxide, e.g., silicon oxide.

In example embodiments, the first blocking pattern 175 may cover a sidewall and portions of upper and lower surfaces of each of the second and third gate electrodes 365 and 367, and may directly contact the sidewalls of the insulating interlayer patterns 115. For example, the first blocking pattern 175 may cover a sidewall of each of the second and third gate electrodes 365 and 367 close (e.g., adjacent) to the channel 270, and portions of upper and lower surfaces of each of the second and third gate electrodes 365 and 367 close (e.g., adjacent) to the channel 270.

In example embodiments, the tunnel insulation pattern 245, the second charge trapping pattern 184, the first blocking pattern 175, and the second blocking layer 330 sequentially stacked in the horizontal direction may be between the channel 270 and the third gate electrode 367 the uppermost level. The tunnel insulation pattern 245, the third charge trapping pattern 186, the first blocking pattern 175, and the second blocking layer 330 sequentially stacked in the horizontal direction may be between the channel 270 and the second gate electrode 365 at the second level. The tunnel insulation pattern 245, the first charge trapping pattern 182, the first blocking pattern 175, and the second blocking layer 330 sequentially stacked in the horizontal direction may be between the channel 270 and each of the second gate electrodes 367 at other levels, respectively.

The first to third charge trapping patterns 182, 184, and 186 close (e.g., adjacent) to the sidewalls of the second and third gate electrodes 365 and 367 may be spaced apart from each other in the first direction. Thus, parasitic capacitance between the second and third gate electrodes 365 and 367 may decrease. Also, movement of charges among the first to third charge trapping patterns 182, 184, and 186 may be reduced or prevented.

The tunnel insulation pattern 245, the second charge trapping pattern 184, and the first blocking pattern 175, which are sequentially stacked in the horizontal direction, may be between the channel 270 and the uppermost one of the insulating interlayer patterns 115 having the second thickness T2. The tunnel insulation pattern 245, the third charge trapping pattern 186, and the first blocking pattern 175, which are sequentially stacked in the horizontal direction, may be between the channel 270 and the second one of the insulating interlayer patterns 115 having the third thickness T3. The tunnel insulation pattern 245, the first filling pattern 232, and the first blocking pattern 175, which are sequentially stacked in the horizontal direction, may be between the channel 270 and each of the intermediate ones of the insulating interlayer patterns 115 having the first thickness T1.

In example embodiments, each of the first to third thicknesses T1, 12, and T3 of the insulating interlayer patterns 115 may be greater than a sum of twice the fifth thickness T5 of the first blocking pattern 175 and the sixth thickness T6 of the charge trapping pattern structure.

In example embodiments, the first thickness T1 of ones of the insulating interlayer patterns 115 may be equal to or less than twice a sum of the fifth thickness T5 of the first blocking pattern 175 and the sixth thickness T6 of the charge trapping pattern structure. Thus, each of the insulating interlayer patterns 115 having the first thickness T1 may have a thin thickness, so that the vertical memory device may have a reduced thickness.

The second thickness T2 or the third thickness T3 of one of the insulating interlayer patterns 115 may be greater than the sum of twice the fifth thickness T5 of the first blocking pattern 175 and the sixth thickness T6 of the charge trapping pattern structure, and may be greater than twice the sum of the fifth thickness T5 and the sixth thickness T6.

The first mask 130 may be on a first structure including the second filling pattern 280, the channel 270, the charge storage pattern structure, and the first filling pattern 232, and on the uppermost one of the insulating interlayer patterns 115. The capping pattern 290 may extend through the first mask 130 and contact an upper surface of the first structure. The capping pattern 290 may include polysilicon doped with impurities or undoped polysilicon, or single crystalline silicon.

The second mask 300 may be on the first mask 130 and the capping pattern 290.

The second spacer 370 may be on a sidewall of the second opening 310 that extends through the insulating interlayer patterns 115 and the gate electrodes 363, 365 and 367 and may expose the top surface of the substrate 100. The second opening 310 may extend in the second direction. The CSL 380 may fill the remaining portion of the second opening 310. The second spacer 370 may include an oxide, e.g., silicon oxide, and the CSL 380 may include, e.g., a metal, a metal nitride and/or a metal silicide.

The first upper insulating interlayer 390 may be on the second mask 300, the CSL 380, the second spacer 370, and the second blocking layer 330. The contact plug 400 may extend through the second mask 300 and the first upper insulating interlayer 390 and may contact an upper surface of the capping pattern 290. The second upper insulating interlayer 410 may be on the first upper insulating interlayer 390 and the contact plug 400. The bit line 420 may extend through the second upper insulating interlayer 410 and may contact an upper surface of the contact plug 400. In example embodiments, the bit line 420 may extend in the third direction and a plurality of bit lines 420 may be in the second direction.

The first and second upper insulating interlayers 390 and 410 may include an oxide, e.g., silicon oxide. The contact plug 400 and the bit line 420 may include a metal, e.g., copper, aluminum, tungsten, titanium, tantalum, etc., and/or a metal nitride, e.g., titanium nitride, tantalum nitride, tungsten nitride, etc.

As previously indicated, the vertical memory device may include the first to third charge trapping patterns 182, 184, and 186 spaced apart from each other in the first direction. Thus, parasitic capacitance between the second and third gate electrodes 365 and 367 may decrease. The first thickness T1 of ones of the insulating interlayer patterns 115 between the second and third gate electrodes 365 and 367 may be equal to or less than twice the sum of the fifth thickness T5 of the first blocking pattern 175 and the sixth thickness T1 of the first charge trapping pattern 182. Thus, the vertical memory device including the insulating interlayer patterns 115 may have a reduced thickness.

Figure 3:
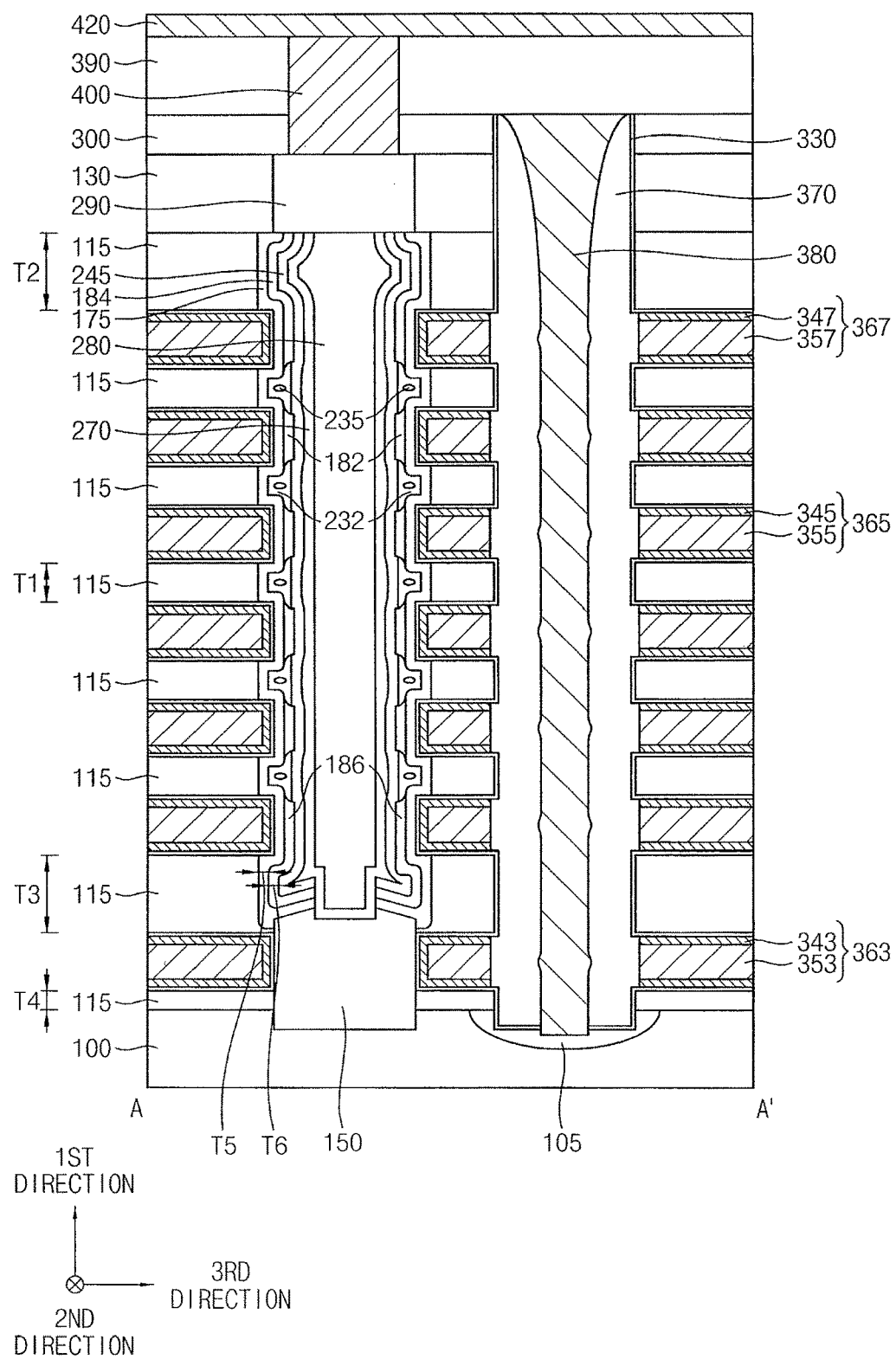
FIG. 3 illustrates another embodiment of a vertical memory device.

FIG. 3 illustrates another embodiment of a vertical memory device which may include an air gap 235 in the first filling pattern 232.

Figure 4:
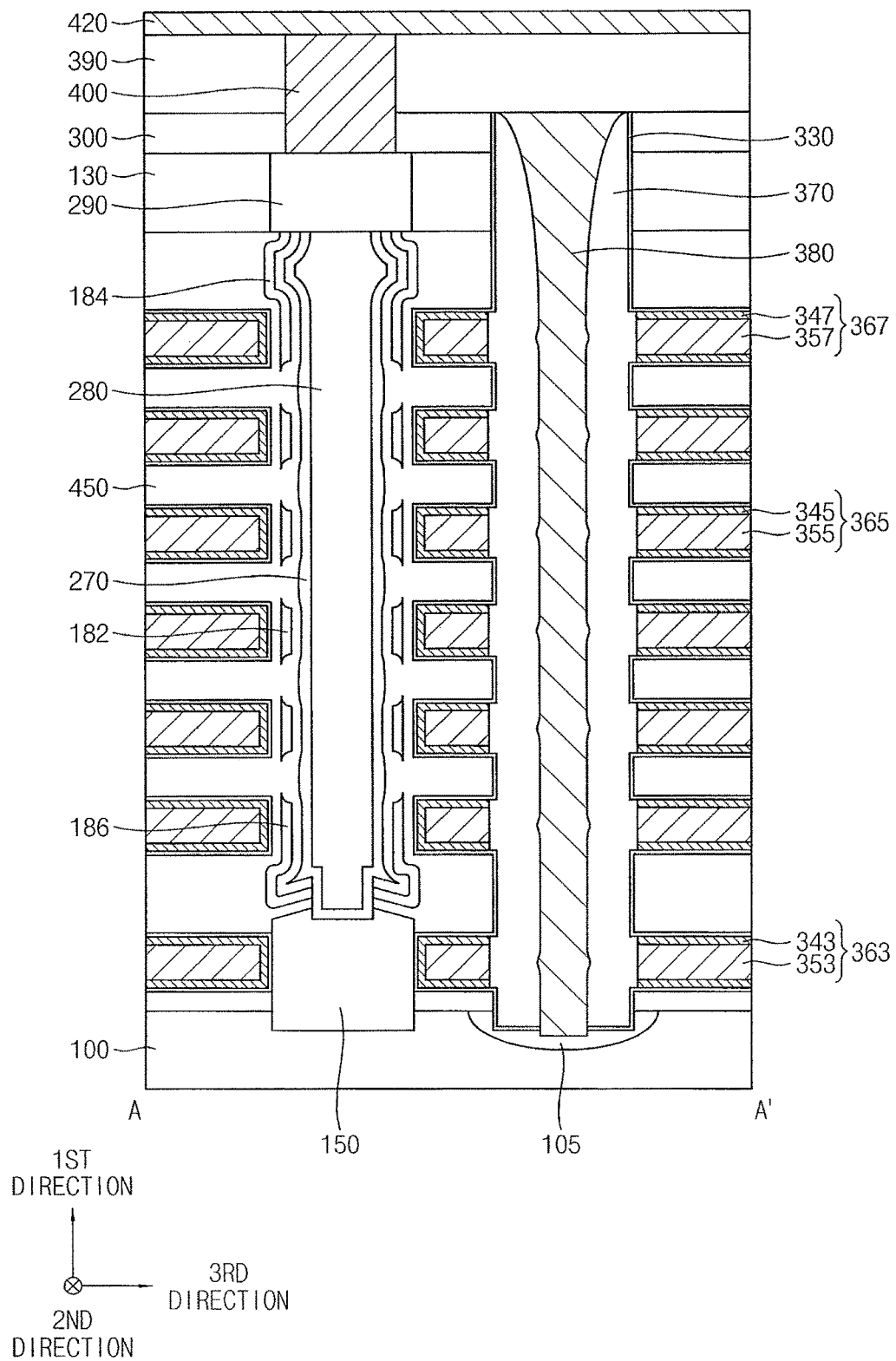
FIG. 4 illustrates another embodiment of a vertical memory device.

FIG. 4 illustrates another embodiment of a vertical memory device which may include an insulation pattern structure 450 having the charge trapping pattern structure therein. For example, the insulating interlayer pattern 115, the tunnel insulation pattern 245, and the first blocking pattern 175 in the charge storage pattern structure and the first filling pattern 232 in FIG. 2 may include substantially the same material (e.g., silicon oxide), and thus may be merged to form insulation pattern structure 450.

As a result, the vertical memory device may include the insulation pattern structure 450 between the outer sidewall of the channel 270 and each of the gate electrodes 363, 365 and 367, and between the gate electrodes 363, 365 and 367 spaced apart from each other in the first direction, which may contain the charge trapping pattern structure therein. The charge trapping pattern structure may include the first charge trapping patterns 182 and the second and third charge trapping patterns 184 and 186. The first charge trapping patterns 182 are spaced apart from each other in the first direction, and may have the distance in the horizontal direction from the center of the channel 270 constant along the first direction. The second and third charge trapping patterns 184 and 186 may have the distances in the horizontal direction from the center of the channel 270 that vary along the first direction.

FIGS. 5 to 29 are cross-sectional views illustrating various stages of an embodiment of a method for manufacturing a vertical memory device, e.g., the vertical memory devices in FIGS. 1 to 4. FIGS. 5 to 29 are cross-sectional views along section line A-A' in FIG. 1.

Referring to FIG. 5, an insulating interlayer 110 and a sacrificial layer 120 may be alternately and repeatedly formed on a substrate 100. Thus, a plurality of insulating interlayers 110 and a plurality of sacrificial layers 120 may be alternately stacked on each other over the substrate 100 in the first direction. For purposes of illustration, eight insulating interlayers 110 and seven sacrificial layers 120 are shown alternately stacked on the substrate 100. A different number of insulating interlayers 110 and sacrificial layers 120 may be alternately stacked in another embodiment.

The substrate 100 may include a semiconductor material (e.g., silicon, germanium, silicon-germanium, etc.) or Group III-V semiconductor compounds, e.g., GaP, GaAs, GaSb, etc. In some embodiments, the substrate 100 may be a silicon-on-insulator (SOI) substrate or a germanium-on-insulator (GOI) substrate.

The insulating interlayers 110 and the sacrificial layers 120 may be formed by a chemical vapor deposition (CVD) process, a plasma chemical vapor deposition (PECVD) process, an atomic layer deposition (ALD) process, etc. In an example embodiment, a lowermost one of the insulating interlayers 110, directly formed on a top surface of the substrate 100, may be formed by a thermal oxidation process.

The insulating interlayers 110 may be formed of a silicon oxide, e.g., plasma enhanced tetraethylorthosilicate (PE-TEOS), high density plasma (HDP) oxide, plasma enhanced oxide (PEOX), etc. The sacrificial layers 120 may be formed of a material having a predetermined etching selectivity with respect to the insulation layers 110, e.g., silicon nitride.

The insulating interlayers 110 may be formed to have different thicknesses in the first direction at predetermined levels. For example, a lowermost one of the insulating interlayers 110 from the top surface of the substrate 100 may have a fourth thickness T4, a second one of the insulating interlayers 110 from the top surface of the substrate 100 may have a third thickness T3, an uppermost one of the insulating interlayers 110 from the top surface of the substrate 100 may have a second thickness T2, and other intermediate ones of the insulating interlayers 110 from the top surface of the substrate 100 may have a first thickness T1. In example embodiments, the fourth thickness T4 may be less than the first to third thicknesses T1, T2, and T3, the first thickness T1 may be less than the second and third thicknesses T2 and T3, and the second and third thicknesses T2 and T3 may be equal to or different from each other.

In one embodiment, the lowermost one of the insulating interlayers 110 from the top surface of the substrate 100 may have the fourth thickness T4, a third one of the insulating interlayers 110 from the top surface of the substrate 100 may have the third thickness T3, the uppermost one of the insulating interlayers 110 from the top surface of the substrate 100 may have the second thickness T2, and the second one and other intermediate ones of the insulating interlayers 110 from the top surface of the substrate 100 may have the first thickness T1.

Referring to FIG. 6, a first mask 130 may be formed on an uppermost one of the insulating interlayers 110. The insulating interlayers 110 and the sacrificial layers 120 may be etched, using the first mask 130 as an etching mask, to form a channel hole 140 therethrough exposing a top surface of the substrate 100.

Referring to FIGS. 1 and 6 showing the layout of a channel 270 (e.g., refer to FIG. 23) formed in the channel hole 140, a plurality of channel holes 140 may be formed both in the second and third directions to define a channel hole array. In example embodiments, the channel hole array may include a first channel hole column including a plurality of first channel holes in the second direction, and a second channel hole column including a plurality of second channel holes in the second direction, which may be spaced apart from the first channel hole column in the third direction. The first channel holes may be at acute angles from the second channel holes in the second or third directions. Thus, the first and second channel holes may be arranged in a zigzag layout in the second direction, so as to be densely formed per unit area.

The first and second channel hole columns may be disposed alternately and repeatedly in the third direction. In example embodiments, the first and second channel hole columns may be disposed in the third direction twice to form a channel hole block. A plurality of channel hole blocks may be formed in the third direction to be spaced apart from each other. Four channel hole columns in each channel hole block may be referred to as first, second, third, and fourth channel hole columns, in this order. For example, FIG. 1 illustrates two channel hole blocks spaced apart from each other in the third direction and portions of other two channel hole blocks. Each channel hole block includes the first, second, third, and fourth channel hole columns in the third direction.

The channel hole 140 may have, for example, a circular shape in a plan view. In another embodiment, the channel hole 140 may have a different shape, e.g., an ellipse, a rectangle, a square, etc., in a plan view.

Figure 7:
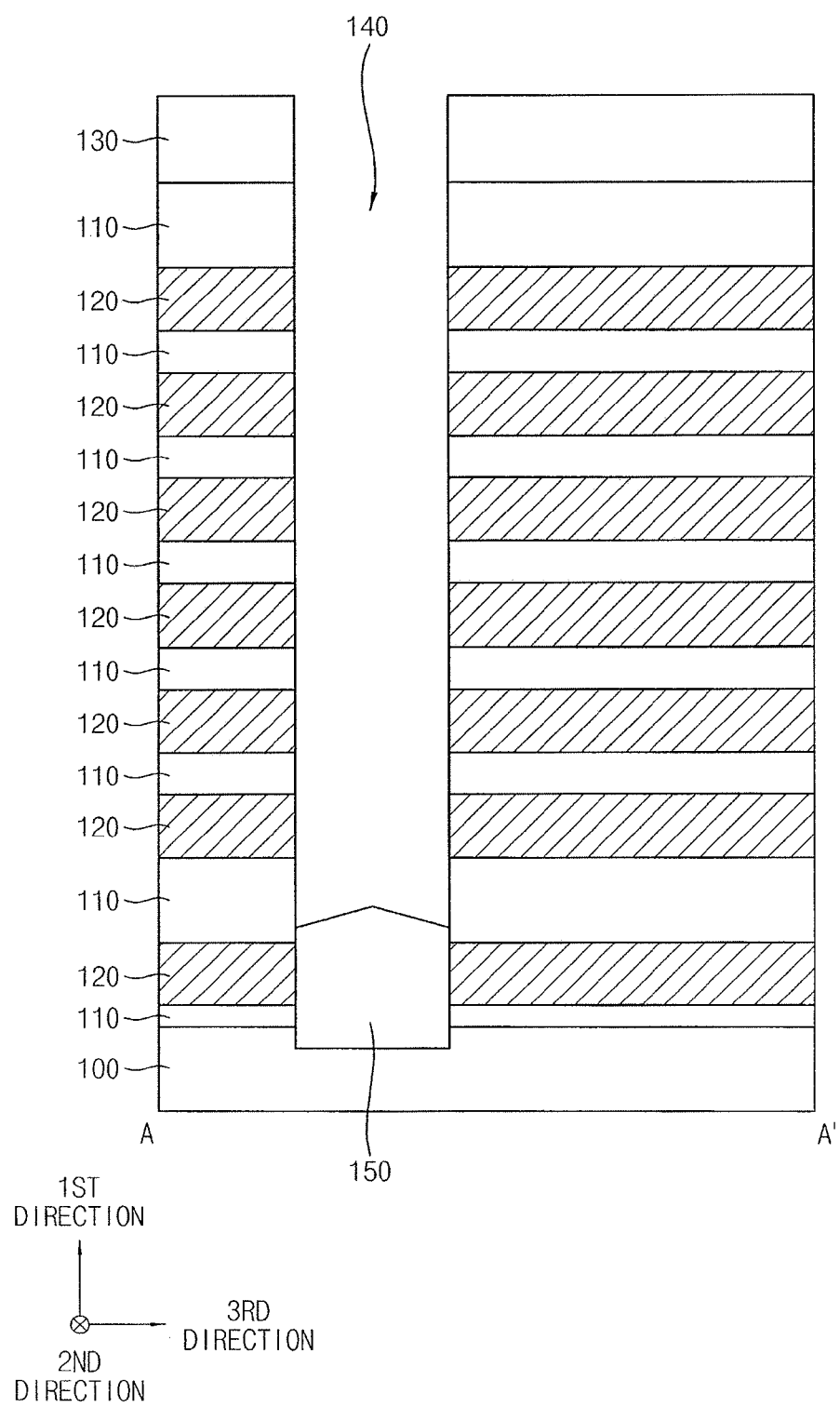

Referring to FIG. 7, a first semiconductor pattern 150 may be formed to partially fill each channel hole 140. For example, a selective epitaxial growth (SEG) process may be performed, using the exposed top surface of the substrate 100 as a seed, to form the first semiconductor pattern 150 partially filling each of the channel holes 140. Thus, the first semiconductor pattern 150 may include single crystalline silicon or single crystalline germanium according to the material of the substrate 100, and in some cases impurities may be doped thereinto.

In one embodiment, an amorphous silicon layer may be formed to fill the channel holes 140. A laser epitaxial growth (LEG) process or a solid phase epitaxy (SPE) process may be performed on the amorphous silicon layer to form the first semiconductor pattern 150.

In example embodiments, the first semiconductor pattern 150 may be formed such that an upper surface of the first semiconductor pattern 150 may be between the top and bottom of a second one of the insulating interlayers 110 disposed at a second level from the top surface of the substrate 100 in the first direction. The first semiconductor pattern 150 may serve as a channel corresponding to the channel 270 subsequently formed (e.g., refer to FIG. 23), and thus may be referred to as a lower channel.

Figure 8:
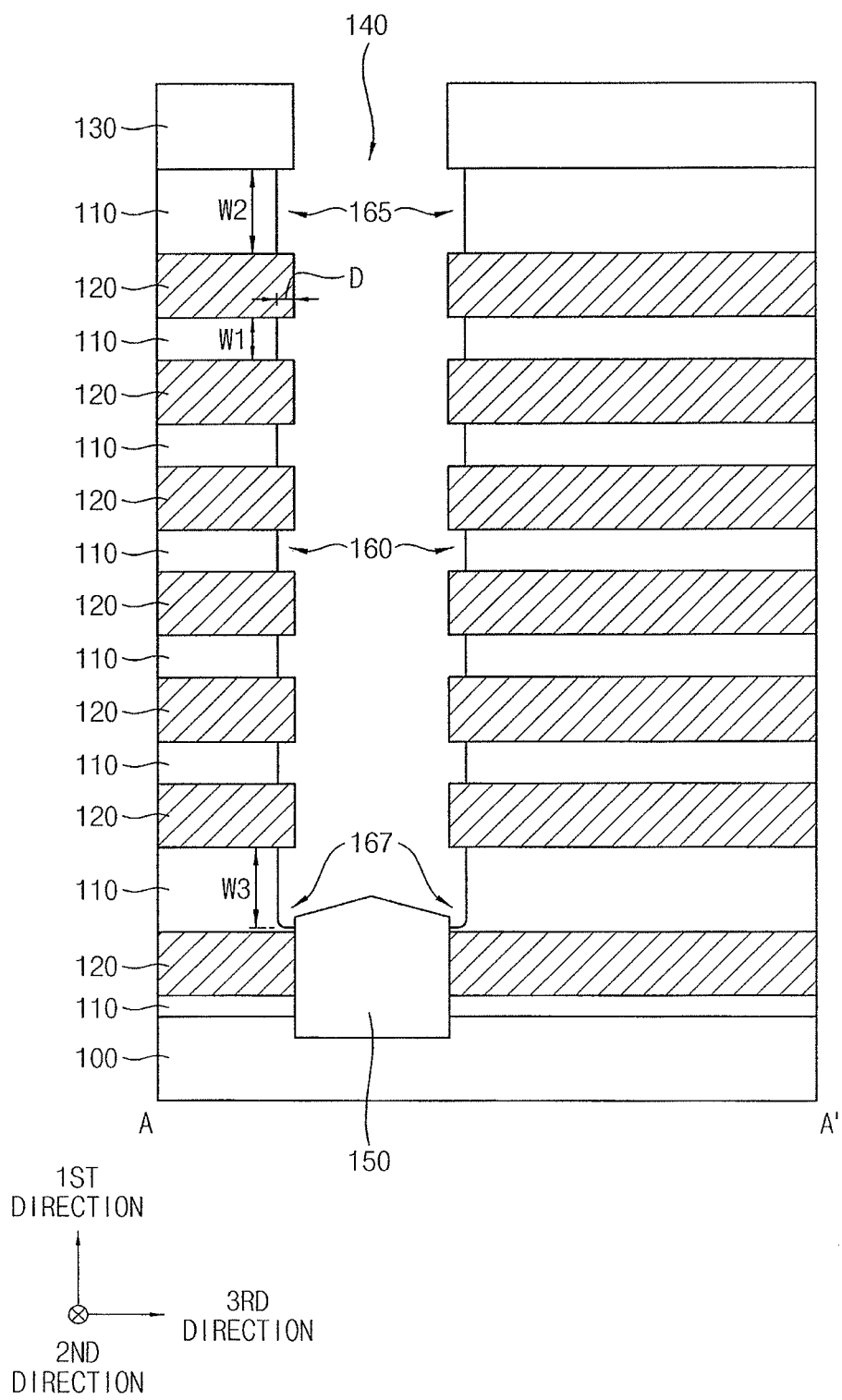

Referring to FIG. 8, portions of the insulating interlayers 110 exposed by the channel holes 140 may be partially removed to form first, second, and third recesses 160, 165, and 167. In example embodiments, the first to third recesses 160, 165, and 167 may be formed by a dry etching process or a wet etching process.

Each of the first to third recesses 160, 165, and 167 may be formed by partially removing the insulating interlayers 110, and may have a depth D in the horizontal direction, e.g., in the second direction or in the third direction. The first, second, and third recesses 160, 165, and 167 may have first, second, and third widths W1, W2, and W3 in the first direction substantially perpendicular to the top surface of the substrate 100.

In example embodiments, the first and second recesses 160 and 165 having the first and second widths W1 and W2, respectively, may be formed in ones of the insulating interlayers 110 having the first and second thicknesses T1 and T2, respectively, which may be substantially the same as the first and second widths W1 and W2. The third recess 167 having the third width W3 may be formed in one of the insulating interlayers 110 having the third thickness T3, which may be greater than the third width W3. No recess may be formed in one of the insulating interlayers 110 having the fourth thickness T4. For example, no recess may be formed in a lowermost one of the insulating interlayers 110 covered by the first semiconductor pattern 150 at a lower portion of the channel hole 140. The third recess 167 having the third width W3 less than the third thickness T3 may be formed in a second one of the insulating interlayers 110 from the top surface of the substrate 100 partially covered by the first semiconductor pattern 150.

Figure 9:
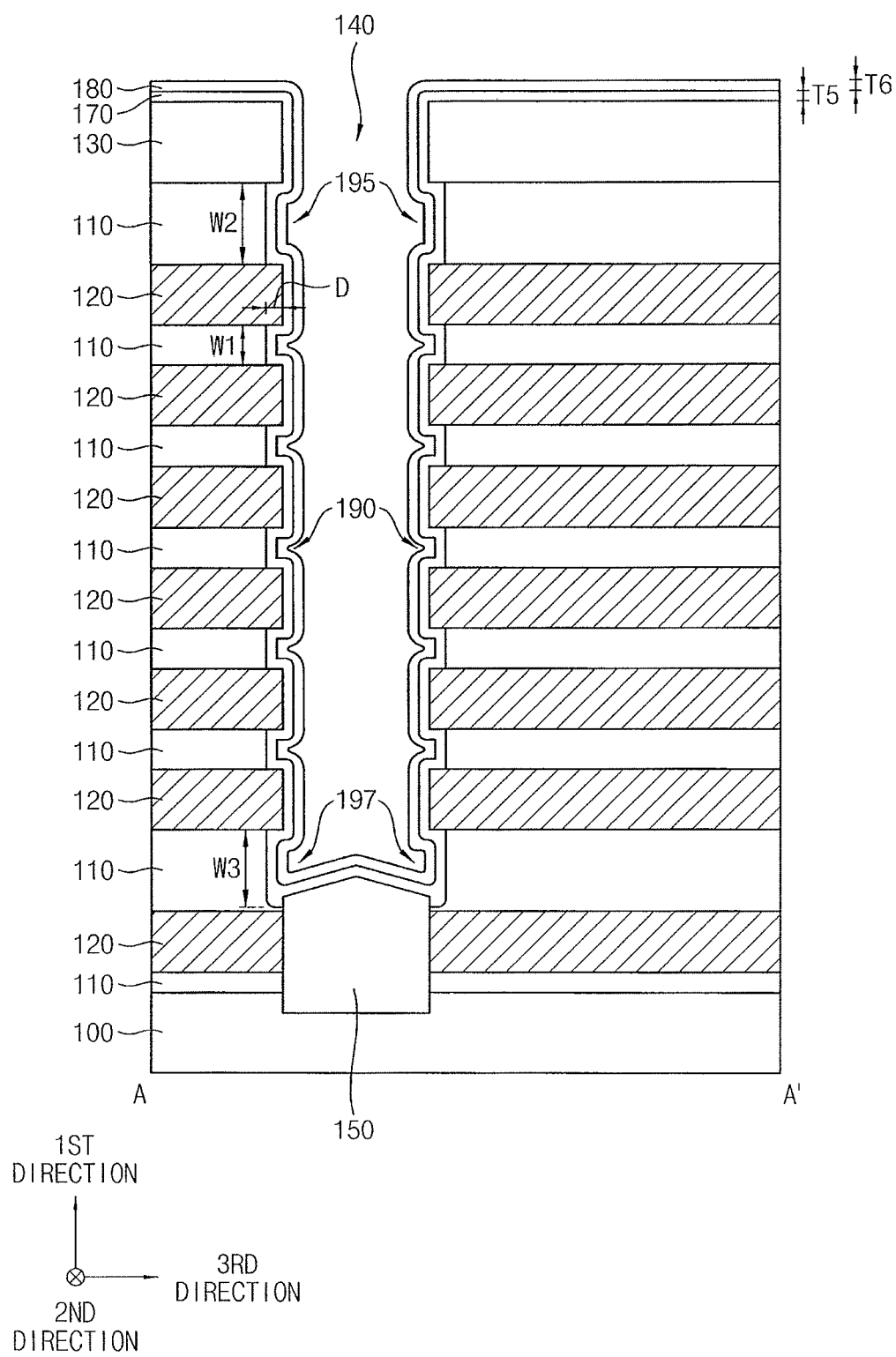

Referring to FIG. 9, a first blocking layer 170 and a charge trapping layer 180 may be sequentially formed on a sidewall of the channel hole 140, inner walls of the first to third recesses 160, 165 and 167, the upper surface of the first semiconductor pattern 150, and an upper surface of the first mask 130. The first blocking layer 170 may be formed of an oxide (e.g., silicon oxide) and the charge trapping layer 180 may be formed of a nitride, e.g., silicon nitride. In an example embodiment, the first blocking layer 170 may include a material substantially the same as that of the insulating interlayer 110, and thus may be merged therewith.

The first blocking layer 170 and the charge trapping layer 180 may be formed to have fifth and sixth thicknesses T5 and T6, respectively. In example embodiments, the depth D of each of the first to third recesses 160, 165, and 167 may be greater than at least the fifth thickness T5 of the first blocking layer 170. The first to third widths W1, W2, and W3 of the respective first to third recesses 160, 165, and 167 may be greater than a sum of twice the fifth thickness T5 and the sixth thickness T6. Thus, fourth, fifth, and sixth recesses 190, 195, and 197 may be formed in the charge trapping layer 180 respectively corresponding to the first, second, and third recesses 160, 165, and 167 in the insulating interlayers 110.

In example embodiments, the depth D of each of the first to third recesses 160, 165, and 167 may be equal to or less than a sum of the fifth thickness T5 and the sixth thickness T6.

In example embodiments, the first width W1 of the first recess 160 may be equal to or less than the sum of twice the fifth thickness T5 and the sixth thickness T6. Thus, the fourth recess 190 corresponding to the first recess 160 may have a width in the first direction that decreases from an entrance toward a bottom thereof along the horizontal direction, e.g., along the second direction or the third direction. The first width W1 may be equal to or less than the sum of twice the fifth thickness T5 and the sixth thickness T6, which may mean that the one of the first insulating interlayers 110 in which the first recess 160 is formed may have the small first thickness T1. For example, the one of the insulating interlayers 110 having the first thickness T1 may be thinly formed. Thus, the whole thickness of the vertical memory device may be reduced.

The second width W2 of the second recess 165 may be greater than the sum of twice the fifth thickness T5 and the sixth thickness T6, and further be greater than twice the sum of the fifth thickness T5 and the sixth thickness T6. Thus, the fifth recess 195 corresponding to the second recess 165 may have a width in the first direction nearly constant from an entrance toward a bottom thereof along the horizontal direction, e.g., along the second direction or the third direction. The width in the first direction of the fifth recess 195 may be greater than the width in the first direction of fourth recess 190.

The third width W3 of the third recess 167 may be greater than the sum of twice the fifth thickness T5 and the sixth thickness T6, and further be greater than twice the sum of the fifth thickness T5 and the sixth thickness T6. Thus, the sixth recess 197 corresponding to the third recess 167 may have a width in the first direction nearly constant from an entrance toward a bottom thereof along the horizontal direction, e.g., along the second direction or the third direction. The width in the first direction of the sixth recess 197 may be greater than the width in the first direction of the fourth recess 190.

According to the shape of the first semiconductor pattern 150 close (e.g., adjacent) to the third recess 167, the sixth recess 197 may have a shape partially different from that of the third recess 167.

Figure 10:
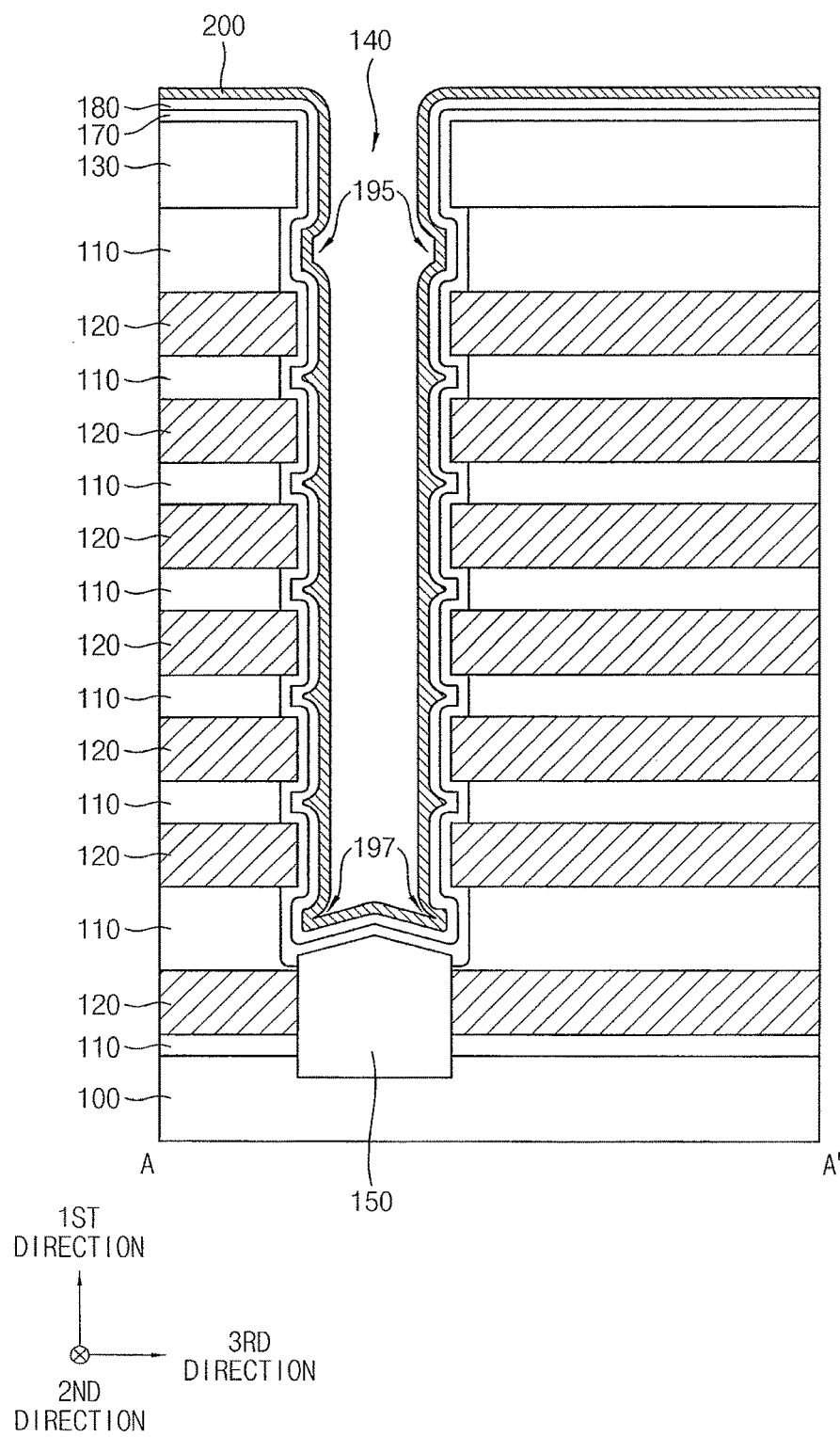

Referring to FIG. 10, a second semiconductor layer 200 may be formed on the charge trapping layer 180 to fill the fourth recess 190. The second semiconductor layer 200 may be formed of a semiconductor material (e.g., silicon, germanium, etc.) and may be heavily doped with impurities. In example embodiments, the second semiconductor layer 200 may be doped with n-type impurities (e.g., phosphorus, arsenic, etc.) at a doping concentration of more than about $1 \times 10^{20}$ cm$^{-3}$.

In example embodiments, the second semiconductor layer 200 may sufficiently fill the fourth recess 190, but may not sufficiently fill the fifth and sixth recesses 195 and 197 and may be conformally formed thereon. Thus, the fifth and sixth recesses 195 and 197 may at least partially remain.

Figure 11:
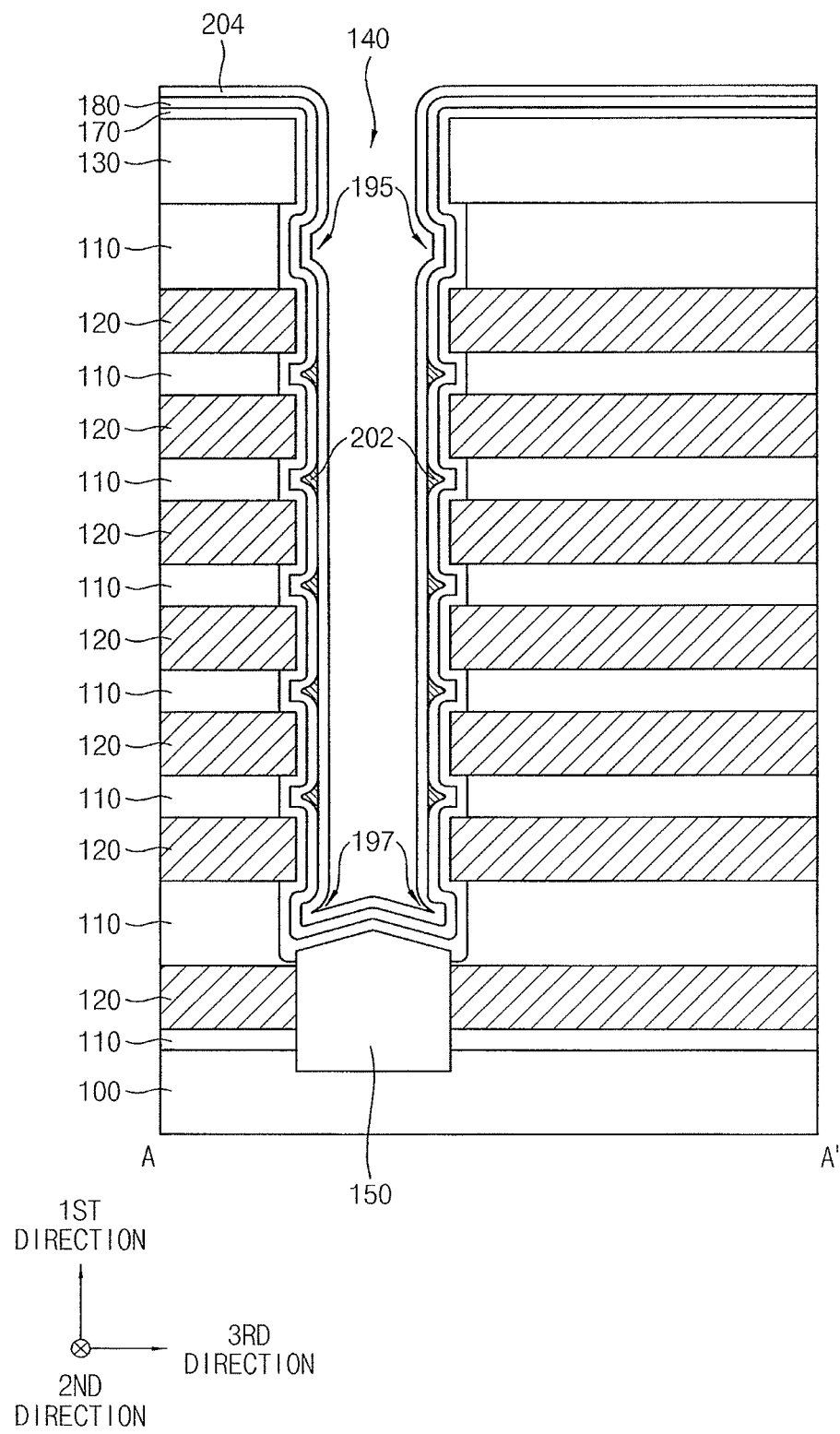

Referring to FIG. 11, the second semiconductor layer 200 doped with impurities may be partially oxidized to form a semiconductor oxide layer 204. A portion of the second semiconductor layer 200 not oxidized may remain as a second semiconductor pattern 202.

In example embodiments, the oxidation process may be performed from an outer sidewall of the second semiconductor layer 200. Thus, a portion of the second semiconductor layer 200 relatively far from the outer sidewall of the second semiconductor layer 200 (e.g., a portion of the second semiconductor layer filling the fourth recess 190) may not be oxidized. Thus, the second semiconductor pattern 202 may fill the fourth recess 190 and may have a ring shape.

Figure 12:
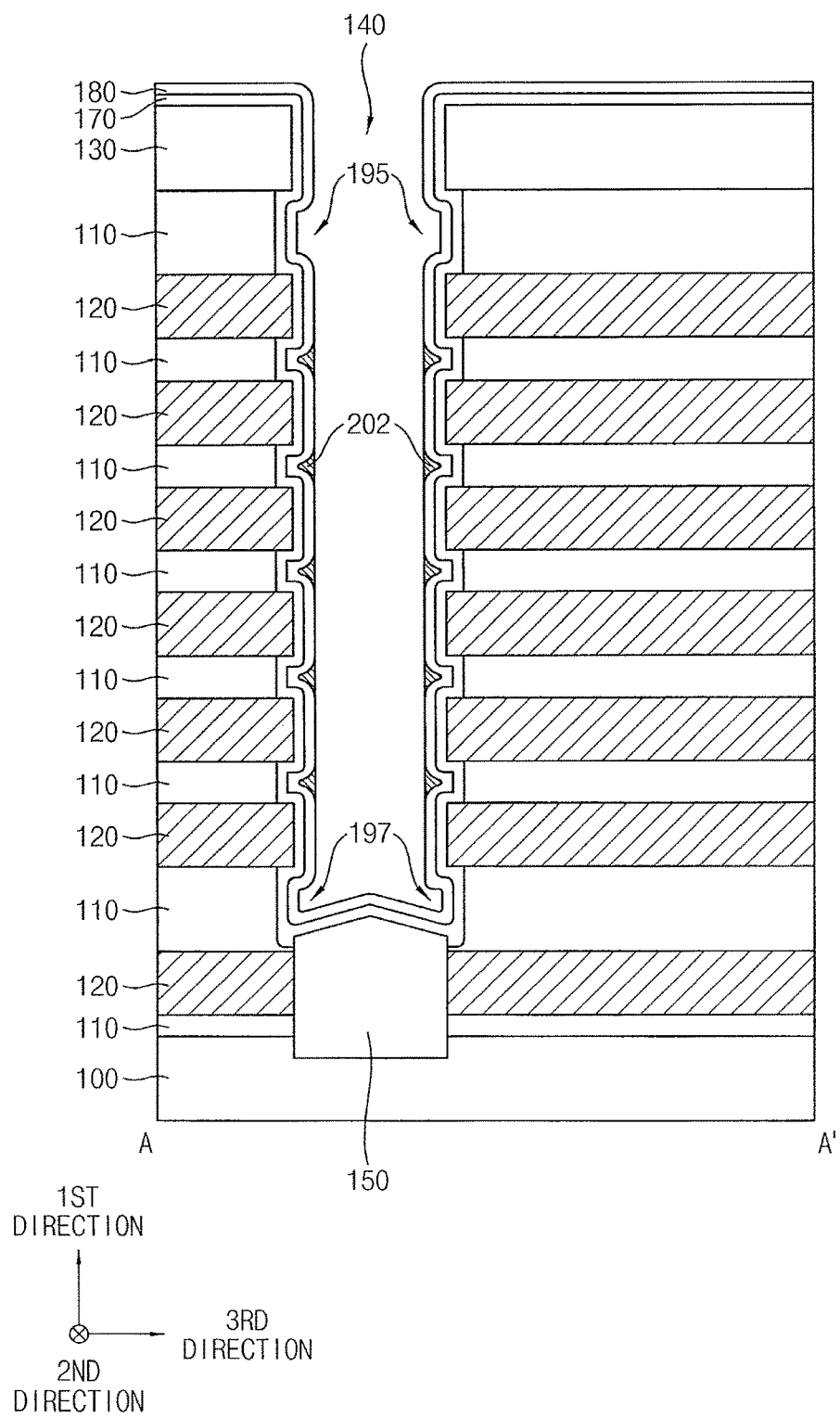

Referring to FIG. 12, the semiconductor oxide layer 204 may be removed to expose the charge trapping layer 180, and the second semiconductor pattern 202 doped with impurities may remain. In example embodiments, the semiconductor oxide layer 204 may be removed by a wet etching process. As the semiconductor oxide layer 204 is removed, the fifth and sixth recesses 195 and 197 partially filled with the semiconductor oxide layer 204 may have their original shapes. Unlike in FIGS. 11 and 12, an etch-back process may be performed on the second semiconductor layer 200 doped with impurities to form the second semiconductor pattern 202 filling the fourth recess 190.

Figure 13:
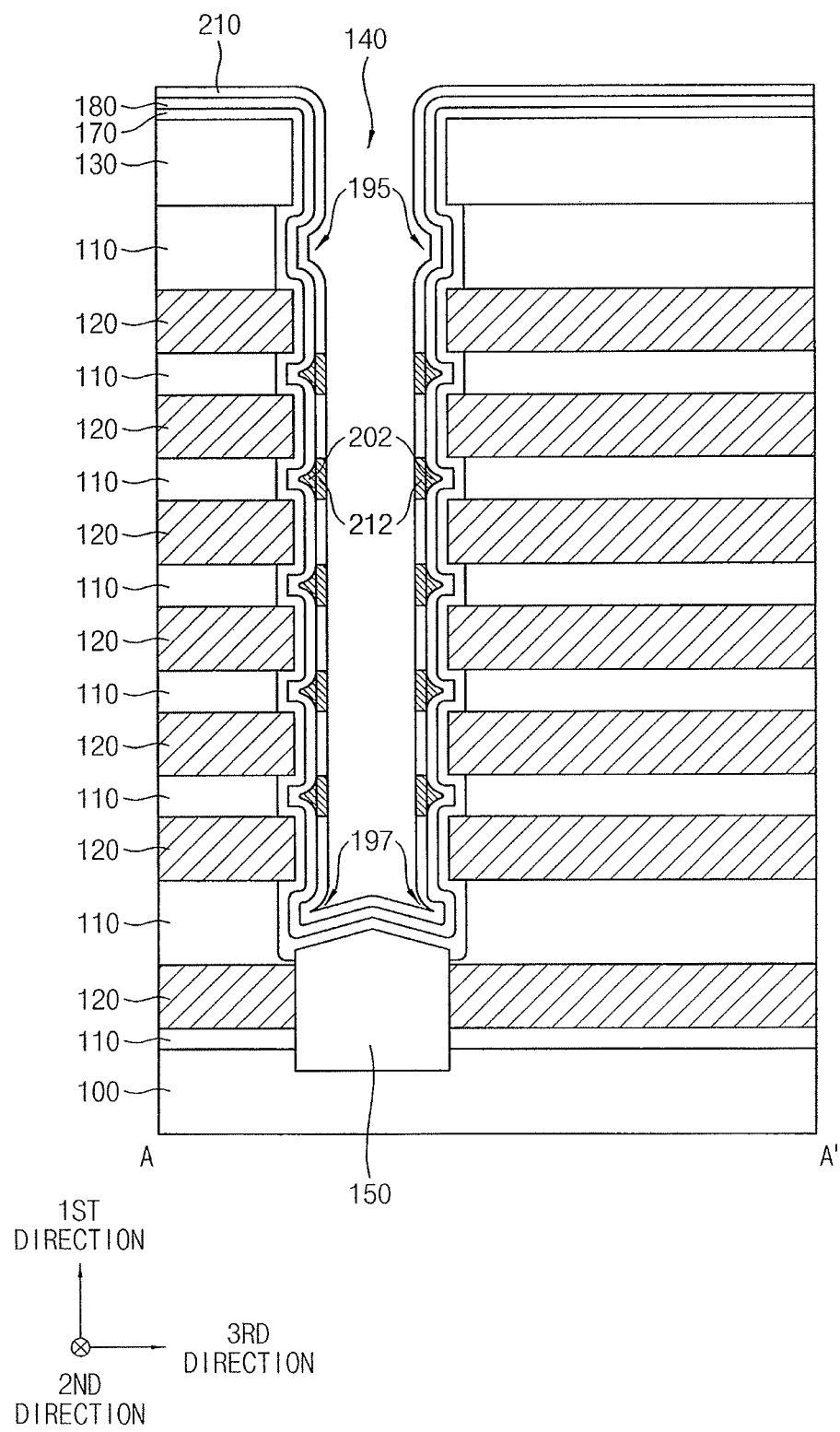

Referring to FIG. 13, a third semiconductor layer 210 may be formed on the exposed charge trapping layer 180 and the second semiconductor pattern 202. In example embodiments, the third semiconductor layer 210 may be formed of a semiconductor material (e.g., silicon, germanium, etc.) and may not be doped with impurities.

A heat treatment process, e.g., a rapid thermal annealing (RTA) process may be performed so that the impurities doped in the second semiconductor pattern 202 diffuse into a portion of the third semiconductor layer 210. Thus, a third semiconductor pattern 212 doped with impurities may be formed. The second semiconductor pattern 202 may be heavily doped with impurities. Thus, the impurities may be easily diffused into the third semiconductor layer 210 by the heat treatment process.

In example embodiments, the impurities may be diffused into a portion of the third semiconductor layer 210 close (e.g., adjacent) to the second semiconductor pattern 202 in the horizontal direction, e.g., in the second direction or in the third direction. Thus, the third semiconductor pattern 212 may have a ring shape. In an example embodiment, the third semiconductor pattern 212 having a ring shape may have a thickness in the first direction that is constant from an outer sidewall toward an inner sidewall thereof. In one embodiment, the recesses may be filled with an n+ silicon layer, an undoped silicon layer on the n+ silicon layer, and impurities may be diffused into the undoped silicon layer by a heat treatment process. The doped silicon layer may be removed to leave a silicon mask.

Figure 14:
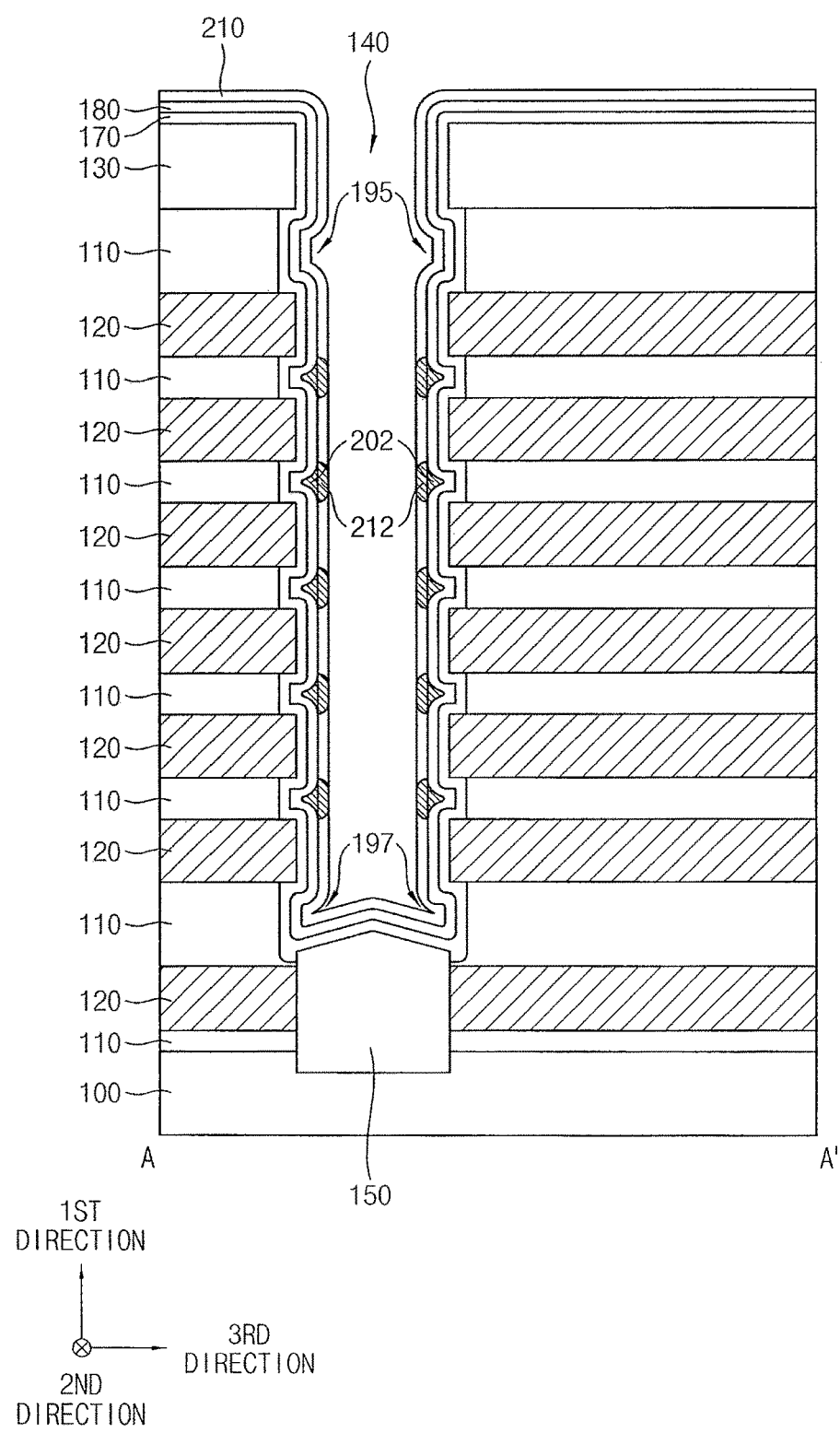

Referring to FIG. 14, in another embodiment, the thickness in the first direction of the third semiconductor pattern 212 may gradually decrease from the outer sidewall toward the inner sidewall thereof. For example, the distance between an outer boundary of the third semiconductor pattern 212 and the second semiconductor pattern 202 may be nearly constant. Hereinafter, for convenience of explanation, only the third semiconductor pattern 212 in FIG. 13 will be illustrated.

Figure 15:
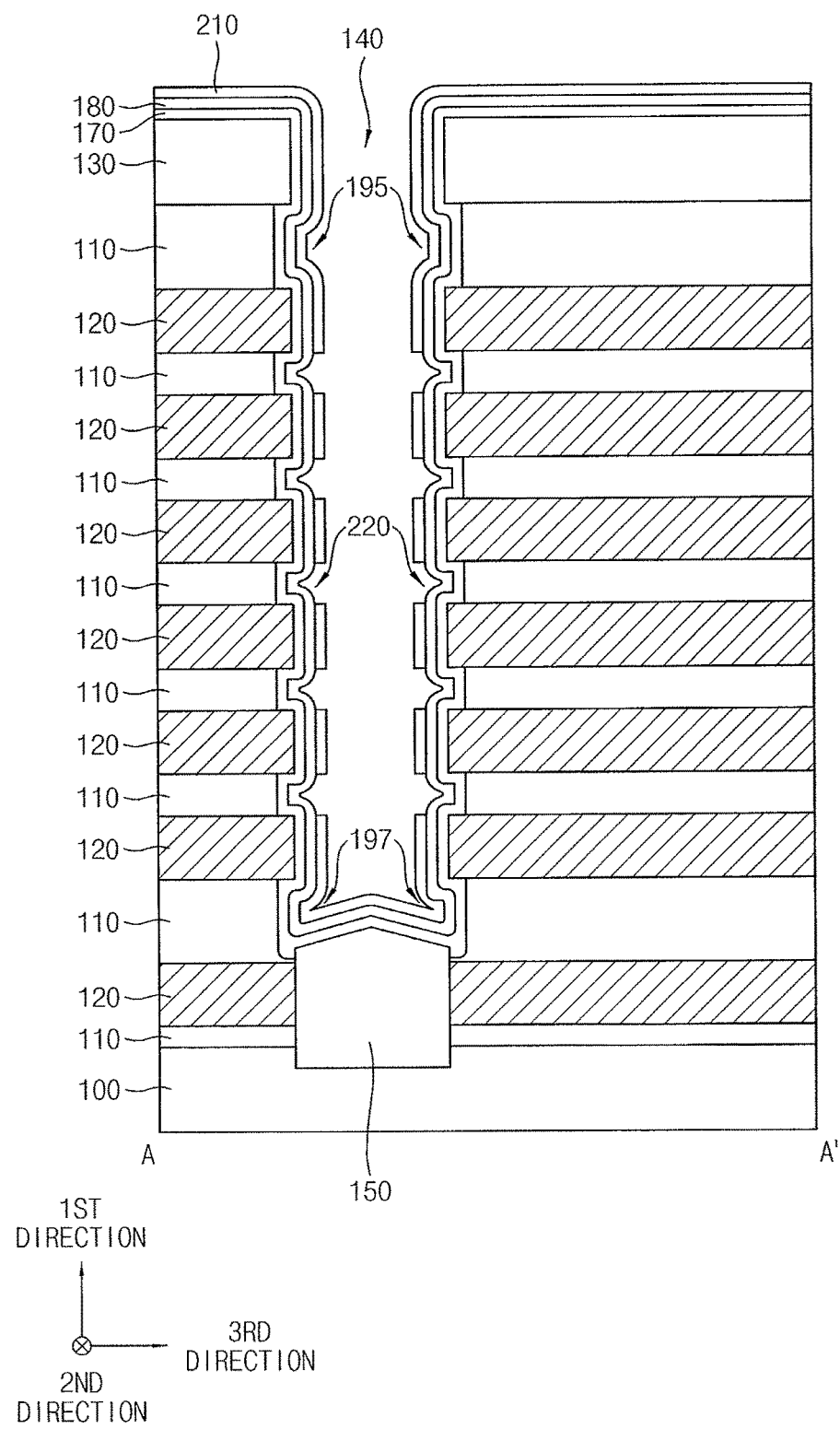

Referring to FIG. 15, the second and third semiconductor patterns 202 and 212 may be removed to form first openings 220 partially exposing the charge trapping layer 180. In example embodiments, the second and third semiconductor patterns 202 and 212 may be removed by a wet etching process or a dry etching process. Each of the second and third semiconductor patterns 202 and 212 are heavily doped with n-type impurities, and thus may have a high etching selectivity with respect to the third semiconductor layer 210 not doped with impurities, so as to be easily removed by the etching process.

The second semiconductor pattern 202 may fill the fourth recess 190, and thus each of the first openings 220, which may be formed by removing the second semiconductor pattern 202 and the third semiconductor pattern 212 thereon, may expose a portion of the charge trapping layer 180 close (e.g., adjacent) to a bottom of the fourth recess 190.

Figure 16:
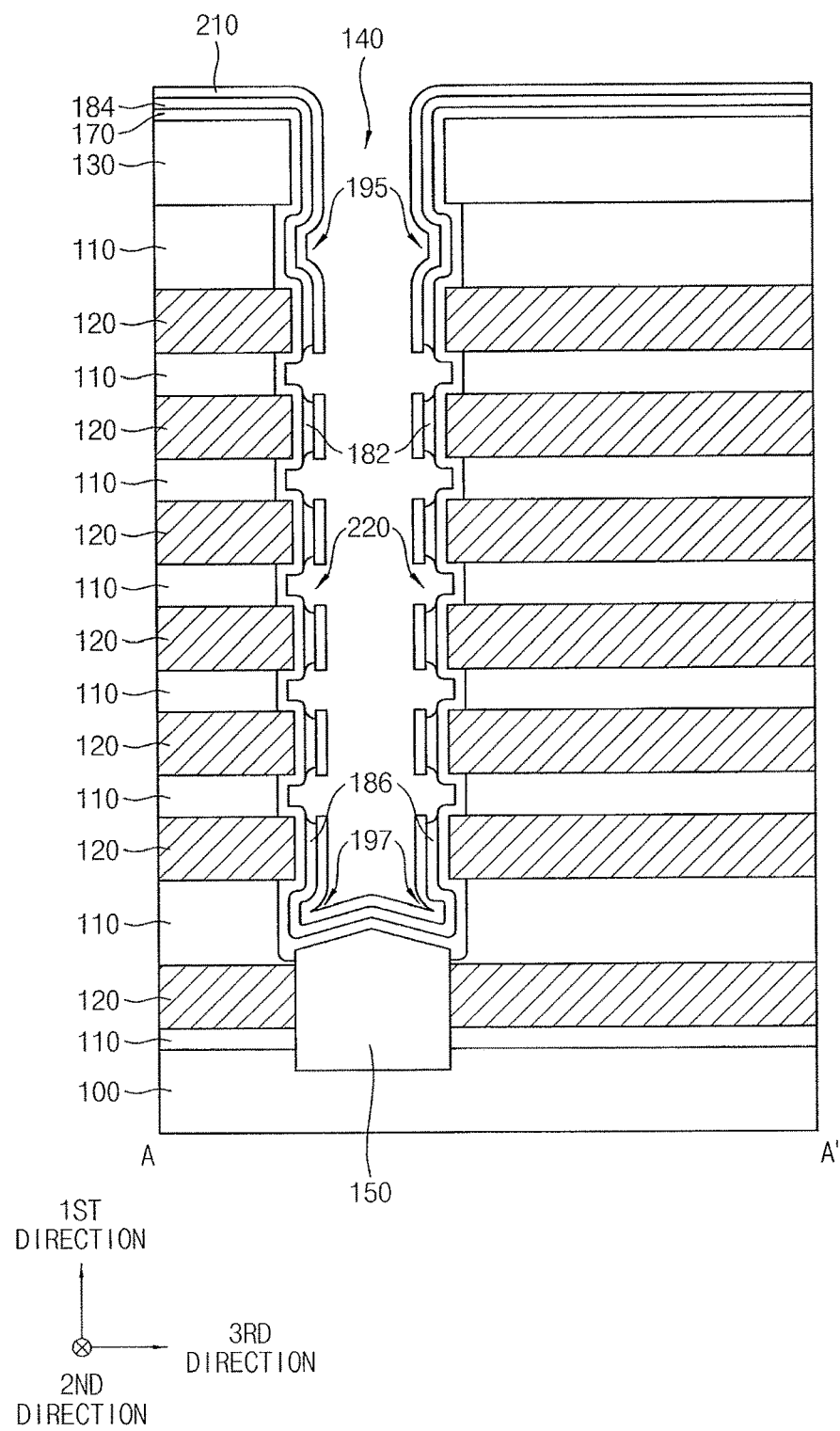

Referring to FIG. 16, the exposed portions of the charge trapping layer 180 by the first openings 220 may be removed to form a charge trapping pattern structure including first, second, and third charge trapping patterns 182, 184, and 186 spaced apart from each other in the first direction. When the charge trapping pattern structure is formed, the first openings 220 may be enlarged. The enlarged first openings 220 may partially expose the first blocking layer 170.

In example embodiments, the charge trapping layer 180 may be partially removed by a wet etching process or a dry etching process. In order to divide the first to third charge trapping patterns 182, 184, and 186 from each other, a portion of the first blocking layer 170 under the charge trapping layer 180 may be also partially etched.

The first charge trapping pattern 182 may be formed close (e.g., adjacent) to a sidewall of the sacrificial layer 120 in the horizontal direction, e.g., in the second or third direction. A plurality of first charge trapping patterns 182 may be formed to be spaced apart from each other in the first direction. In example embodiments, the distance between the first charge trapping pattern 182 and a center of the channel hole 140 in the horizontal direction (e.g., in the second or third direction) may be constant in the first direction.

The second charge trapping pattern 184 may be close (e.g., adjacent) to the sidewall of the sacrificial layer 120 in the horizontal direction (e.g., in the second or third direction), and further may extend in the first direction along a sidewall of the insulating interlayer 110. In example embodiments, the second charge trapping pattern 184 may be close (e.g., adjacent) to the sidewall of the sacrificial layer 120 in the horizontal direction, and may extend in the first direction along a sidewall of a portion of the first blocking layer 170 on a sidewall of an uppermost one of the insulating interlayers 110. Further, the second charge trapping pattern 184 may cover a portion of the first blocking layer 170 on a sidewall and an upper surface of the first mask 130.

Thus, the distance between the second charge trapping pattern 184 and a center of the channel hole 140 in the horizontal direction (e.g., in the second or third direction) may vary along the first direction. The distance between a portion of the second charge trapping pattern 184 close (e.g., adjacent) to the sidewall of the sacrificial layer 120 and the center of the channel hole 140 in the horizontal direction may be less than a distance between a portion of the second charge trapping pattern 184 close (e.g., adjacent) to the sidewall of the uppermost one of the insulating interlayers 110 and the center of the channel 270 in the horizontal direction.

The third charge trapping pattern 186 may be close (e.g., adjacent) to the sidewall of the sacrificial layer 120 in the horizontal direction (e.g., in the second direction or in the third direction), and may extend in the first direction along a sidewall of a portion of the first blocking layer 170 on a sidewall of a second one of the insulating interlayers 110 from the top surface of the substrate 100. Further, the third charge trapping pattern 186 may cover a portion of the first blocking layer 170 on the upper surface of the first semiconductor pattern 150. Thus, the distance between the third charge trapping pattern 186 and, a center of the channel hole 140 in the horizontal direction (e.g., in the second or third direction) may vary in the first direction.

Figure 17:
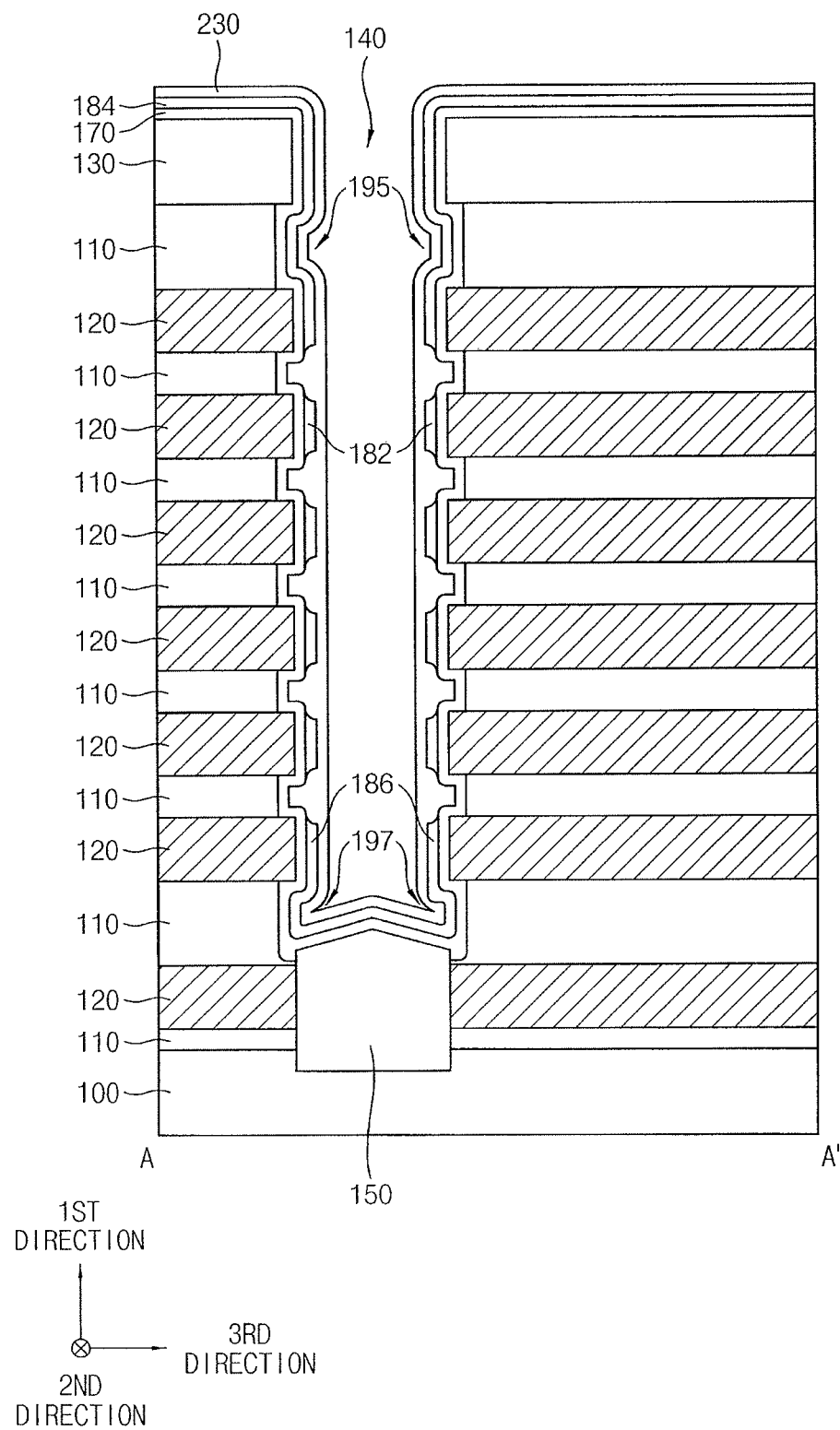

Referring to FIG. 17, the third semiconductor layer 210 may be removed to expose the first to third charge trapping patterns 182, 184, and 186. A first filling layer 230 may be formed on the exposed first to third charge trapping patterns 182, 184, and 186 and on the portions of the first blocking layer 170 exposed by the first openings 220. In example embodiments, the third semiconductor layer 210 may be removed by a wet etching process.

The first filling layer 230 may be formed, e.g., of silicon oxide. In an example embodiment, the first filling layer 230 may include a material substantially the same as that of the first blocking layer 170, for example, so that they may be merged. In example embodiments, the first filling layer 230 may sufficiently fill the enlarged first openings 220, but may not sufficiently fill the fifth and sixth recesses 195 and 197. Thus, the first filling layer 230 may be conformally formed on the fifth and sixth recesses 195 and 197.

Figure 18:
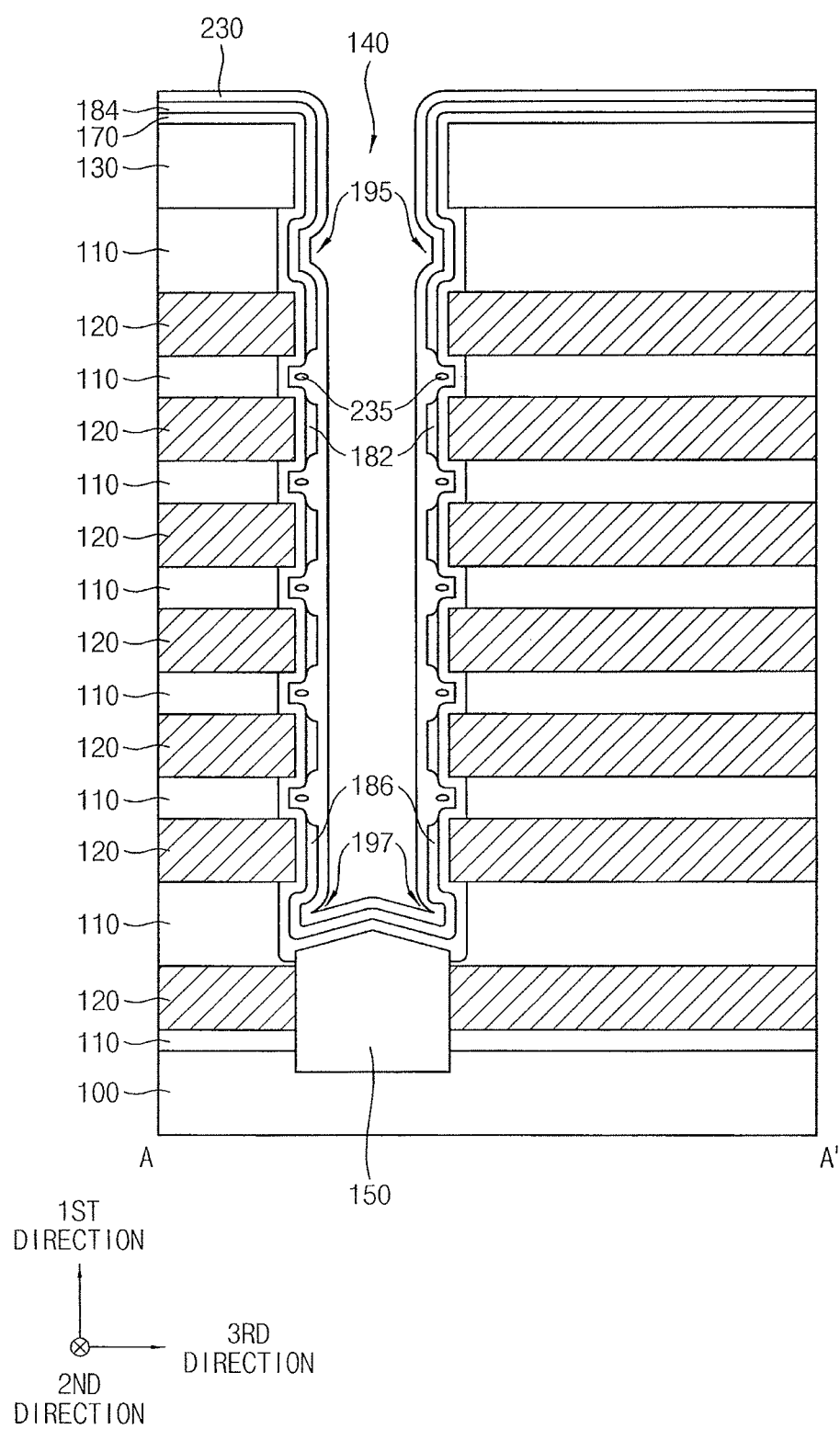

Referring to FIG. 18, an air gap 235 may be formed in the first filling layer 230.

Figure 19:
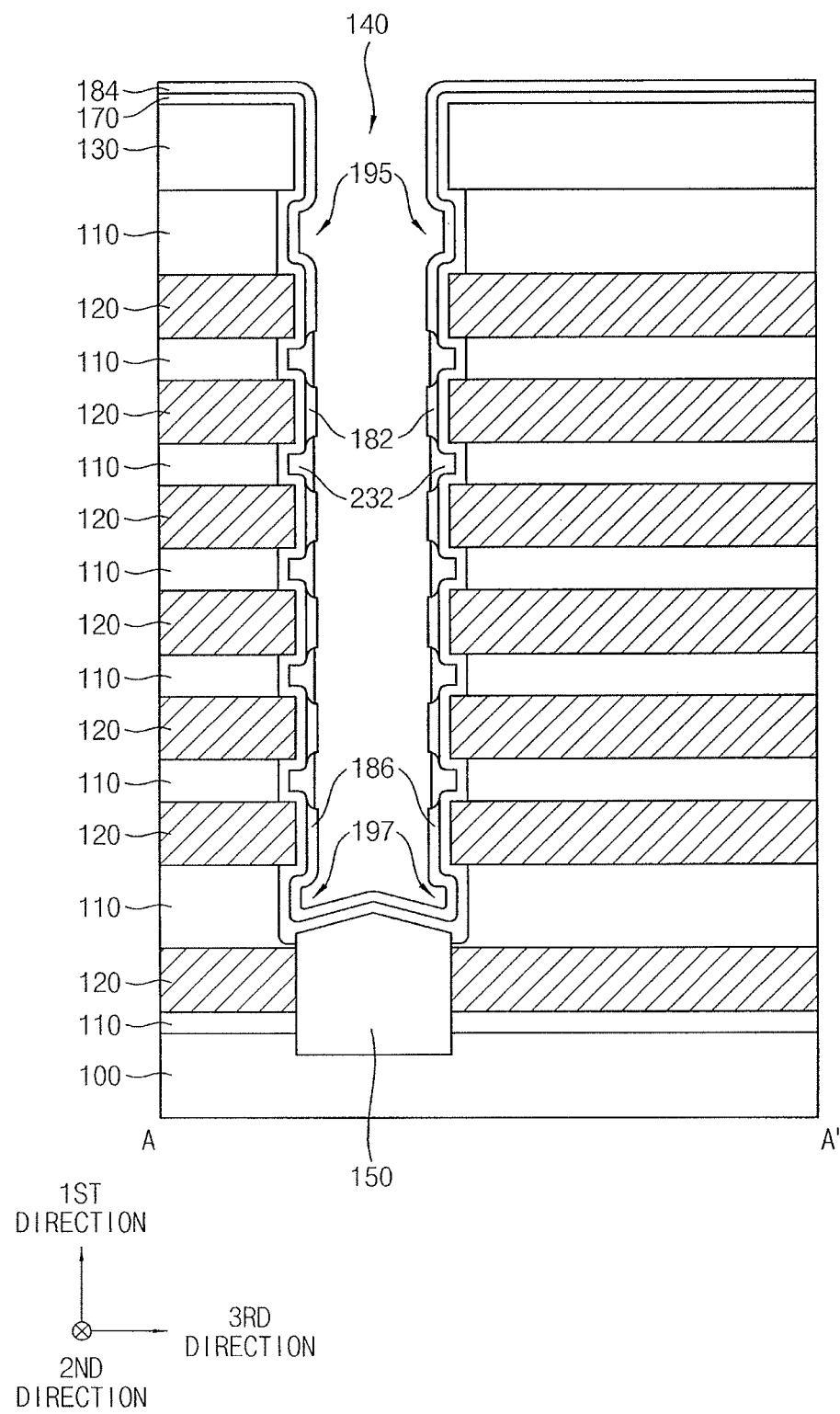

Referring to FIG. 19, an etch-back process may be performed on the first filling layer 230 to form first filling patterns 232 filling the enlarged first openings 220, respectively. In example embodiments, the first to third charge trapping patterns 182, 184, and 186 may be exposed by the etch-back process. Each of the first filling patterns 232 may completely or partially fill each of the first openings 220. The distance between each of the first filling patterns 232 and the center of the channel hole 140 may be equal to or greater than a distance between each of the first charge trapping patterns 182 and the center of the channel hole 140.

Each of the first filling patterns 232 may fill at least partially each of the first openings 220 and may have a ring shape. Each of the first filling patterns 232 may include a lower portion, a central portion, and an upper portion sequentially stacked in the first direction. The thickness of the central portion in the horizontal direction may be greater than that of the lower portion or the upper portion in the horizontal direction. The central portion of each of the first filling patterns 232 may contact and be covered by the first blocking layer 170. The lower portion or the upper portion of each of the first filling patterns 232 may contact the first blocking layer 170 and the first to third charge trapping patterns 182, 184, and 186, and may be covered by the first blocking layer 170 and the first to third charge trapping patterns 182, 184, and 186.

As the etch-back process is performed, portions of the first filling layer 230 on the fifth and sixth recesses 195 and 197 may be removed. Thus, the fifth and sixth recesses 195 and 197 may have, for example, their original shapes.

Figure 20:
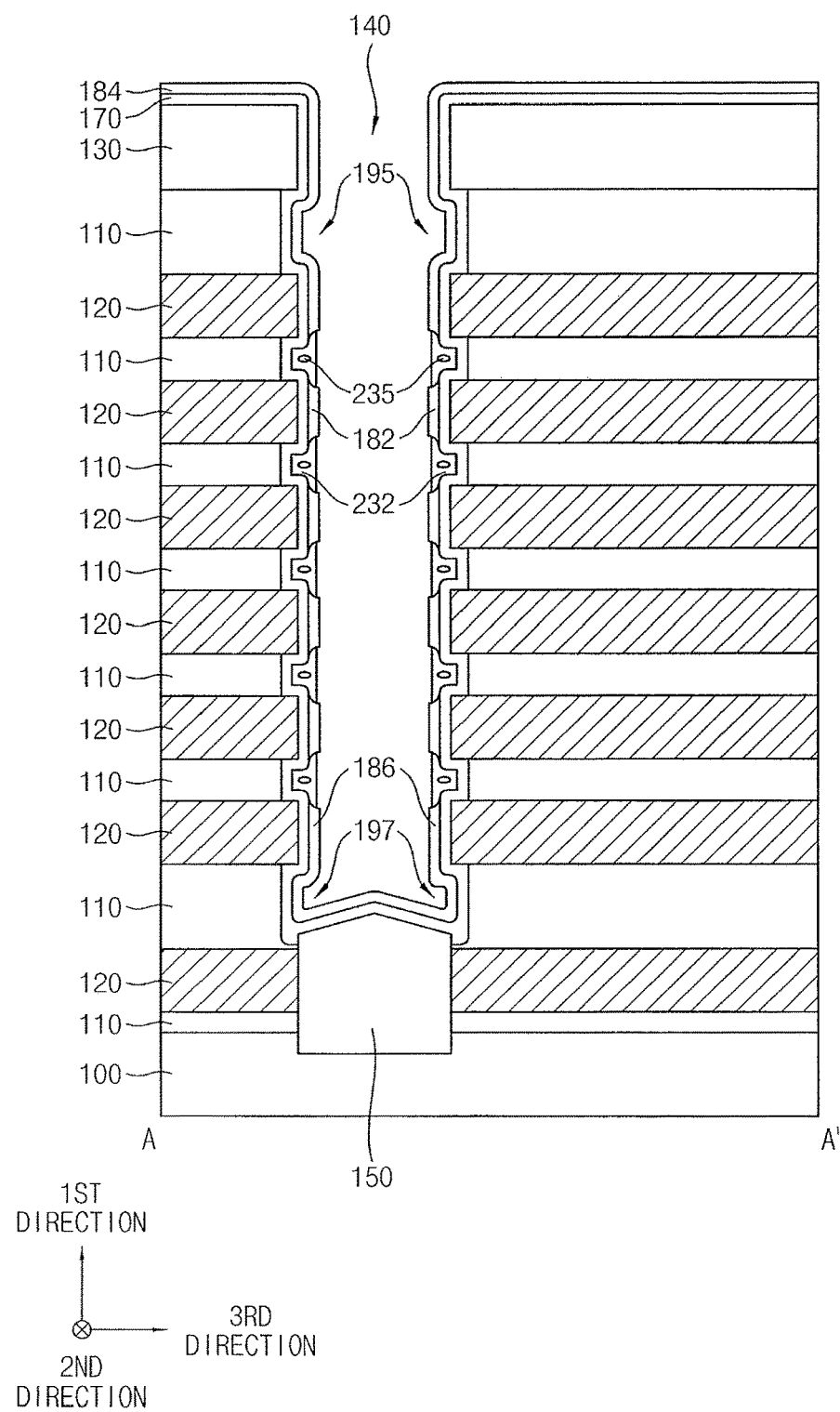

FIG. 20 illustrates the embodiment in which the air gap 235 is formed in the first filling layer 230. The air gap 235 still remains in the first filling pattern 232 after the etch-back process.

Figure 21:
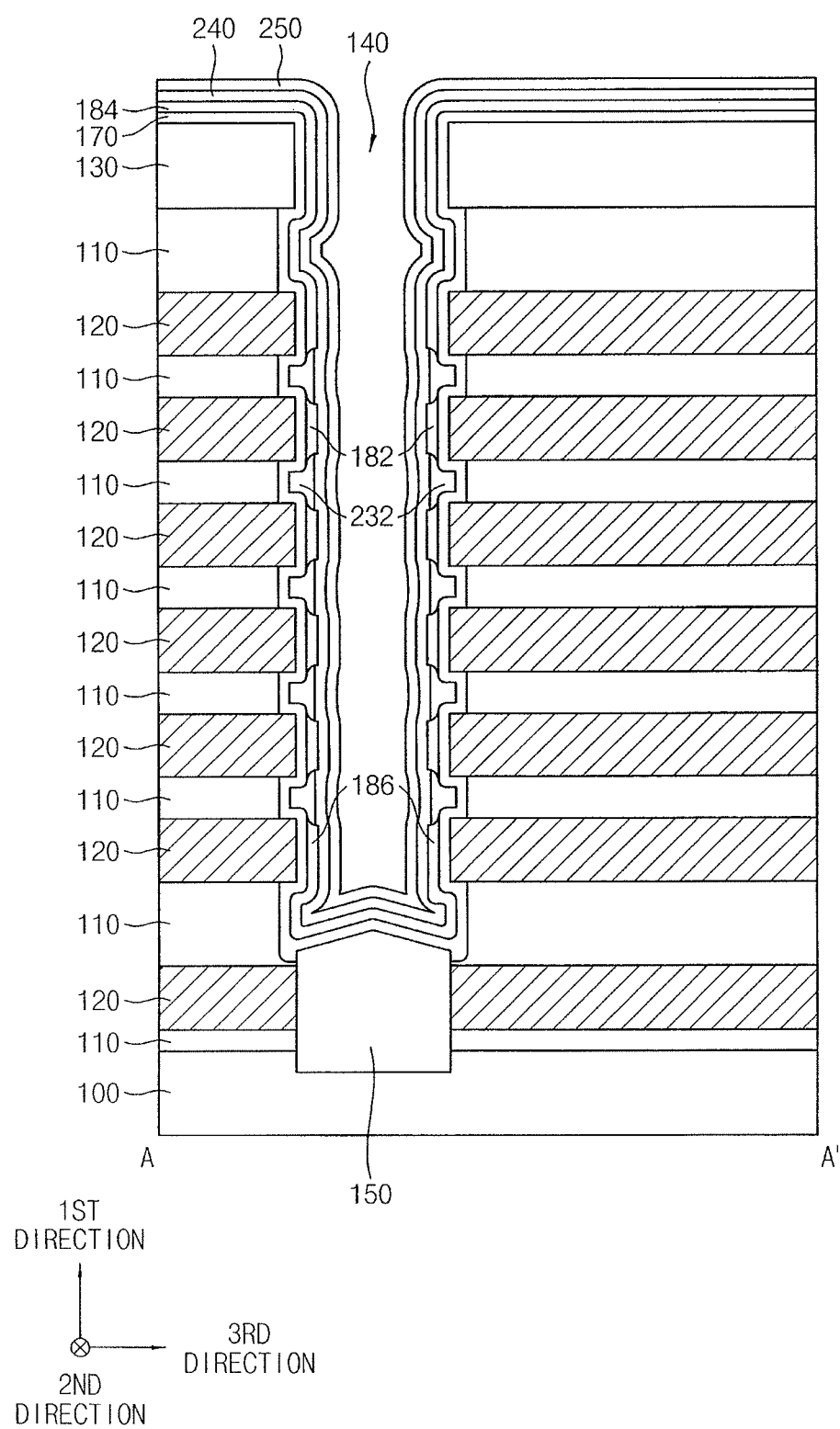

Referring to FIG. 21, a tunnel insulation layer 240 and a first spacer layer 250 may be sequentially formed on the first to third charge trapping patterns 182, 184, and 186 and the first filling patterns 232. The tunnel insulation layer 240 may be formed of (e.g., silicon oxide). The first spacer layer 250 may be formed of, e.g., silicon nitride.

Figure 22:
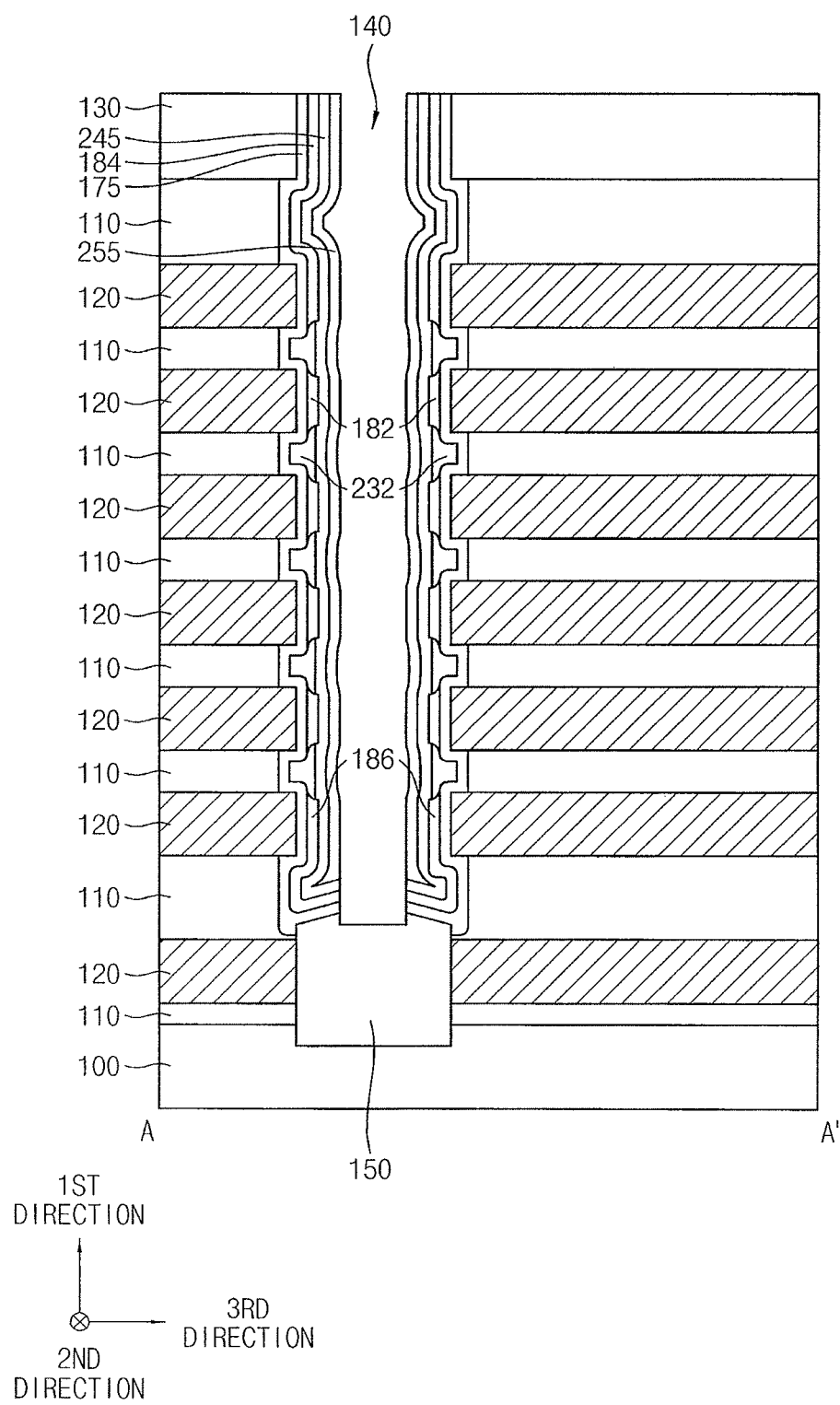

Referring to FIG. 22, the first spacer layer 250 may be anisotropically etched to form a first spacer 255 on a sidewall of the channel hole 140 and to expose the tunnel insulation layer 240. The tunnel insulation layer 240, the second and third charge trapping patterns 184 and 186, and the first blocking layer 170 may be etched using the first spacer layer 255 as an etching mask. Thus, portions of the tunnel insulation layer 240, the third charge trapping pattern 186 and the first blocking layer 170 on the first semiconductor pattern 150, and portions of the tunnel insulation layer 240, the second charge trapping pattern 184 and the first blocking layer 170 on the first mask 130 may be removed. Further, an upper portion of the first semiconductor pattern 150 may be partially etched.

By the etching process, the tunnel insulation layer 240 may be transformed into a tunnel insulation pattern 245, and the first blocking layer 170 may be transformed into a first blocking pattern 175. Each of the tunnel insulation pattern 245, the third charge trapping pattern 186, and the first blocking pattern 175 may have a cup-like shape having an open central bottom portion. Each of the first and second charge trapping patterns 182 and 184 may have a ring shape.

The tunnel insulation pattern 245, the charge trapping pattern structure, and the first blocking pattern 175 may form a charge storage pattern structure. The charge trapping pattern structure may include the first, second, and third charge trapping patterns 182, 184, and 186 spaced apart from each other in the first direction.

Figure 23:
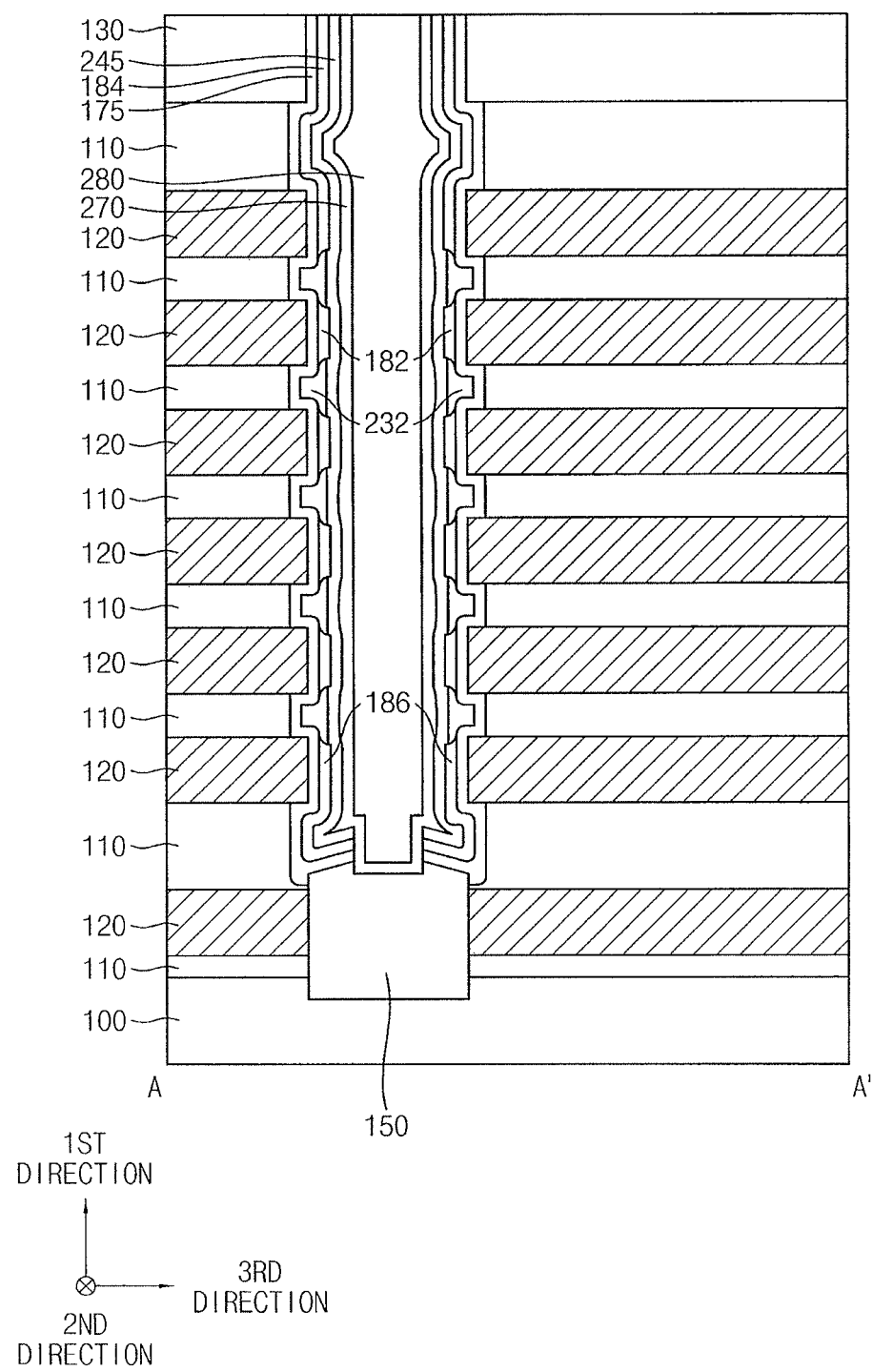

Referring to FIG. 23, after the first spacer 255 may be removed to expose the tunnel insulation pattern 245, a channel layer may be formed on the exposed tunnel insulation pattern 245, the first semiconductor pattern 150 and the first mask 130, and a second filling layer may be formed on the channel layer to sufficiently fill remaining portions of the channel holes 140.

The channel layer may be formed, for example, of doped or undoped polysilicon or amorphous silicon. When the channel layer includes amorphous silicon, a laser epitaxial growth (LEG) process or a solid phase epitaxy (SPE) process may be performed to convert the amorphous silicon to crystalline silicon. The second filling layer may be formed of an oxide, e.g., silicon oxide.

The second filling layer and the channel layer may be planarized until an upper surface of the first mask 130 is exposed to form a second filling pattern 280 filling a remaining portion of each of the channel holes 140, and the channel layer may be transformed into a channel 270.

Thus, the charge storage pattern structure, the channel 270, and the second filling pattern 280 may be sequentially stacked on the first semiconductor pattern 150 in each of the channel holes 140. The charge storage pattern structure may have a cup-like shape with an open central bottom portion, the channel 270 may have a cup-like shape, and the second filling pattern 280 may have a pillar shape.

As the channel holes 140 may define a channel hole block including the first to fourth channel hole columns with the channel hole array including a plurality of channel hole blocks, the channels 270 may also define a channel block and a channel array (e.g., refer to FIG. 1).

Figure 24:
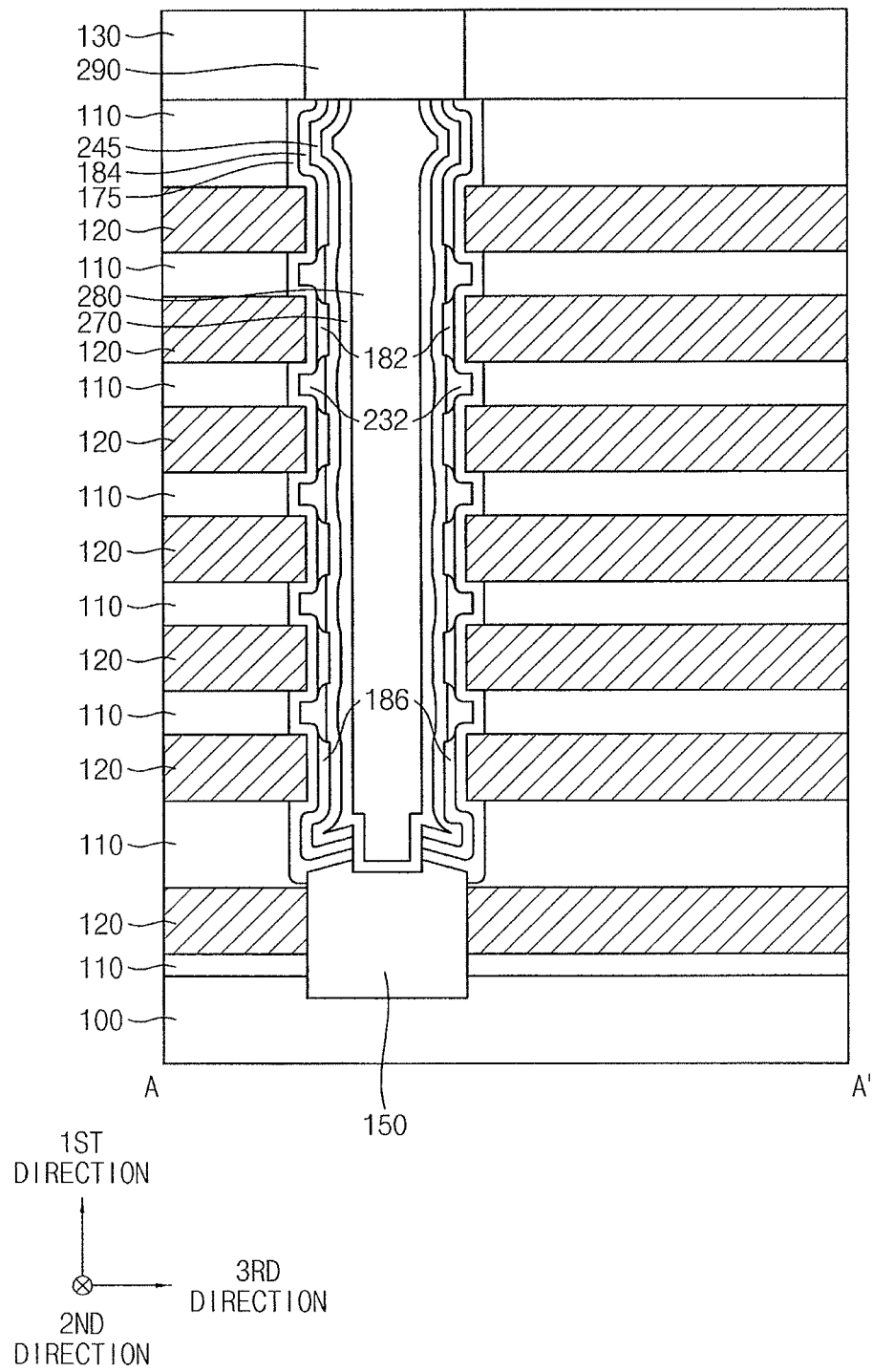

Referring to FIG. 24, an upper portion of a first structure including the second filling pattern 280, the channel 270, and the charge storage pattern structure may be removed to form a trench. A capping pattern 290 may fill the trench. For example, the upper portion of the first structure may be removed by an etch-back process to form the trench, a capping layer may be formed on the first structure and the first mask 130 to fill the trench, and an upper portion of the capping layer may be planarized until the upper surface of the first mask 130 is exposed to form the capping pattern 290.

In example embodiments, the capping layer may be formed, for example, of undoped or doped polysilicon or amorphous silicon. When the capping layer includes amorphous silicon, a crystallization process may be performed. The first structure, the first semiconductor pattern 150, and the capping pattern 290 in each of the channel holes 140 may define a second structure.

Figure 25:
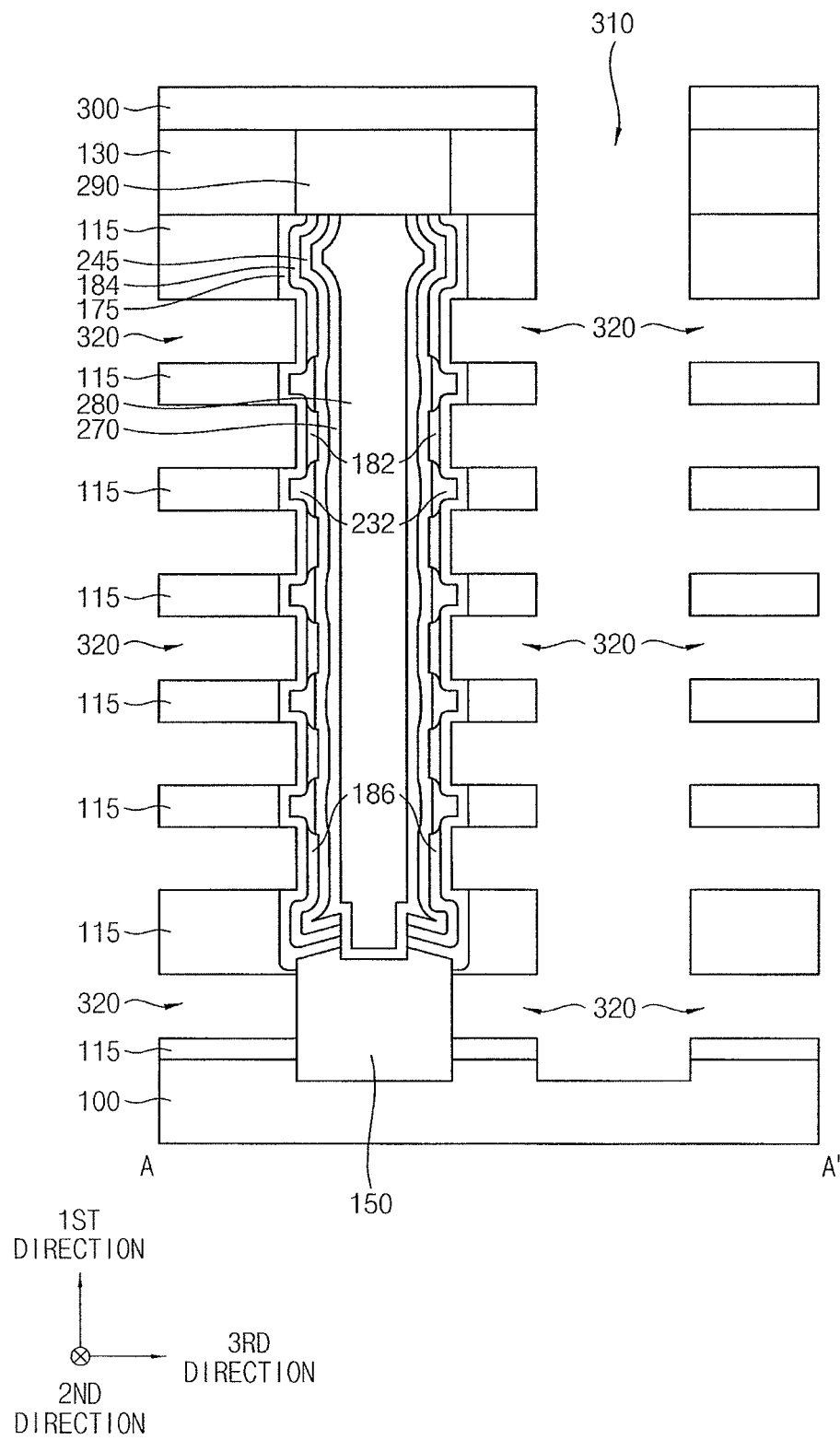

Referring to FIG. 25, after forming a second mask 300 on the first mask 130 and the capping pattern 290, a second opening 310 may be formed through the first and second masks 130 and 300, the insulating interlayers 110, and the sacrificial layers 120 to expose a top surface of the substrate 100.

In example embodiments, the second opening 310 may extend in the second direction between the channel blocks, and a plurality of second openings 310 may be formed in the third direction. Thus, four channel columns may be formed between neighboring two second openings 310. In another embodiment, a different number of channel columns may be in each of the channel blocks, and a different number of the channel columns may be formed between the neighboring ones of the second openings 310.

As the second opening 310 is formed, the insulating interlayer 110 may be transformed to an insulating interlayer pattern 115 and the sacrificial layer 120 may be transformed to a sacrificial pattern.

The sacrificial patterns exposed by the second openings 310 may be removed to form a gap 320 between the insulating interlayer patterns 115 at the respective neighboring levels. A portion of an outer sidewall of the first blocking pattern 175 and a portion of a sidewall of the first semiconductor pattern 150 may be exposed by the gap 320. In example embodiments, the sacrificial patterns exposed by the second openings 310 may be removed, for example, by a wet etch process using an etch solution including phosphoric acid and/or sulfuric acid.

Figure 26:
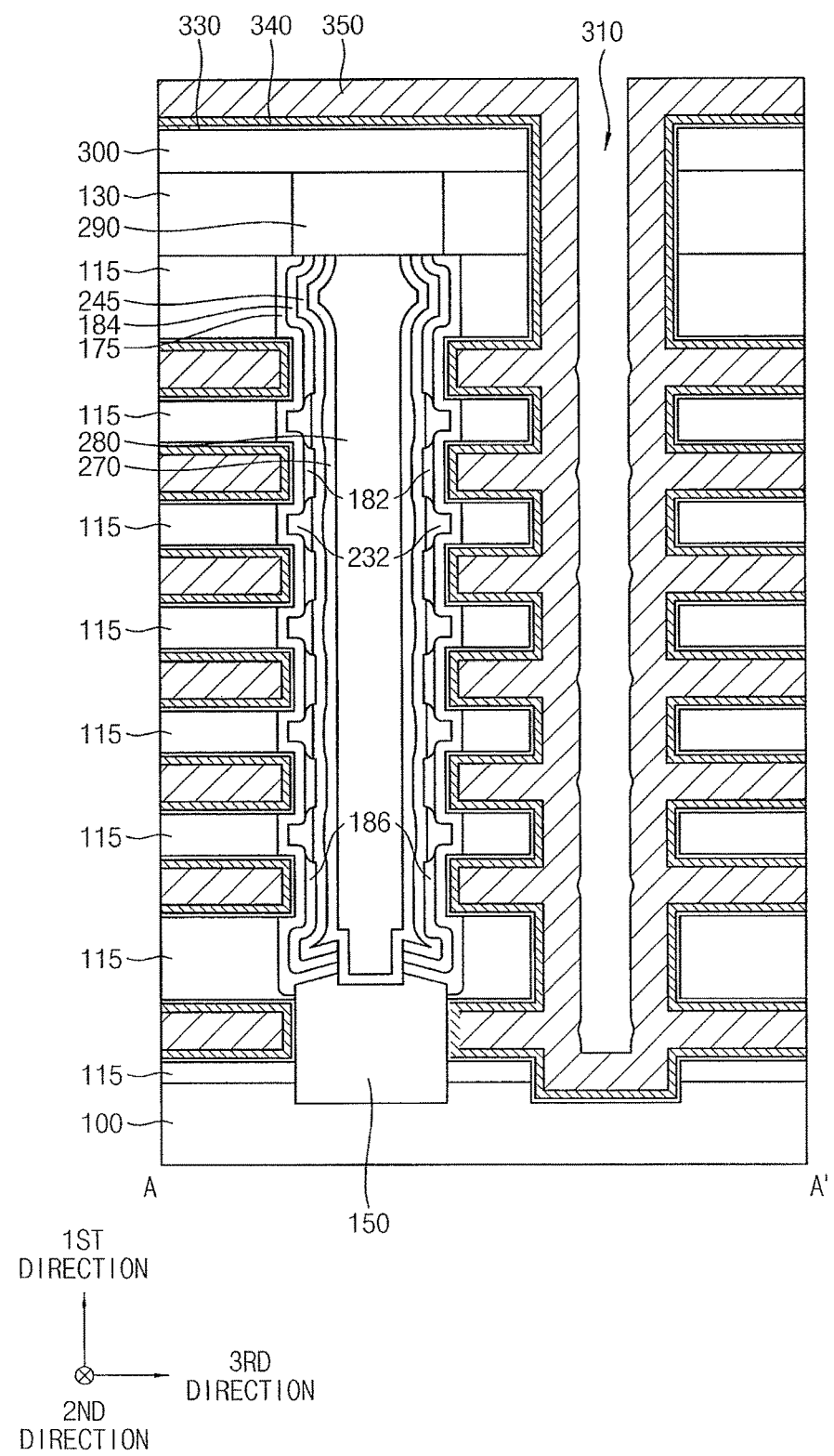

Referring to FIG. 26, a second blocking layer 330 may be formed on the exposed portion of the outer sidewall of the first blocking pattern 175, the exposed portion of the sidewall of the first semiconductor pattern 150, an inner wall of the gap 320, surfaces of the insulating interlayer patterns 115, the exposed top surface of the substrate 100, and an upper surface of the second mask 300, a gate barrier layer 340 may be formed on the second blocking layer 330, and a gate conductive layer 350 may be formed on the gate barrier layer 340 to fill a remaining portion of the gap 320.

The second blocking layer 330 may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide. The gate conductive layer 350 may be formed of a metal having a low resistance, e.g., tungsten, titanium, tantalum, platinum, etc., and the gate barrier layer 340 may be formed of a metal nitride, e.g., titanium nitride, tantalum nitride, etc. In one embodiment, the gate barrier layer 340 may be formed to include a metal layer and a metal nitride layer sequentially stacked.

Figure 27:
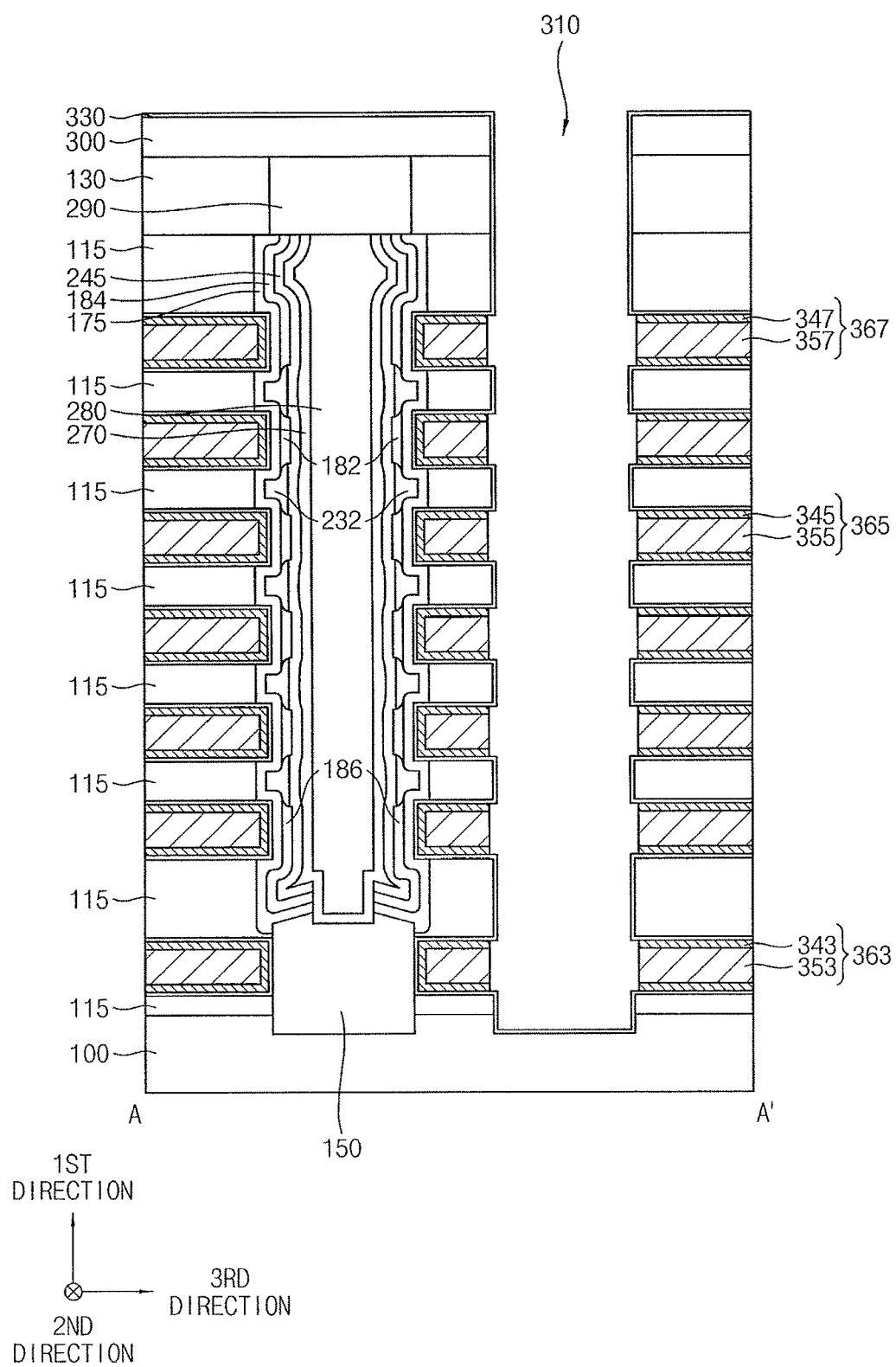

Referring to FIG. 27, the gate conductive layer 350 and the gate barrier layer 340 may be partially removed to form a gate conductive pattern and a gate barrier pattern, respectively, in the gap 320, which may form a gate electrode. In example embodiments, the gate conductive layer 350 and the gate barrier layer 340 may be partially removed by a wet etching process.

In example embodiments, the gate electrode may be formed to extend in the second direction, and a plurality of gate electrodes may be formed in the third direction. For example, a plurality of gate electrodes may extend in the second direction and may be spaced apart from each other by the second opening 310.

In example embodiments, the gate electrode may include first, second, and third gate electrodes 363, 365, and 367 sequentially stacked in the first direction. The first gate electrode 363 may serve as a GSL. The second gate electrode 365 may serve as a word line. The third gate electrode 367 may serve as an SSL. Each of the first to third gate electrodes 363, 365, and 367 may be formed at one or a plurality of levels. One or more dummy word lines may be formed between the first and second gate electrodes 363 and 365 and/or between the second and third gate electrodes 365 and 367.

In example embodiments, the first gate electrode 363 may be formed at a lowermost level, the third gate electrode 367 may be formed at an uppermost level and a closet level to the uppermost level thereunder, and the second gate electrode 365 may be formed at even numbers of levels between the first and third gate electrodes 363 and 365. Thus, the first gate electrode 363 may be formed adjacent to the first semiconductor patterns 150, and each of the second and third gate electrodes 365 and 367 may be formed adjacent to the channel 270.

The first gate electrode 363 may include a first gate conductive pattern 353, and a first gate barrier pattern 343 covering a top, a bottom, and a sidewall of the first gate conductive pattern 353. The second gate electrode 365 may include a second gate conductive pattern 355, and a second gate barrier pattern 345 covering a top, a bottom, and a sidewall of the second gate conductive pattern 355. The third gate electrode 367 may include a third gate conductive pattern 357, and a third gate barrier pattern 347 covering a top, a bottom, and a sidewall of the third gate conductive pattern 357.

Figure 28:
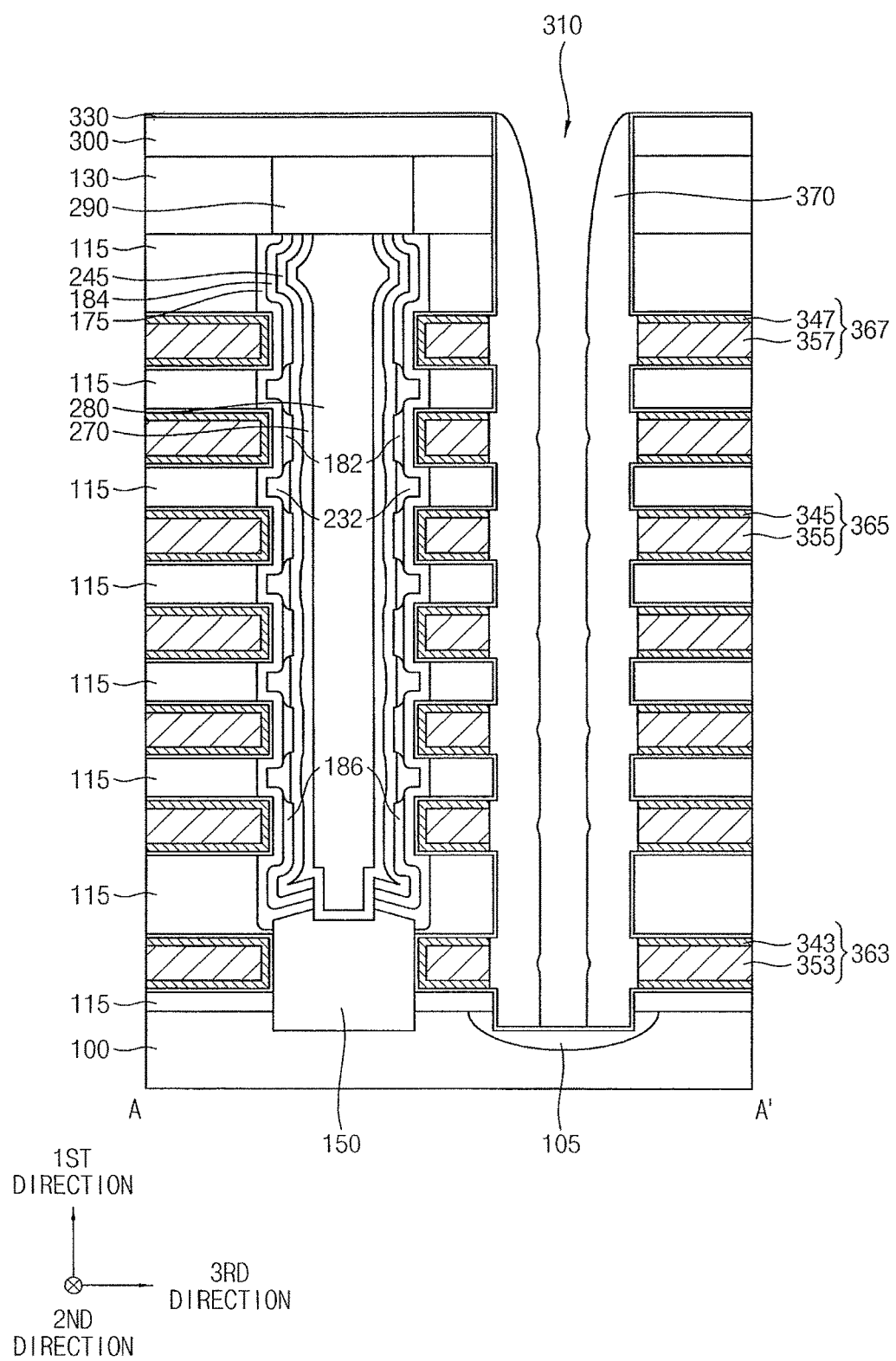

Referring to FIG. 28, impurities may be implanted into the exposed top surface of the substrate 100 to form an impurity region 105. In example embodiments, the impurities may include n-type impurities, for example, phosphorus and/or arsenic.

A second spacer layer may be formed on an upper surface of the impurity region 105, a sidewall of the second opening 310, and an upper surface of the second mask 300. The second spacer layer may be anisotropically etched to form a second spacer 370 on the sidewall of the second opening 310. Accordingly, the impurity region 105 at an upper portion of the substrate 100 may be partially exposed. The second spacer layer may be formed of an oxide, e.g., silicon oxide.

Figure 29:
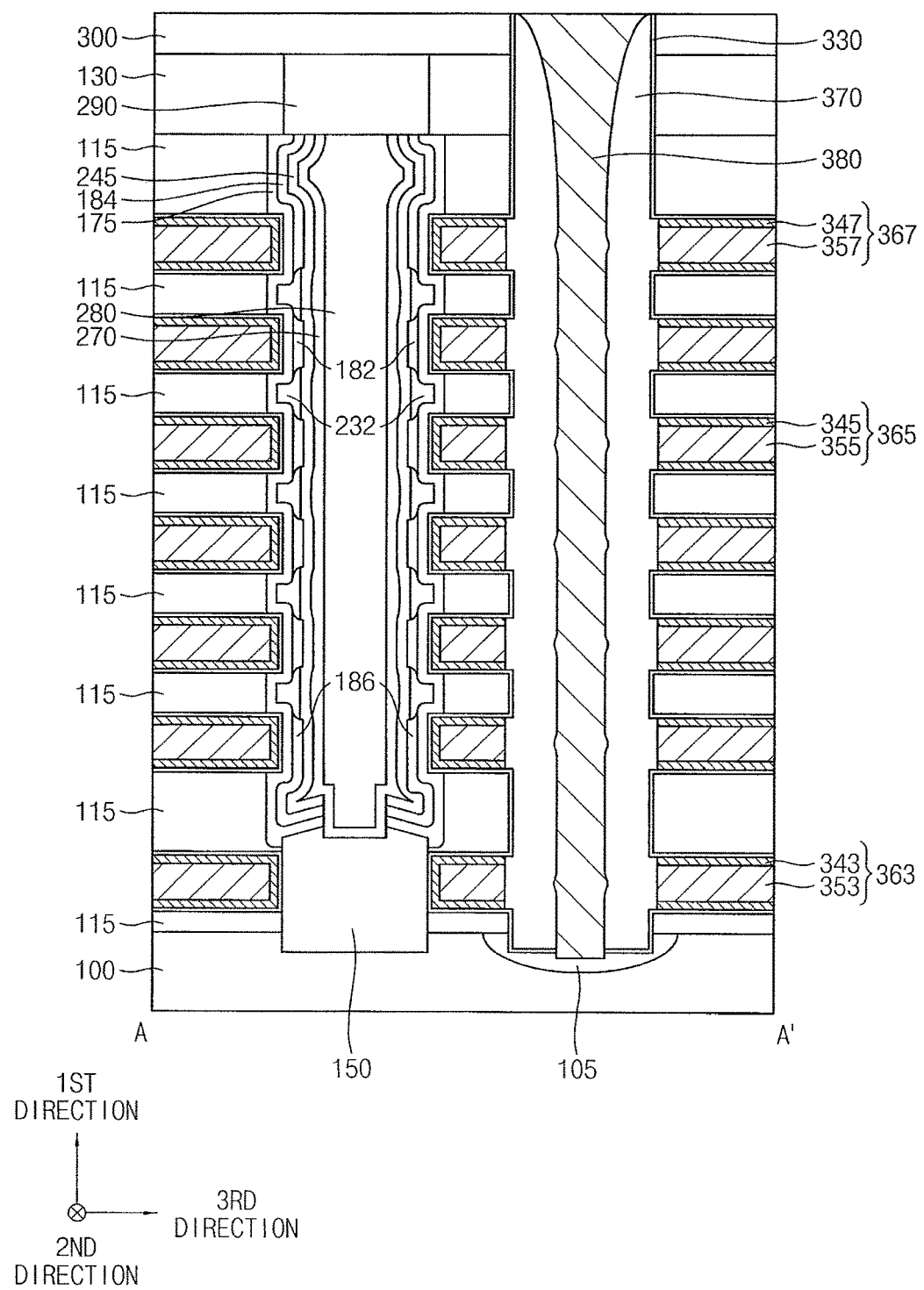

Referring to FIG. 29, a conductive layer may be formed on the exposed impurity region 105, the second spacer 370, and the second mask 300 to fill the second opening 310. The conductive layer may be planarized until the upper surface of the second mask 300 is exposed to form a common source line (CSL) 380. A portion of the second blocking layer 330 on the upper surface of the second mask 300 may be also removed. The conductive layer may be formed, for example, of a metal, a metal nitride, and/or a metal silicide.

Referring again to FIGS. 1 and 2, a first upper insulating interlayer 390 may be formed on the second mask 200, the CSL 380, the second spacer 370 and the second blocking layer 330. Also, a contact plug 400 may be formed through the first upper insulating interlayer 390 and the second mask 300 to contact an upper surface of the capping pattern 290.

A second upper insulating interlayer 410 may be formed on the first upper insulating interlayer 390 and the contact plug 400. A bit line 420 may be formed through the second upper insulating interlayer 410 to contact an upper surface of the contact plug 400. Thus, the vertical memory device may be manufactured.

The first and second upper insulating interlayers 390 and 410 may be formed of an oxide (e.g., silicon oxide). The contact plug 400 and the bit line 420 may be formed of a metal, e.g., copper, aluminum, tungsten, titanium, tantalum, etc., and/or a metal nitride, e.g., titanium nitride, tantalum nitride, tungsten nitride, etc. In example embodiments, the bit line 420 may extend in the third direction, and a plurality of bit lines 420 may be formed in the second direction.

Figure 30:
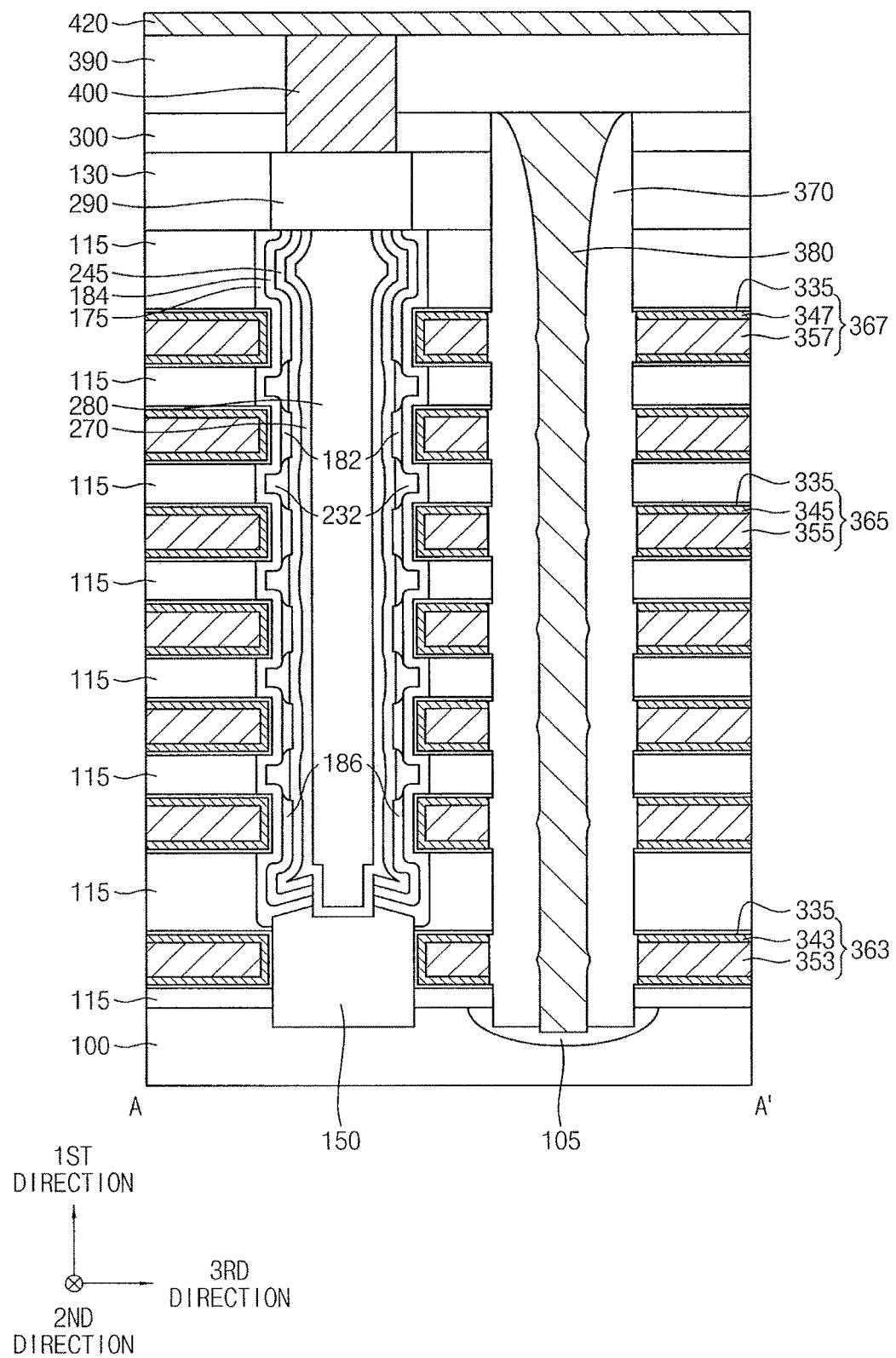
FIG. 30 illustrate another embodiment of a vertical memory device.

FIG. 30 illustrates another embodiment of a vertical memory device, which may be substantially the same as or similar to the embodiments of FIGS. 1 to 4 except for the second blocking layer. Referring to FIG. 30, the vertical memory device may include a second blocking pattern 335 instead of the second blocking layer 330 in FIGS. 1 to 4. The second blocking pattern 335 may cover a top, a bottom, and a sidewall close to the channel 270 of each of the first to third gate electrodes 363, 365, and 367. However, the second blocking pattern 335 may not cover the sidewalls of the insulating interlayer patterns 115, the sidewalls of the first and second masks 130 and 300, and the top surface of the substrate 100. Thus, a plurality of second blocking patterns 335 may be formed at a plurality of levels at which the first to third gate electrodes 363, 365, and 367 are formed and may be spaced apart from each other.

Figure 31:
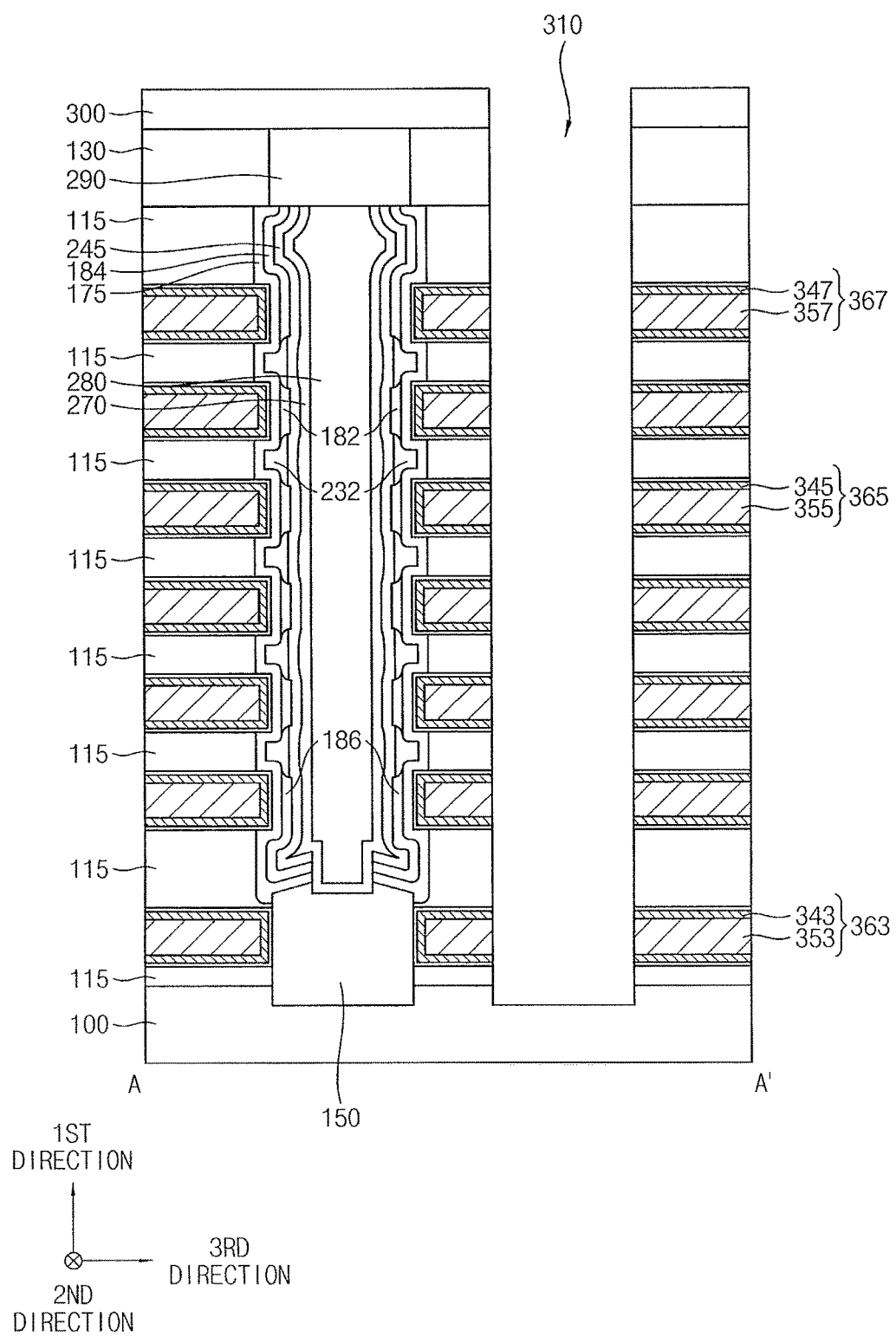
FIGS. 31 to 33 illustrate various stages of an embodiment of a method for manufacturing the vertical memory device in FIG. 30.
Figure 32:
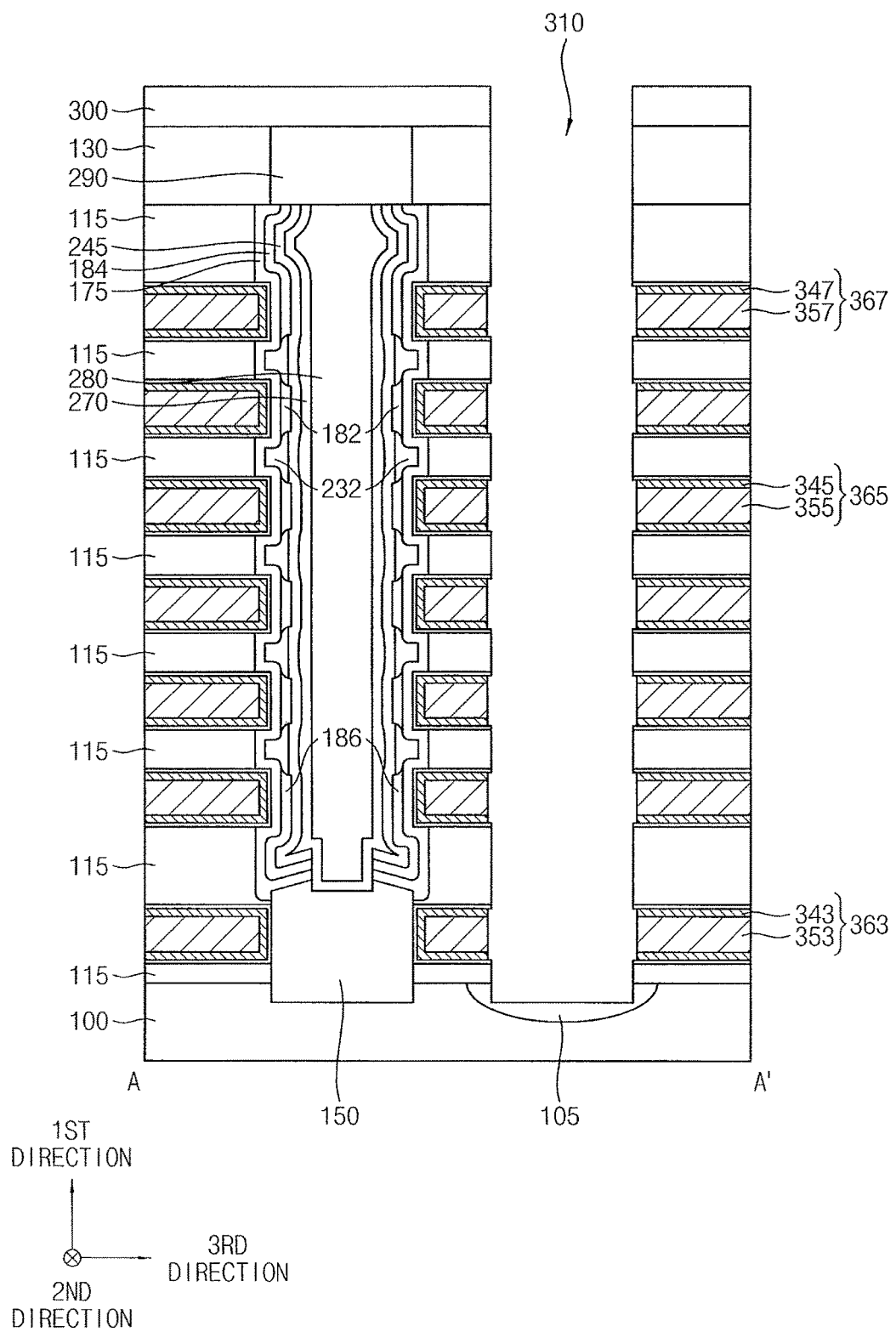
Figure 33:
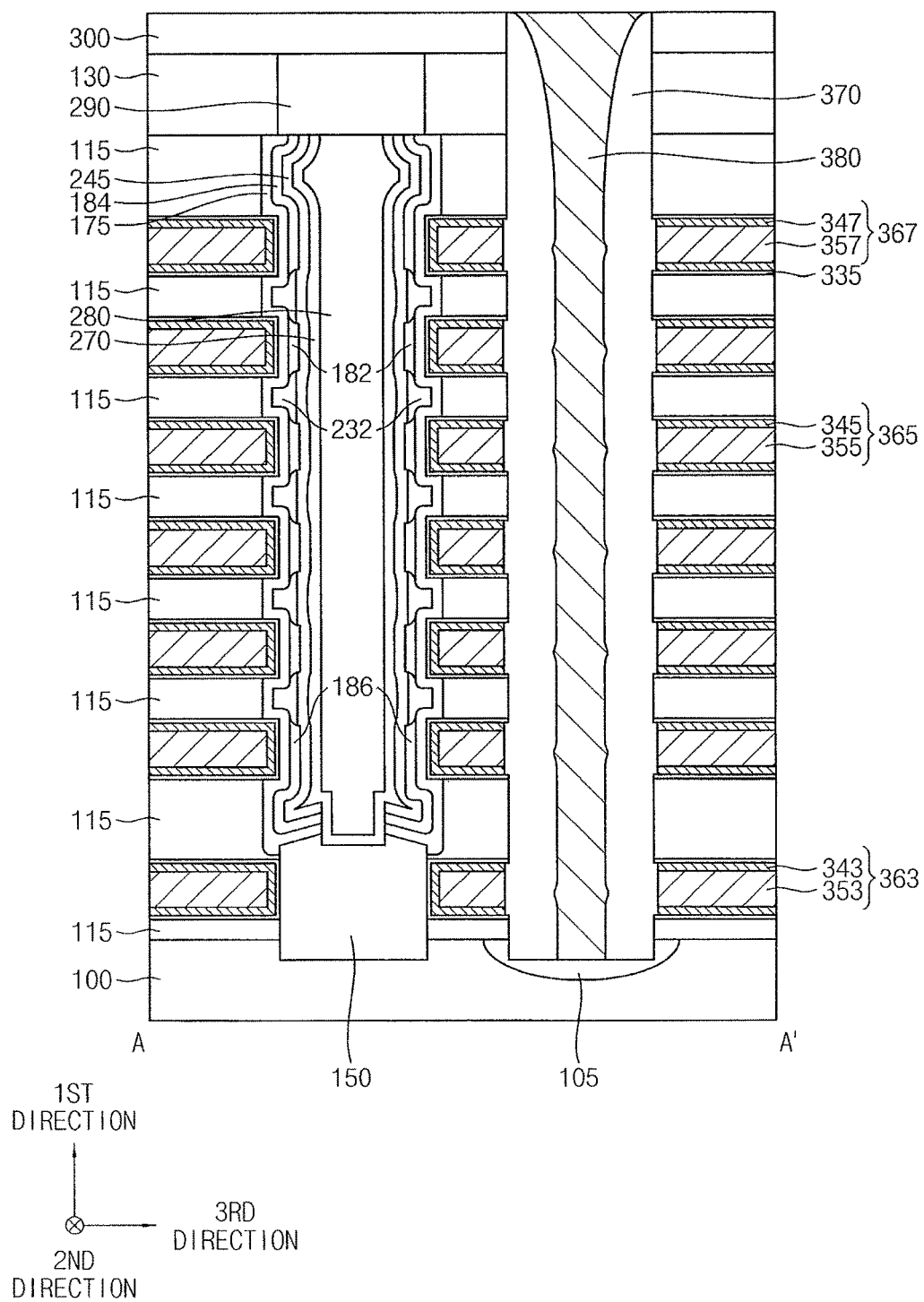

FIGS. 31 to 33 illustrate various stages of an embodiment of a method for manufacturing the vertical memory device shown in FIG. 30. First, processes substantially the same as or similar to those illustrated with reference to FIGS. 5 to 26 may be performed.

Referring to FIG. 31, processes substantially the same as or similar to those illustrated with reference to FIG. 27 may be performed. For example, the gate conductive layer 350 and the gate barrier layer 340 may be partially removed to form a gate conductive pattern and a gate barrier pattern, respectively, in the gap 320, which may form a gate electrode. The gate electrode may include the first to third gate electrodes 363, 365, and 367 sequentially stacked in the first direction.

In example embodiments, the gate conductive layer 350 and the gate barrier layer 340 may be partially removed by a dry etching process. In the dry etching process, portions of the second blocking layer 330 on the sidewalls of the insulating interlayer patterns 115, the sidewall of the first mask 130, and the top surface of the substrate 100 may be also removed. Thus, a second blocking pattern 335 covering a top, a bottom, and a sidewall of each of the first to third gate electrodes 363, 365, and 367 may be formed. A plurality of second blocking patterns 335 may be formed to be spaced apart from each other in the first direction.

Referring to FIG. 32, portions of the first to third gate electrodes 363, 365, and 367 close (e.g., adjacent) to the second opening 310 may be removed by a wet etching process. The wet etching process may be further performed so that the first to third gate electrodes 363, 365, and 367 at the respective levels may be sufficiently spaced apart from each other. In one embodiment, the wet etching process may be omitted.

Referring to FIG. 33, processes substantially the same as or similar to those in FIGS. 28 to 29 may be performed. Thus, impurities may be implanted into an upper portion of the substrate 100 exposed by the second opening 310 to form an impurity region 105, a second spacer 370 may be formed on a sidewall of the second opening 310, and a CSL 380 may be formed on the impurity region 105 to fill a remaining portion of the second opening 310.

Referring again to FIG. 30, processes substantially the same as or similar to those in FIGS. 1 to 4 may be performed to complete the vertical memory device.

Figure 34:
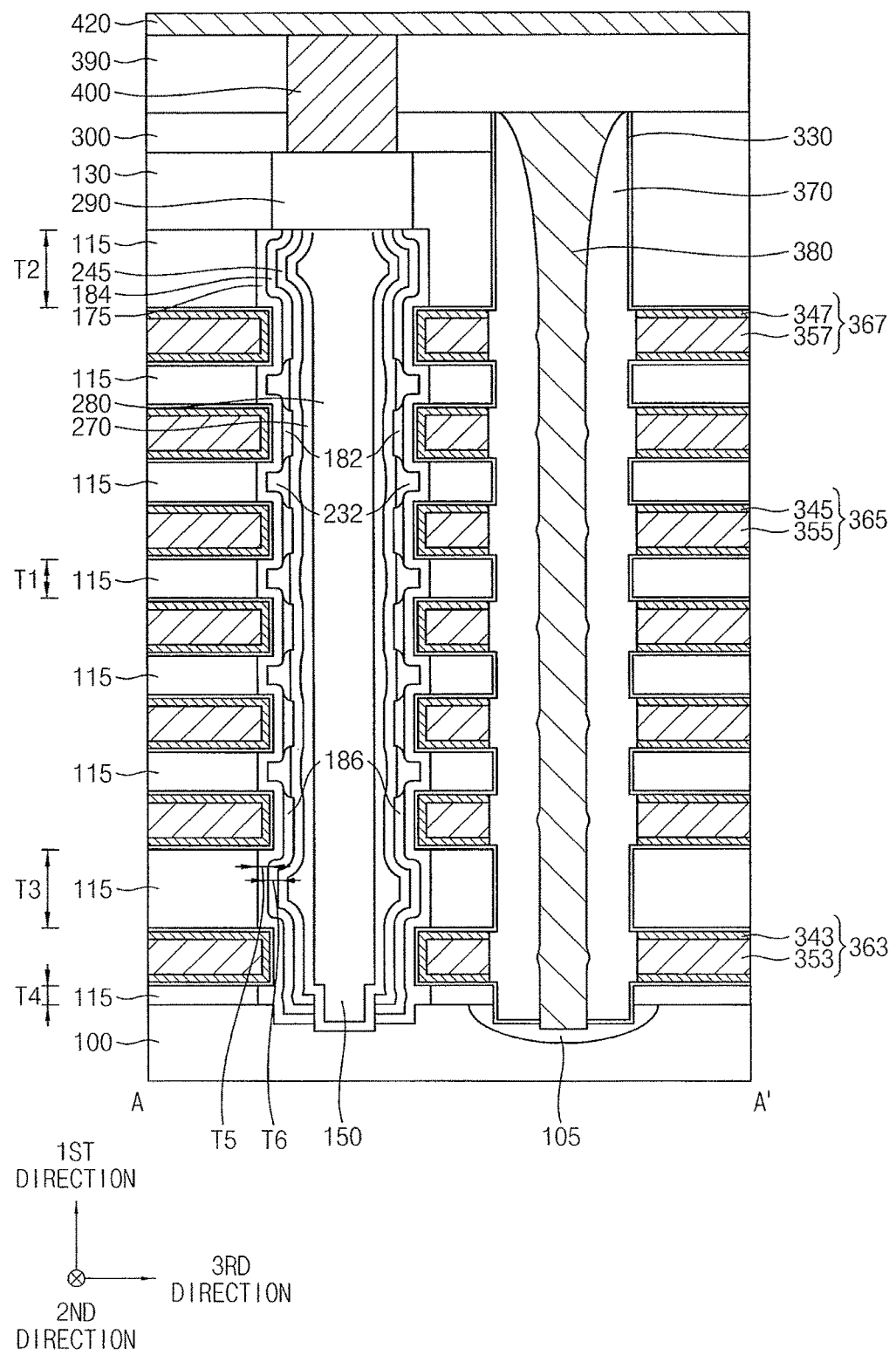
FIG. 34 illustrate another embodiment of a vertical memory device.

FIG. 34 illustrates another embodiment of a vertical memory device, which may be substantially the same as or similar to that in FIGS. 1 to 4, except for the first semiconductor pattern, the channel, and the charge storage pattern structure.

Referring to FIG. 34, the vertical memory device may not include the first semiconductor pattern 150 in FIGS. 1 to 4. Thus, the channel 270 may have a cup-like shape contacting the top surface of the substrate 100, and the charge storage pattern structure may have a cup-like shape with an open central bottom. The charge storage pattern structure may contact the top surface of the substrate 100 and may cover an outer sidewall of the channel 270.

The charge storage pattern structure may include the tunnel insulation pattern 245, the charge trapping pattern structure, and the first blocking pattern 175 sequentially stacked between the channel 270 and each of the first to third gate electrodes 363, 365, and 367. The charge trapping pattern structure may include the first to third charge trapping patterns 182, 184, and 186 spaced apart from each other in the first direction. Each of the first to third charge trapping patterns 182, 184, and 186 may directly contact the outer sidewall of the tunnel insulation pattern 245.

A plurality of first charge trapping patterns 182 may be formed spaced apart from each other in the first direction. Each of the first charge trapping patterns 182 may be close (e.g., adjacent) to the sidewall of the second gate electrode 365 or the sidewall of the third gate electrode 367 in the horizontal direction. The second charge trapping pattern 184 may be close (e.g., adjacent) to the sidewall of the third gate electrode 367 at the uppermost level in the horizontal direction. The second charge trapping pattern 184 may further extend in the first direction to be close (e.g., adjacent) to the sidewall of the uppermost one of the insulating interlayer patterns 115.

The third charge trapping pattern 186 may be close (e.g., adjacent) in the horizontal direction to the sidewalls of the first and second gate electrodes 363 and 365 at the first and second levels, respectively, from the top surface of the substrate 100. The third charge trapping pattern 186 may further extend in the first direction to be close (e.g., adjacent) to the sidewalls of the first and second ones of the insulating interlayer patterns 115 from the top surface of the substrate 100, and may be formed on the top surface of the substrate 100.

In example embodiments, each of the first to third charge trapping patterns 182, 184, and 186 may have the sixth thickness T6 in the horizontal direction, which may be constant in the first direction.

In example embodiments, the tunnel insulation pattern 245, the second charge trapping pattern 184, the first blocking pattern 175 and the second blocking layer 330 sequentially stacked in the horizontal direction may be formed between the channel 270 and the third gate electrode 367 at the uppermost level. The tunnel insulation pattern 245, the third charge trapping pattern 186, the first blocking pattern 175, and the second blocking layer 330 sequentially stacked in the horizontal direction may be formed between the channel 270 and the first gate electrode 363 at the lowermost level or between the channel 270 and the second gate electrode 365 at the second level. The tunnel insulation pattern 245, the first charge trapping pattern 182, the first blocking pattern 175, and the second blocking layer 330 sequentially stacked in the horizontal direction may be formed between the channel 270 and each of the second gate electrodes 367 at other levels, respectively.

The tunnel insulation pattern 245, the second charge trapping pattern 184, and the first blocking pattern 175 sequentially stacked in the horizontal direction may be formed between the channel 270 and the uppermost one of the insulating interlayer patterns 115 having the second thickness T2. The tunnel insulation pattern 245, the third charge trapping pattern 186, and the first blocking pattern 175 sequentially stacked in the horizontal direction may be formed between the channel 270 and the first one of the insulating interlayer patterns 115 having the fourth thickness T4 or between the channel 270 and the second one of the insulating interlayer patterns 115 having the third thickness T3. The tunnel insulation pattern 245, the first filling pattern 232, and the first blocking pattern 175 sequentially stacked in the horizontal direction may be formed between the channel 270 and each of the intermediate ones of the insulating interlayer patterns 115 having the first thickness T1.

In example embodiments, the first thickness T1 of ones of the insulating interlayer patterns 115 may be equal to or less than twice the sum of the fifth thickness T5 of the first blocking pattern 175 and the sixth thickness T6 of the charge trapping pattern structure. In example embodiments, the second thickness T2 or the third thickness T3 of one of the insulating interlayer patterns 115 may be greater than the sum of twice the fifth thickness T5 of the first blocking pattern 175 and the sixth thickness T6 of the charge trapping pattern structure, and may be greater than twice the sum of the fifth thickness T5 and the sixth thickness T6. However, the fourth thickness T4 of one of the insulating interlayer patterns 115 may be less than the sum of twice the fifth thickness T5 and the sixth thickness T6.

Figure 36:
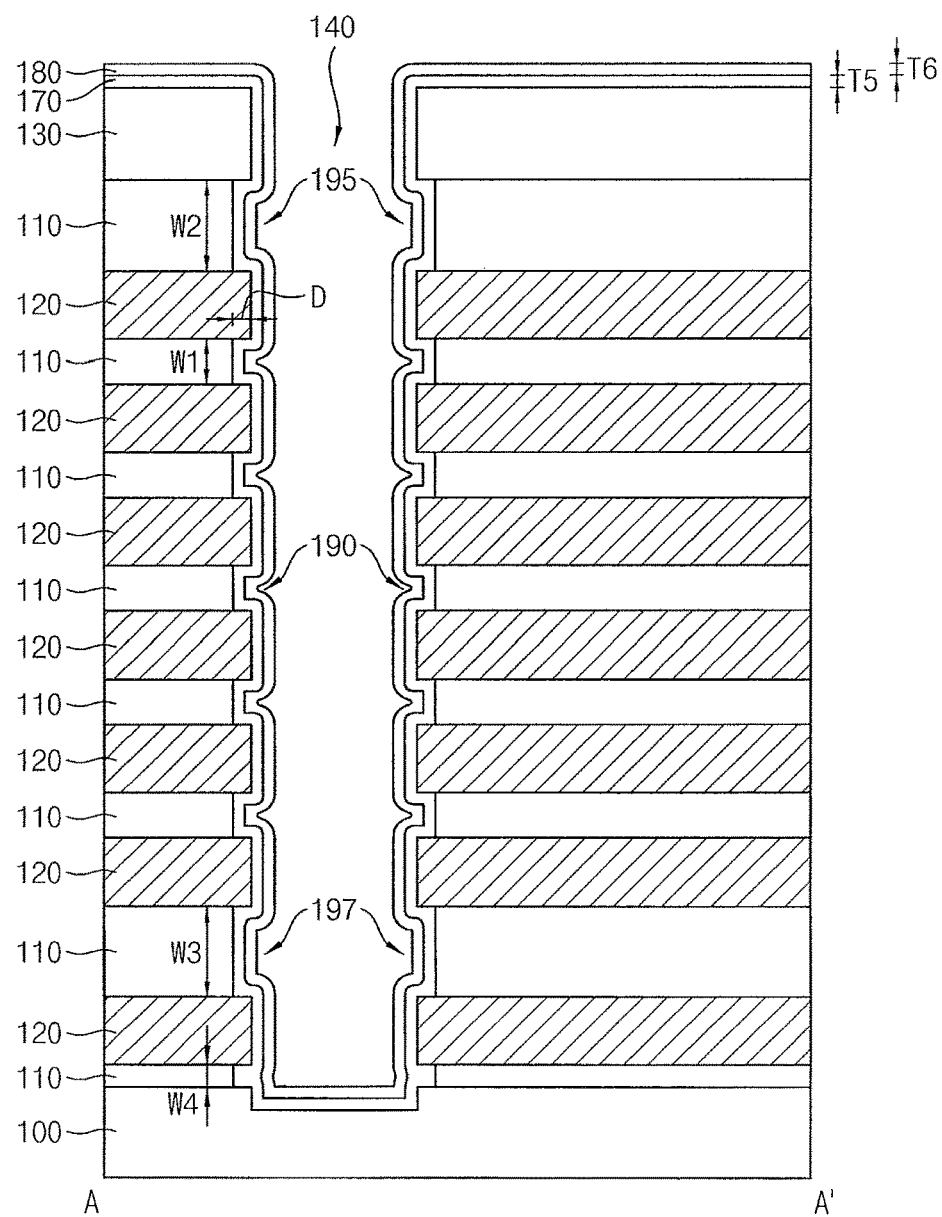

FIGS. 35 to 36 illustrate various stages in an embodiment of a method for manufacturing the vertical memory device in FIG. 34. First, processes substantially the same as or similar to those in FIGS. 5 to 6 may be performed.

Referring to FIG. 35, processes substantially the same as or similar to those in FIG. 8 may be performed. For example, the insulating interlayers 110 exposed by the channel hole 140 may be partially removed to form the first to third recesses 160, 165, 167, and a seventh recess 169. In example embodiments, the first to third recesses 160, 165, and 167 and the seventh recess 169 may be removed by a dry etching process or a wet etching process.

The first to third recesses 160, 165 and 167 and the seventh recess 169 may be formed by partially removing the insulating interlayers 110, and may have the depth D in the horizontal direction, e.g., in the second or third direction. The first to third recesses 160, 165, and 167 may have the first to third widths W1, W2, and W3, respectively. The seventh recess 169 may have a fourth width W4 in the first direction.

In example embodiments, the first, second, third and seventh recesses 160, 165, 167, and 169 may be formed on the insulating interlayers 110 having the first, second, third, and fourth thicknesses T1, T2, T3, and T4, respectively, to have the first, second, third, and fourth widths W1, W2, W3, and W4, which may be equal to the first, second, third, and fourth thicknesses T1, T2, T3, and T4, respectively.

Referring to FIG. 36, processes substantially the same as or similar to those in FIG. 9 may be performed. Thus, the first blocking layer 170 and the first charge trapping layer 180 may be sequentially formed on the sidewall of the channel hole 140, the inner walls of the first, second, third, and seventh recesses 160, 165, 167, and 169, and the upper surface of the first mask 130.

The first blocking layer 170 and the charge trapping layer 180 may be formed to have the fifth and sixth thicknesses T5 and T6. In example embodiments, the depth D of each of the first, second, third, and seventh recesses 160, 165, 167, and 169 may be greater than at least the fifth thickness T5 of the first blocking layer 170. Each of the first to third widths W1, W2, and W3 may be greater than the sum of twice the fifth thickness T5 and the sixth thickness T6. Thus, the fourth, fifth, and sixth recesses 190, 195, and 197 may be formed in the charge trapping layer 180 corresponding to the first, second, and third recesses 160, 165, and 167, respectively, in the insulating interlayers 110.

However, the fourth width W4 of the seventh recess 169 may be less than the sum of twice the fifth thickness T5 and the sixth thickness T6. Thus, a recess may be rarely formed in the charge trapping layer 180 corresponding to the seventh recess 169 in the insulating interlayers 110.

In example embodiments, the depth D of each of the first, second, third, and seventh recesses 160, 165, 167, and 169 may be equal to or less than the sum of the fifth thickness T5 and the sixth thickness T6.

In example embodiments, the first width W1 of the first recess 160 may be equal to or less than the sum of twice the fifth thickness T5 and the sixth thickness T6. In example embodiments, each of the second and third widths W2 and W3 of each of the second and third recesses 165 and 167 may be greater than the sum of twice the fifth thickness T5 and the sixth thickness T6, and may be greater than twice the sum of the fifth thickness T5 and the sixth thickness T6. Thus, each of the fifth and sixth recesses 195 and 197 corresponding to each of the second and third recesses 165 and 167 may have a width in the first direction nearly constant from an entrance toward a bottom thereof along the horizontal direction, e.g., along the second or third direction. The width in the first direction of each of the fifth and sixth recesses 195 and 197 may be greater than the width in the first direction of the fourth recess 190.

Referring again to FIG. 34, processes substantially the same as or similar to that in FIGS. 10 to 29 and FIGS. 1 to 4 may be performed to complete the vertical memory device.

Figure 37:
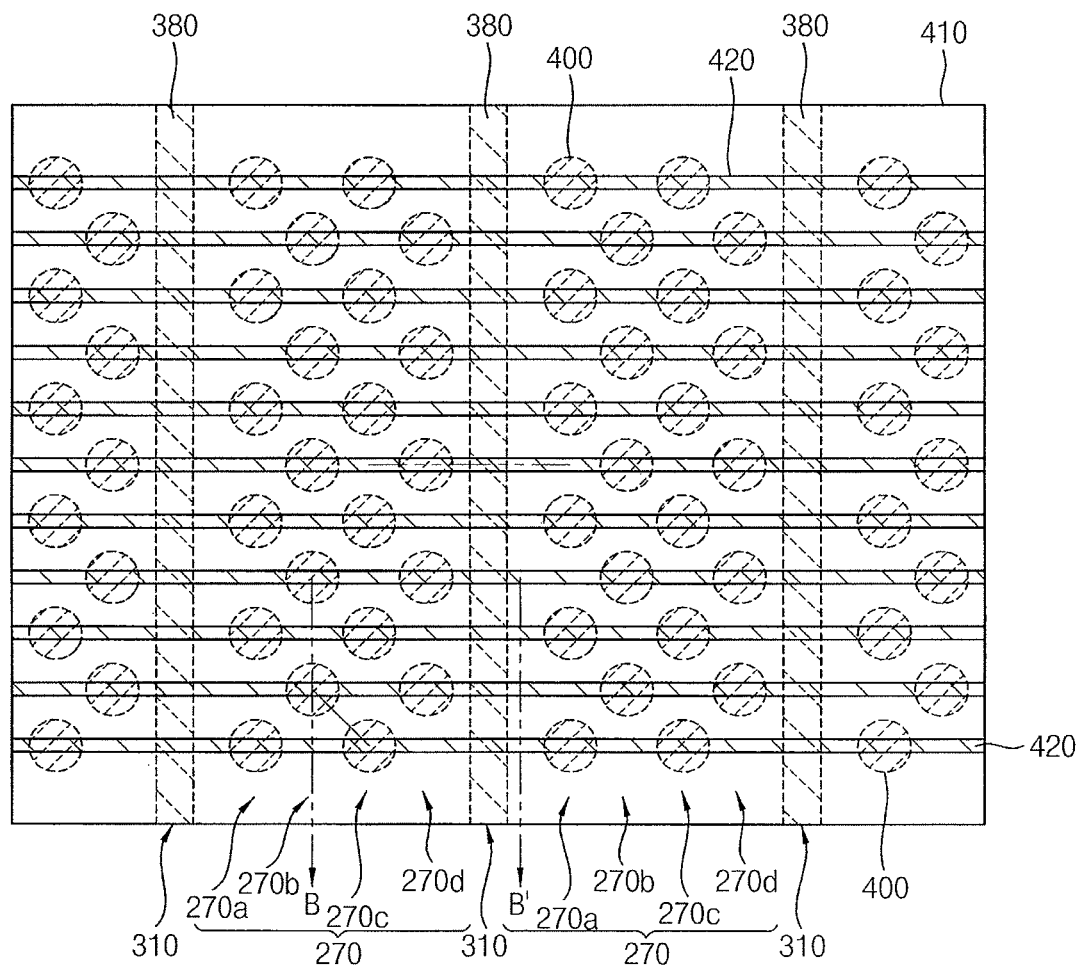
FIGS. 37 and 38 illustrate another embodiment of a vertical memory device.
Figure 38:
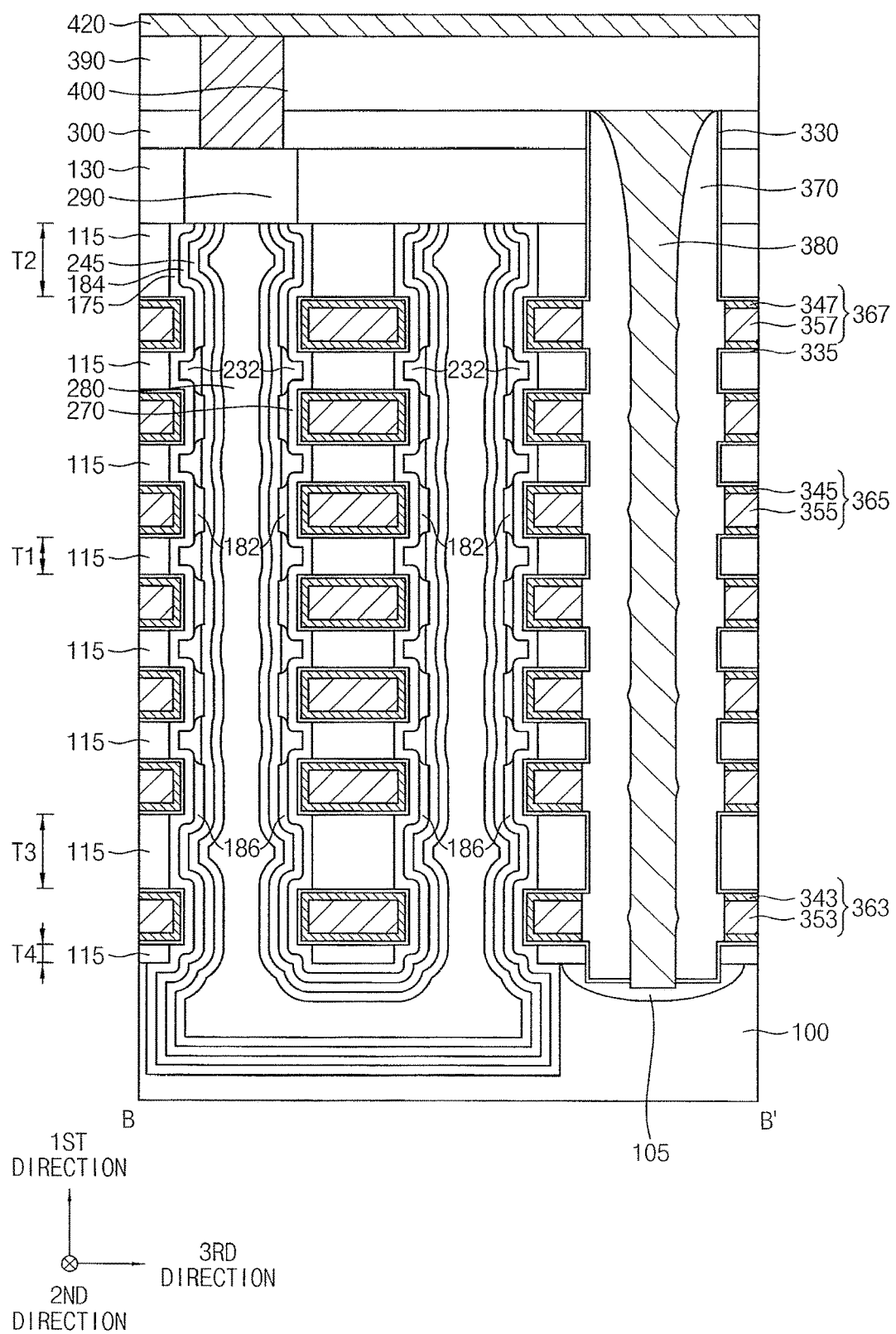

FIGS. 37 and 38 illustrate another embodiment of a vertical memory device, which may be substantially the same as or similar to those in FIGS. 1 to 4 except for the first semiconductor pattern, the channel, and the charge storage pattern structure.

Referring to FIGS. 37 and 38, the vertical memory device may not include the first semiconductor pattern 150 in FIGS. 1 to 4 and two neighboring channels 270 may be connected to each other through a trench on the substrate 100. Thus, the charge storage pattern structures covering outer sidewalls of the two neighboring channels 270 may also be connected to each other. The third charge trapping pattern 186 in each of the charge storage pattern structures may extend to an inner wall of the trench, and two neighboring third charge trapping patterns 186 may be connected to each other.

FIGS. 39 to 42 illustrate various stages of an embodiment of a method for manufacturing the vertical memory device in FIGS. 37 and 38. FIGS. 39 to 42 are cross-sectional views along a cutline B-B' in FIG. 37. First, processes substantially the same as or similar to those illustrated with reference to FIG. 5 may be performed.

Figure 39:
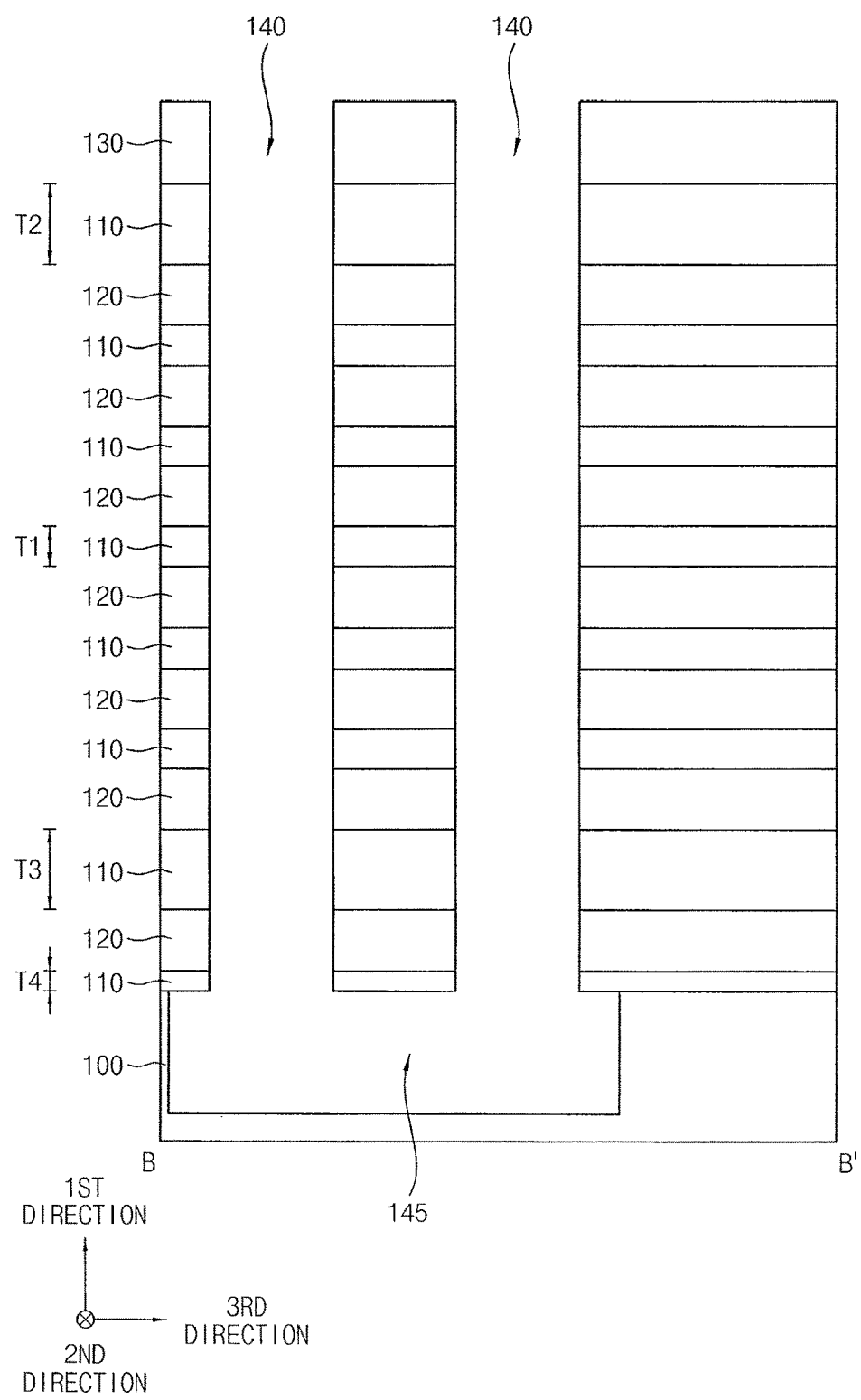
FIGS. 39 to 42 illustrate various stages of an embodiment of a method for manufacturing the vertical memory device in FIGS. 37 and 38.

Referring to FIG. 39, processes substantially the same as or similar to those in FIG. 6 may be performed. For example, after forming the first mask 130 on the uppermost one of the insulating interlayers 110, the insulating interlayers 110 and the sacrificial layers 120 may be etched using the first mask 130 as an etching mask to form the channel holes 140 therethrough, thereby exposing the top surface of the substrate 100. In example embodiments, an upper portion of the substrate 100 may be also removed in the etching process to form a trench 145, and neighboring channel holes 140 may be in communication with each other through the trench 145.

Referring to FIGS. 37 and 39 showing the layout of the channels 270 in the channel holes 140, in an example embodiment, the second and fourth channel hole columns in which the channels 270 in the second and fourth channel columns 270*b* and 270*d* may be formed in communication with each other, or the first and third channel hole columns in which the channels 270 in the first and third channel columns 270*a* and 270*c* may be formed in communication with each other.

In one embodiment, the first and second channel hole columns, in which the channels 270 in the first and second channel columns 270*a* and 270*b* are formed, may be in communication with each other, or the third and fourth channel hole columns, in which the channels 270 in the third and fourth channel columns 270*c* and 270*d* are formed, may be in communication with each other.

Figure 40:
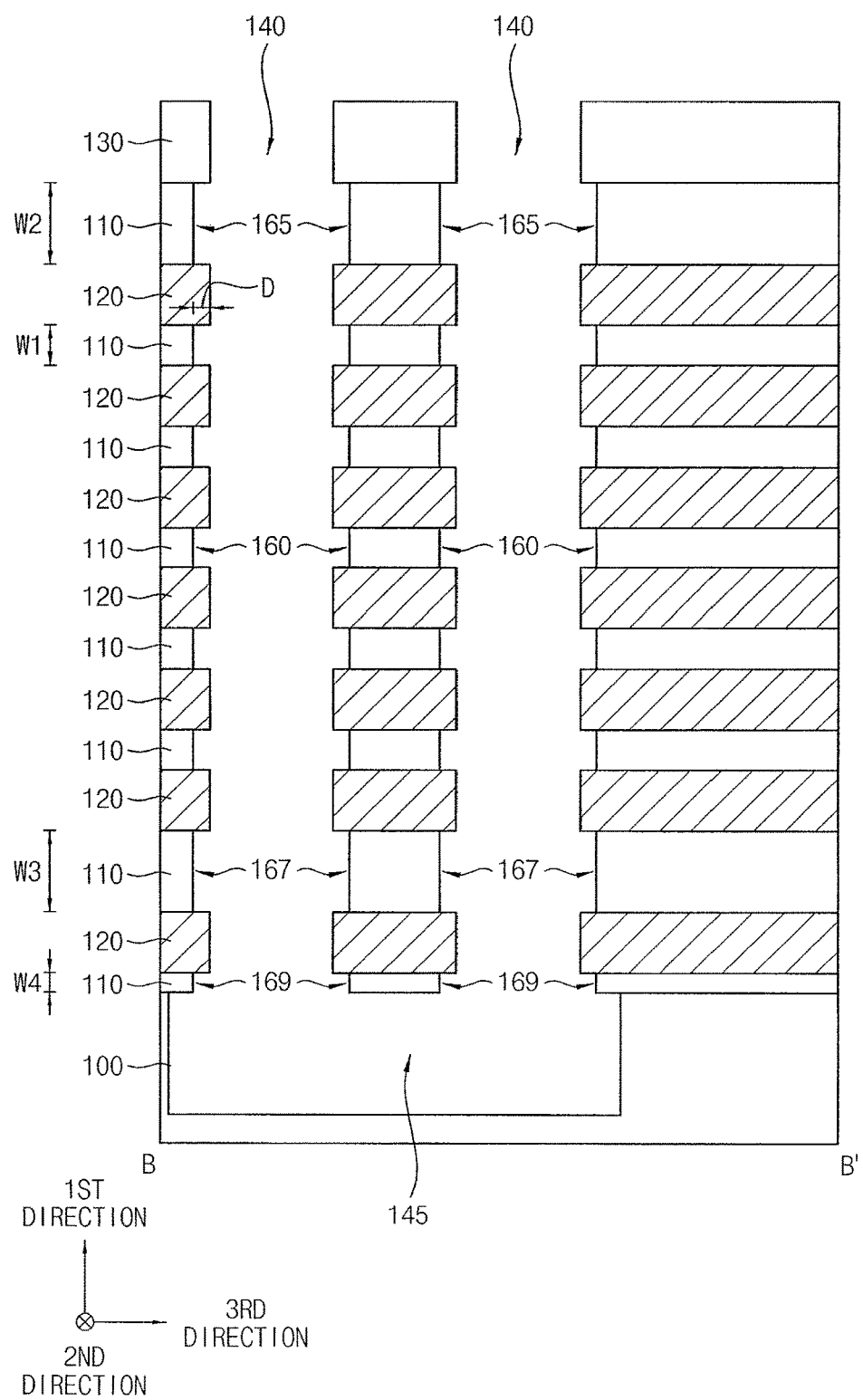

Referring to FIG. 40, processes substantially the same as or similar to those in FIG. 8 may be performed. For example, the insulating interlayers 110 exposed by the channel holes 140 may be partially removed to form the first, second, third, and seventh recesses 160, 165, 167, and 169. In example embodiments, the first, second, third, and seventh recesses 160, 165, 167, and 169 may be formed by a dry etching process or a wet etching process. The first, second, third, and seventh recesses 160, 165, 167, and 169 may be formed to have the first, second, third, and fourth widths W1, W2, W3, and W4, respectively, in the first direction.

Figure 41:
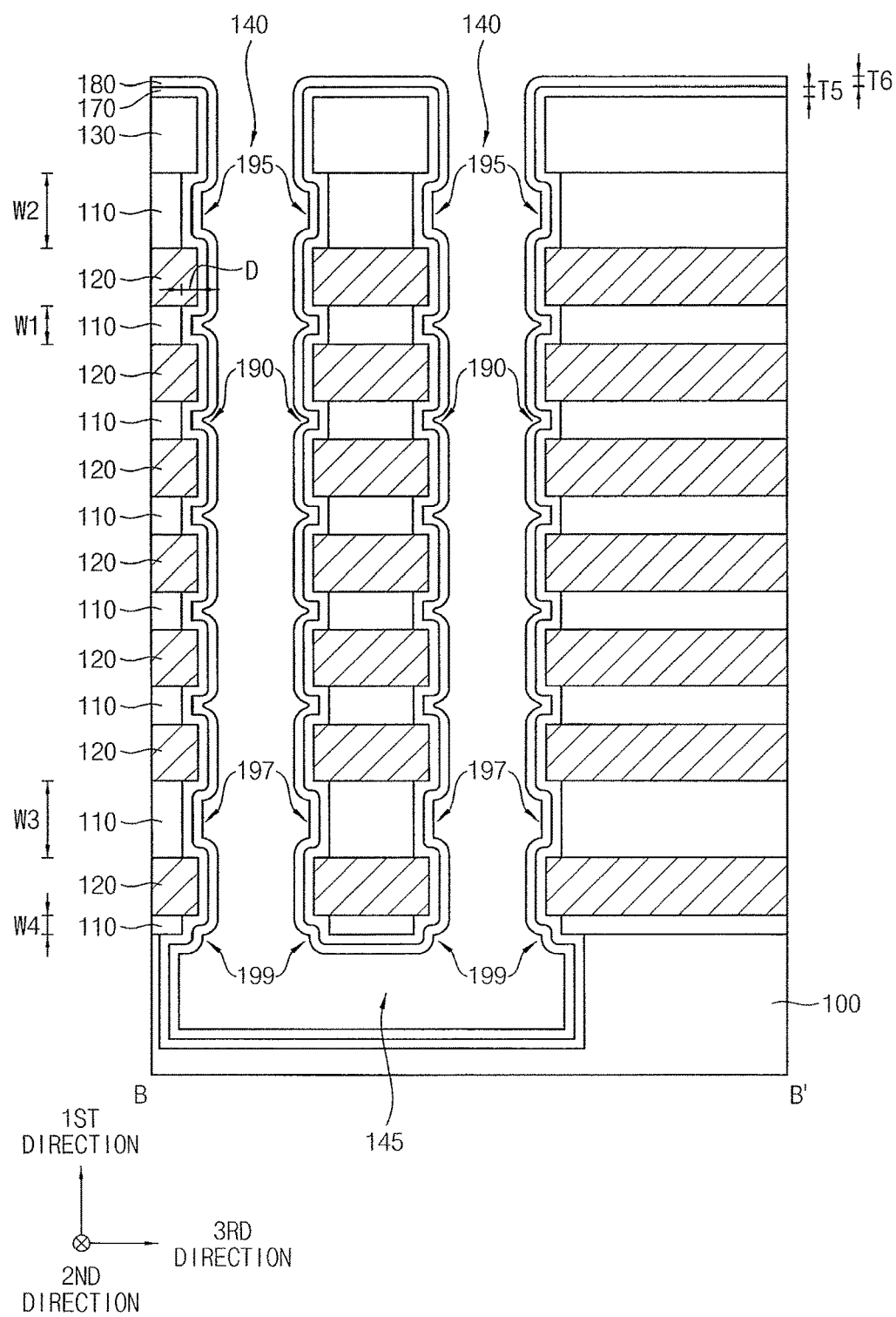

Referring to FIG. 41, processes substantially the same as or similar to those in FIG. 9 may be performed. Thus, the first blocking layer 170 and the charge trapping layer 180 may be sequentially formed on the sidewall of the channel hole 140, the inner walls of the first, second, third, and seventh recesses 160, 165, 167, and 169, the inner wall of trench 145, and the upper surface of first mask 130.

Figure 42:
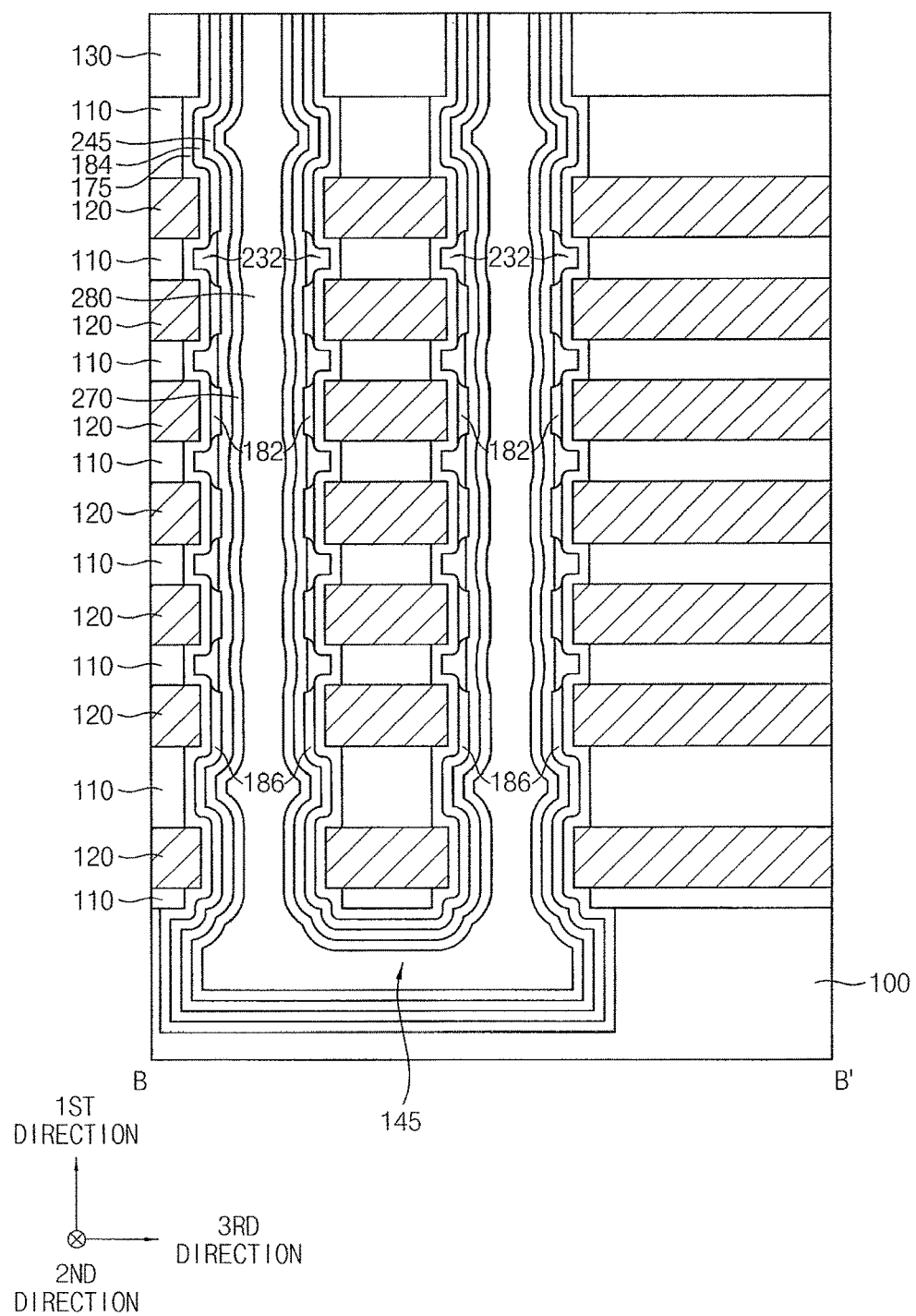

Referring to FIG. 42, processes substantially the same as or similar to those in FIGS. 10 to 23 may be performed.

Referring to FIGS. 37 and 38, processes substantially the same as or similar to those in FIGS. 24 to 29 and FIGS. 1 to 4 may be performed to complete the vertical memory device.

Example embodiments have been disclosed herein, and although specific terms are employed, they are used and are to be interpreted in a generic and descriptive sense only and not for purpose of limitation. The embodiments may be combined to form additional embodiments. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A vertical memory device, comprising:
a plurality of insulating interlayer patterns on a substrate, the plurality of insulating interlayer patterns spaced apart from each other in a first direction substantially perpendicular to a top surface of the substrate;
a plurality of gate electrodes between neighboring ones of the insulating interlayer patterns, respectively;
a channel extending through the insulating interlayer patterns and the gate electrodes in the first direction on the substrate; and
a charge storage pattern structure including a tunnel insulation pattern, a charge trapping pattern structure, and a blocking pattern sequentially stacked between the channel and each of the gate electrodes in a second direction substantially parallel to the top surface of the substrate, wherein the charge trapping pattern structure includes a plurality of charge trapping patterns spaced apart from each other in the first direction, wherein the charge trapping patterns are adjacent to sidewalls of first gate electrodes, respectively, in the plurality of gate electrodes, and wherein a first charge trapping pattern of the plurality of charge trapping patterns extends in the first direction along a sidewall of a first insulating interlayer pattern of the plurality of insulating interlayer patterns such that the first charge trapping pattern overlaps the sidewall of the first insulating interlayer pattern in the second direction, the first insulating interlayer pattern being an uppermost one or a lowermost one of the plurality of insulating interlayer patterns.

2. The vertical memory device as claimed in claim 1, wherein each of the tunnel insulation pattern and the blocking pattern extends in the first direction along a sidewall of the channel and contacts the plurality of charge trapping patterns.

3. The vertical memory device as claimed in claim 2, wherein the blocking pattern is on the sidewalls of the first gate electrodes and portions of a top and a bottom of each of the first gate electrodes, and directly contacts sidewalls of the insulating interlayer patterns.

4. The vertical memory device as claimed in claim 3, wherein the blocking pattern is on portions of the top and the bottom of each of the first gate electrodes relatively adjacent to the channel, and is not on portions of the top and the bottom of each of the first gate electrodes spaced from the channel.

5. The vertical memory device as claimed in claim 2, further comprising:
a first filling pattern between the tunnel insulation pattern and the blocking pattern, wherein the first filling pattern contacts the tunnel insulation pattern and the blocking pattern.

6. The vertical memory device as claimed in claim 5, wherein the first filling pattern is between the first gate electrodes.

7. The vertical memory device as claimed in claim 6, wherein the first filling pattern is spaced from the sidewall of the first insulating interlayer pattern in the second direction.

8. The vertical memory device as claimed in claim 5, wherein the first filling pattern is between the plurality of charge trapping patterns.

9. The vertical memory device as claimed in claim 8, wherein the first filling pattern contacts a portion of a top surface or a portion of a bottom surface of each of the charge trapping patterns.

10. The vertical memory device as claimed in claim 5, wherein the tunnel insulation pattern and the blocking pattern include substantially a same material, and the first filling pattern includes a material substantially equal to that of the tunnel insulation pattern and the blocking pattern, the first filling pattern merged to the tunnel insulation pattern and the blocking pattern.

11. The vertical memory device as claimed in claim 5, wherein the first filling pattern includes an air gap.

12. The vertical memory device as claimed in claim 2, wherein the tunnel insulation pattern, the first charge trapping pattern, and the blocking pattern are sequentially stacked between the sidewall of the channel and the sidewall of the first insulating interlayer pattern, each of the tunnel insulation pattern, the first charge trapping pattern, and the blocking pattern extending in the first direction.

13. The vertical memory device as claimed in claim 1, wherein the gate electrodes include a second gate electrode, wherein a sidewall of the second gate electrode is spaced from the charge storage pattern structure in the second direction, and wherein the second gate electrode is a lowermost one of the gate electrodes.

14. A vertical memory device, comprising:
a channel;
an alternating pattern of gate electrodes and insulating layers; and
a charge storage pattern between the channel and sides of the gate electrodes and insulating layers, wherein the gate electrodes have a first width and a first thickness and the insulating layers have a second width less than the first width and a second thickness less than the first thickness, and wherein the charge storage pattern extends into recesses adjacent to the sides of respective ones of the insulating layers so that a distance in a horizontal direction from a portion of the charge storage pattern directly contacting the side of each of the insulating layers to the channel is greater than a distance in the horizontal direction from a portion of the charge storage pattern directly contacting a side of each of the gate electrodes to the channel, wherein the charge storage pattern includes a charge trapping pattern and a blocking pattern sequentially stacked between the channel and the alternating pattern of gate electrodes and insulating layers, and wherein a thickness of at least one of the insulating layers between adjacent ones of the gate electrodes is equal to or less than twice a sum of thicknesses of the charge trapping pattern and the blocking pattern.

15. The vertical memory device as claimed in claim 14, wherein each of the recesses has a width based on a difference between the first width and the second width.

16. The vertical memory device as claimed in claim 14, further comprising:
   a plurality of semiconductor patterns,
   wherein each of the semiconductor patterns is between the channel and a respective one of the recesses.

17. The vertical memory device as claimed in claim 16, wherein each of the semiconductor patterns may include an n+ silicon layer.

18. The vertical memory device as claimed in claim 14, wherein the charge storage pattern further includes a tunnel insulation pattern between the channel and the charge trapping pattern.

* * * * *